United States Patent [19]

Yamamoto

[11] Patent Number: 5,610,929
[45] Date of Patent: Mar. 11, 1997

[54] MULTIBYTE ERROR CORRECTING SYSTEM

[75] Inventor: Kazuhisa Yamamoto, Kawasaki, Japan

[73] Assignee: Fujitsu Limited, Japan

[21] Appl. No.: 356,159

[22] Filed: Dec. 15, 1994

[30] Foreign Application Priority Data

Mar. 11, 1994 [JP] Japan ......................................... 040696
Jul. 29, 1994 [JP] Japan ..................................... 6-177367

[51] Int. Cl.⁶ ........................... G11C 29/00; H03M 13/00
[52] U.S. Cl. ....................... 371/40.1; 371/37.7; 371/38.1; 371/39.1
[58] Field of Search .................... 371/38.1, 39.1, 371/40.1, 40.2, 37.1, 37.8, 37.5; 360/48

[56] References Cited

U.S. PATENT DOCUMENTS

| | | | |
|---|---|---|---|
| 4,494,234 | 1/1985 | Patel | 371/38 |
| 4,633,471 | 12/1986 | Perera et al. | 371/37.7 |
| 4,706,250 | 11/1987 | Patel | 371/38.1 |
| 4,890,287 | 12/1989 | Johnson et al. | 371/37.2 |
| 5,241,546 | 8/1993 | Peterson et al. | 371/37.1 |
| 5,325,535 | 7/1994 | Coker | 371/39.1 |
| 5,384,786 | 1/1995 | Dudley et al. | 371/37.1 |
| 5,422,895 | 6/1995 | Nguyen et al. | 371/37.5 |

FOREIGN PATENT DOCUMENTS 2301328 12/1990 Japan.

Primary Examiner—Roy N. Envall, Jr.
Assistant Examiner—Emmanuel L. Moise
Attorney, Agent, or Firm—Greer, Burns & Crain, Ltd.

[57] ABSTRACT

An ECC decoder detects a no error, a correctable error or an uncorrectable error state and reports to art upper controller after user data is read. A state indicative of the completion of the correction, an erroneous correction, or an abnormal operation is detected and logged for every process of a subblock unit in the ECC decoder, thereby enabling such a state to be referred from the upper controller. An error detection code is provided after the user data to detect a non-detection or an erroneous correction of errors when errors exceed the correcting ability of the ECC decoder. Further, a circuit to obtain values $\gamma_{n0}$ to $\gamma_{nn}$ to decide solutions $\beta_k$ of simultaneous equations of (n) unknowns by the ECC decoder is formed by sequentially coupling from an arithmetic operating circuit of one unknown to an arithmetic operating circuit of (n) unknowns. An error location arithmetic operating circuit for each of a fixed and a variable length subblock is provided for the ECC decoder. The variable length subblock presumes the start location of the fixed length subblock and executes a dummy search of the arithmetic operating circuit and switches to an ordinary error search at the start location of the variable subblock. When a header and counting section at the record head is discriminated, the delay time is switched to the short delay time according to the block length, thereby preventing a large delay corresponding to the fixed length subblock of the record.

29 Claims, 38 Drawing Sheets

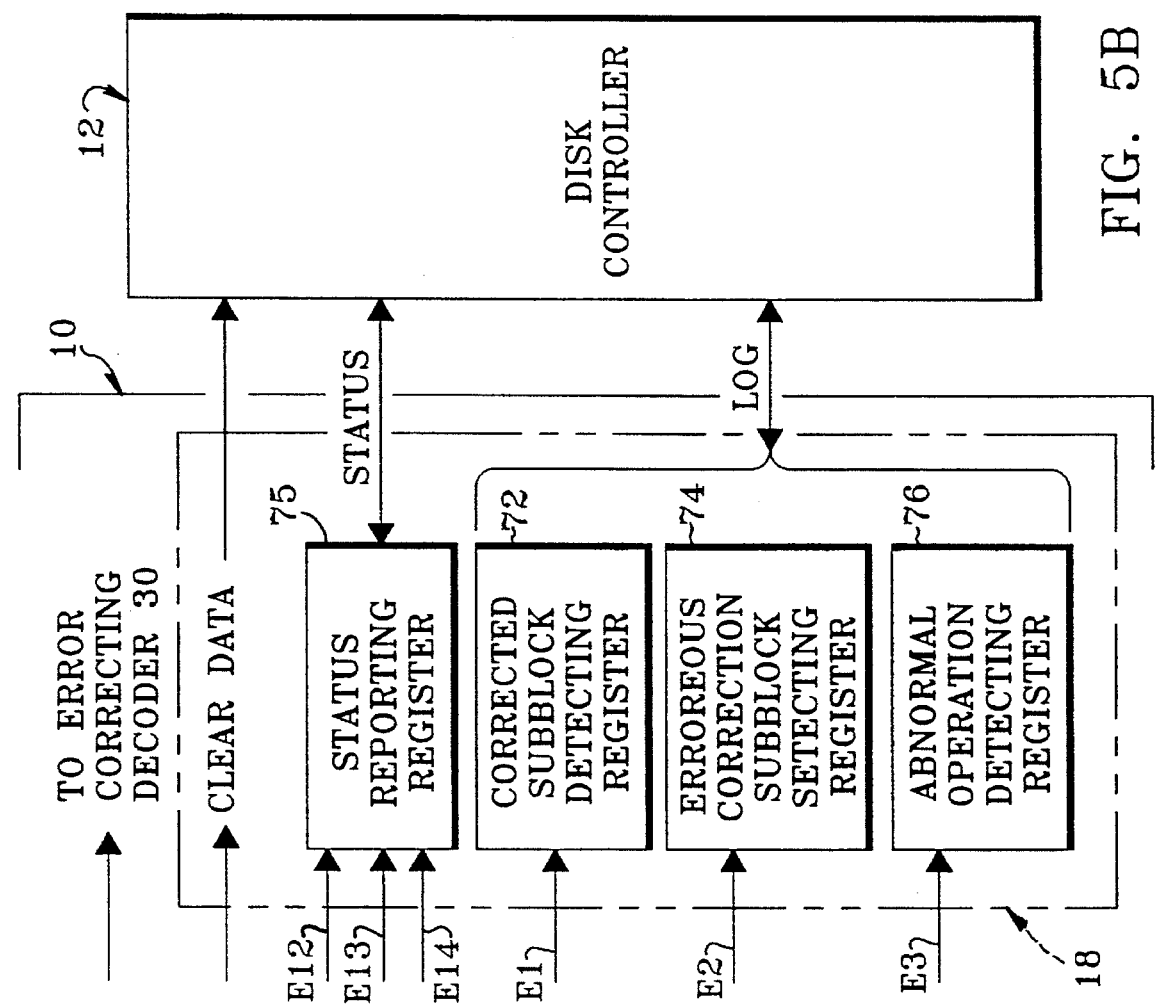

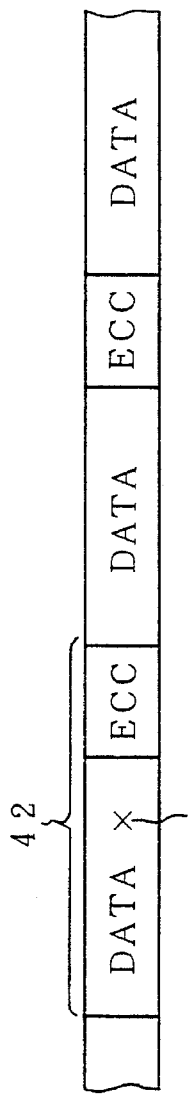
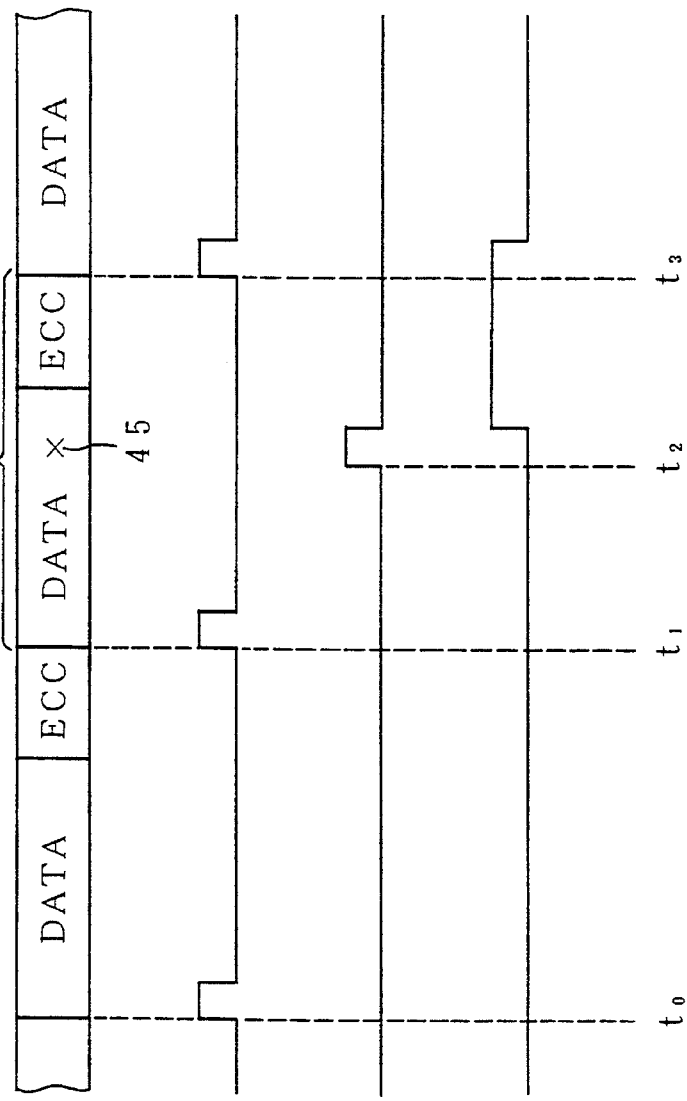
FIG. 6A FIFO INPUT
FIG. 6B FIFO OUTPUT
FIG. 6C SUBBLOCK END SIGNAL E5
FIG. 6D ERROR POSITION DETECTION SIGNAL E4
FIG. 6E LATCH OUTPUT

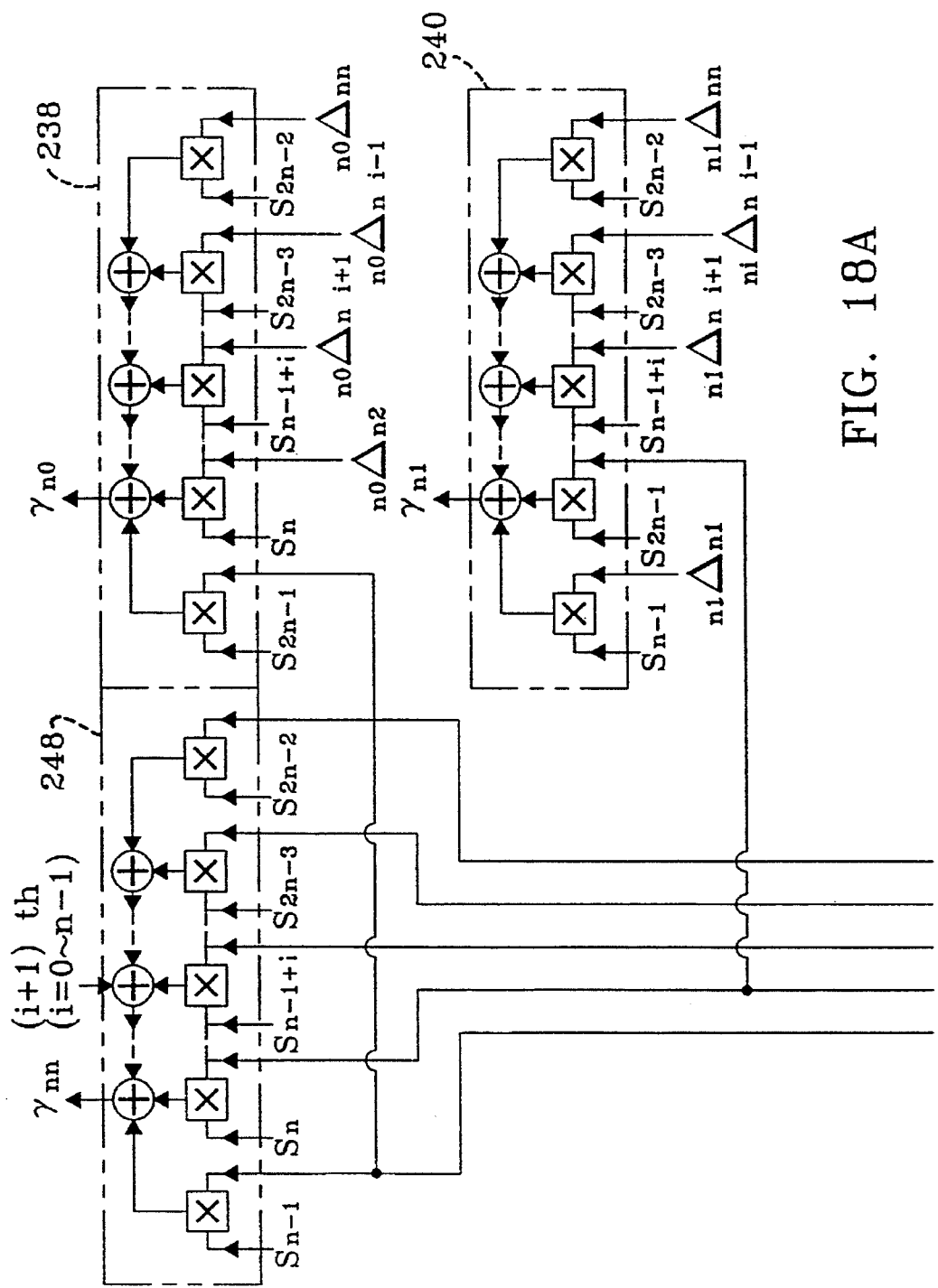

FIG. 33A (A) CLOCK CLK
(B) MODE SIGNAL E30
(C) REGISTER INPUT
(D) FIFO OUTPUT
(E) SYNDROME REGISTER INPUT 1
(F) SYNDROME REGISTER INPUT 2
(G) SYNDROME REGISTER GATE (H) FIXED LENGTH SYNDROME PRODUCTION
(I) ERROR SEARCH SWITCHING
(J) VARIABLE LENGTH SYNDROME PRODUCTION (K) ERROR SEARCH GATE
(L) FIFO OUTPUT
(M) REGISTER INPUT
(N) D1 GATE
(O) D2 GATE
(P) D3 GATE
(Q) D4 GATE
(R) D2, D4 INHIBITION GATES
(S) EDC DECODER SWITCHNG

FIG. 33

| FIG. 33A | FIG. 33B |

MULTIBYTE ERROR CORRECTING SYSTEM

BACKGROUND OF THE INVENTION

The invention relates to an error correcting system for correcting errors which occur when reading codewords recorded in a memory apparatus such as a disk drive or the like and, more particularly, to a multibyte error correcting system for correcting errors of a plurality of bytes in a lump by using a Reed-Solomon code.

Hitherto, in a subsystem constructing an external memory apparatus of a computer system, a disk unit as an input/output apparatus is connected under the domination of an input/output controller. According to an error correcting system which is used in such a subsystem, in a lower disk drive, data read out from a memory medium and calculated syndromes are sent to an upper disk controller and are held in a memory and, in the case where a notification of the error detection is received from the disk unit, the correcting operation is executed. Such an error correcting system is known as a deferred type.

On the other hand, there is an error correcting system of the on-the-fly type, in which the operations such that the data read out from the memory medium and the calculated syndromes in the lower disk drive sent to the upper disk controller and held in the memory are not executed, but during the data transfer, namely, while a head is flying over a track (on-the-fly) of the disk, the correcting operation is executed while supplying the data toward the upper input/output control apparatus. According to such an on-the-fly error correcting system, the error correction is performed while transferring the data, without needing the memory storage in the disk controller. Therefore, an exclusive-use time of the disk drive is short and there is no need to break the disk synchronization, so that the next operation can be readily started. After the correctable errors are corrected in the lower disk drive, the error corrected data is sent to the upper input/output control apparatus. In this manner, the advantage, among many, is that the data is handled in substantially the same manner as if there has been no error at all.

In the error correcting system of the desk-top type, whether the upper disk controller can correct the errors or not, the error location, the location of a data subblock having the errors, and the like can be known by the error information from the lower disk drive. In the on-the-fly type error correcting system, since the correctable errors are corrected by the lower disk drive, even if a read error occurs, even a fact that such a read error can be corrected is not known to the upper disk controller. There is, consequently, a problem such that a situation of the error correction cannot be grasped.

In the conventional error correction system, when the errors of the number exceeding the correcting ability occur, there is a possibility such that an erroneous correction or a non-detection occurs. Particularly, in a system for reading and writing user data like a disk drive, so called an unexpected data change occurs and the reliability of the system is remarkably lost.

On the other hand, as one method of correcting the errors by the error correcting system, a chain search method is generally known. The chain search method is particularly effective in the case such as an on-the-fly type for promptly correcting the errors while transferring the data.

That is, according to the chain search, the whole codewords are searched by using an error location polynomial $$(X \oplus \alpha^{i_1})(X \oplus \alpha^{i_2})(X \oplus \alpha^{i_3}) \ldots (X \oplus \alpha^{i_n}) = X^n \oplus \beta_{n-1} X^{n-1} \oplus \beta_{n-2} X^{n-2} \oplus \ldots + \beta_1 X \oplus \beta_0$$

and the error location is detected in accordance with whether the value of the above polynomial is zero or non-zero. Coefficients $\beta$ of this equation are obtained by solving simultaneous equations of (n) unknowns having syndromes as coefficients.

In the error correcting system of the on-the-fly type for quickly correcting the errors, after the syndromes are obtained by reading the codewords, until the data is sent out by setting the system into the error correctable state, only the delay of about one codeword is permitted. Therefore, an arithmetic operating circuit to solve the simultaneous equations of (n) unknowns needs to be realized by a combination circuit. Explaining further in detail, in an input/output unit like a disk drive, a high recording density and a high transfer rate are main targets of the development. To cope with the data read errors due to the high recording density, an error correcting system using a strong code such as a Reed-Solomon code has been put into practical use. In the conventional error correcting system, however, it takes time for processes, and the transfer rate is sacrificed. To solve such a problem, an on-the-fly multibyte error correcting system disclosed in U.S. Pat. No. 4,494,234 is known. According to such a system, however, in order to correct (t) byte errors, a circuit for solving the simultaneous equations of (n) unknowns and for obtaining coefficients $\beta_0$ to $\beta_{t-1}$ of the error location polynomial is necessary. (n) denotes the maximum number of error bytes which can be corrected. (t) is defined as a variable indicative of the number of error bytes which actually occur.

To obtain the simultaneous equations of (n) unknowns having character coefficients, a Cramer's formula is generally used. In this case, it is necessary to develop the simultaneous equations of (n) unknowns to a matrix equation of (n) rows and (n) columns. The number of terms which are obtained after the matrix equation was developed is equal to n!. Therefore, in case of the error correcting ability of n=3 bytes, the number of terms is equal to 6 and a circuit scale also lies within a range in which it can be put into practical use. In case of obtaining the error correcting ability of n=6 bytes, however, the number of terms is equal to 720 and the circuit is also complicated and extremely large.

On the other hand, in the conventional on-the-fly error correcting system, only a subblock of a fixed length is used as a target. A magnetic disk drive to which the error correcting system is applied, however, handles variable length data according to a CKD format. Therefore, a technique regarding how to perform the error correction in the on-the-fly type for the variable length subblock still remains as a subject which is not yet solved.

Each record of the CKD format which is variable-length controlled is divided into subblocks of a fixed length in order to perform the error correction and is set to a variable length by changing the number of subblocks. Further, a length of the last subblock changes in order to match with the user data. In the on-the-fly error correcting system, a delay of one subblock occurs upon error correction. Therefore, as for the last subblock whose length varies, the chain search for the error correction different from that of the other subblocks of the fixed length is needed. Therefore, it is considered to provide arithmetic operating circuits of different chain searches for the error correction of the fixed length subblock and the variable length subblock. With respect to the variable length subblocks, there is a problem such that a different circuit has to be provided with every change in subblock length, and that the circuit scale is too large.

On the other hand, in the record of the CKD format, a header and a counting section are provided at the head of the record and, after that, a plurality of fixed length subblocks follow as a data section. When the header and the counting section are read, the upper controller executes processes which are necessary for the reading and writing operations in a gap provided up to the subsequent subblock. In the on-the-fly error correcting system, however, a delay amount for the error correction is determined to be a delay amount which coincides with the fixed length of the subblock of the data section. Therefore, even with respect to the header and the counting section of the short data length, the error correction result is not obtained unless the same delay as that of the subblock of the data section is applied, so that the processes of the upper controller are delayed by a time corresponding to such a delay. Since the length of gap has to be decided in consideration of the delay time of the error correction, the gap is longer than that in case of the desk-top type error correcting system and there is a problem such that the recording capacity of the disk decreases.

SUMMARY OF THE INVENTION

According to the invention, there is provided a multibyte error correcting system in which, even in a data correction of the on-the-fly, a situation of the error correction in a lower input/output unit can be properly grasped by an upper input/output control unit.

According to the invention, there is also provided a multibyte error correcting system in which by providing an error detection code in addition to an error correction code, a non-detection or an erroneous correction of errors can be recognized.

According to a multibyte error correcting system of the invention, errors are corrected by using a code known as a Reed-Solomon code. A codeword thereof is constructed by elements of a Galois field GF $(2^m)$ that is defined by an arbitrary natural number (m). The codeword which was read from a memory apparatus such as a disk medium or the like forms syndromes by a polynomial having the roots $\alpha^a$, $\alpha^{a+1}$, ..., $\alpha^{a+2n-1}$ [$\alpha$ is an element of the Galois field; a is a natural number which satisfies $a(a+2n-1 \leq 2^m-1)$; n is a constant indicative of the maximum number of error bytes which can be corrected] as solutions. Up to (n) byte errors in the code are corrected by processing (2n) syndrome bytes. In the correction of a read error in an input/output unit such as a magnetic disk drive or the like, for example, a case of correcting up to (n=3) byte errors is handled as an optimum example. In this case, the codeword is constructed by the elements of the Galois field GF $(2^8)$. Namely, the codeword has $2^8$ (=256) character locations and each character is expressed by the bytes of 2-dimensional bits of (m=8). The invention may be also applied to the correction of byte errors exceeding (n=3).

According to the invention, a situation of the error correction which is performed by the lower disk drive can be properly grasped by the upper input/output controller by the on-the-fly type. Namely, the codeword recorded on a memory medium of the disk drive is read out and errors are corrected by an error correction code decoder (ECC decoder) while transferring the data.

When considering the error correction by the Reed-Solomon code for correcting (t=3) byte errors as an example, the following arithmetic operating processes are executed in the ECC decoding.

I. Syndromes $S_0$ to $S_5$ are calculated from the codeword (subblock).
II. The coefficients $\beta_0$ to $\beta_2$ of the error location polynomial are determined on the basis of the syndromes $S_0$ to $S_5$.
III. The error location is decided from the error location polynomial by the chain search.
IV. The exclusive OR (EX-OR) of the read data which was delayed by only the time necessary for preparation of the error correction (time which is necessary for calculation of the syndromes in the above item I) and the value for error correction which was outputted at the timing of the error location is calculated and the errors are corrected while transferring the data.

According to the invention, for such an ECC decoder, either one of the state having no error, the state having correctable errors, and the state having uncorrectable errors in the reading operation is detected by a correcting state detecting section. Just after the user data of one record was read out from the memory medium, either one of the above three states detected is reported to an upper disk controller by a control processor provided for the disk drive. In the status report, status information indicative of any one of the states having no error, the state having correctable errors, or the state having uncorrectable errors in the reading operation, which was decided by the ECC decoder 30, is read by the control processor. The status information is transferred to the upper disk controller just after the user data of one record was read out from the memory medium.

The correcting state detecting section includes: a corrected subblock detecting section for detecting corrected subblocks; an erroneous correction subblock detecting section for detecting erroneous correction subblocks; and an abnormal operation monitoring section for detecting an abnormal operation due to a non-detection or erroneous correction of the errors. The user data that is read out from the memory medium is constructed by subblocks corresponding to one or a plurality of codewords. Therefore, each time the reading operation of the subblock is finished, the detecting state is read by the control processor, thereby enabling the detecting state to be reported to the upper disk controller. During the correcting process of the subblock by the ECC decoder, the corrected subblock detecting section latches an error location signal generated at the error correction timing until the end of the correction of the subblock and outputs to the control processor. For this purpose, the control processor reads a detection signal of the corrected subblock detecting section synchronously with the transfer end timing of the subblock and reports as status information to the upper disk controller.

The corrected subblock detecting section compares the number of errors which is calculated in the step of obtaining the coefficients $\beta_0$ to $\beta_2$ of the error location polynomial from the syndromes $S_0$ to $S_5$ in the ECC decoder and the number of errors which is decided from the error location polynomial. When those error numbers don't coincide, the corrected subblock detecting section detects that there is an erroneous correction, and outputs the detection result of the presence of the erroneous correction to the control processor on a subblock unit basis.

The abnormal operation monitoring section detects the abnormal correction operation on the basis of the detection output of the corrected subblock detection and the detection results of the uncorrectable errors and non-zero syndromes obtained by the ECC decoder. Specifically speaking, the abnormal operation monitoring section detects the abnormal operation by discriminating either one of the following cases:

(i) The case where the non-zero syndromes are not detected and the correctable errors are detected.

(ii) The case where the non-zero syndromes are not detected and the uncorrectable errors are detected.

(iii) The case where the correctable errors and uncorrectable errors are not detected and the non-zero syndromes are detected.

According to the invention, in order to detect the non-detection or erroneous correction of errors by the ECC decoder, an error detection check code (EDC code) is formed by an error detection code encoder (EDC encoder) in parallel with the formation of the codeword by an error correction code encoder (ECC encoder) for the write data. In the error detection check, error detection check bytes (EDC bytes) $D_1, D_2, \ldots, D_n$ are provided after the user data comprising of one or a plurality of subblocks are generated from the ECC encoder. The error detection check bytes $D_1, D_2, \ldots, D_n$ are formed by inputting in parallel the user data for the ECC encoder to the EDC encoder.

The read-out user data is subjected to an error correction by the ECC decoder. After that, the error corrected user data is transferred to the upper input/output controller and is also inputted to the error detection code decoder (EDC decoder). The EDC decoder receives the corrected user data and forms syndromes and detects the correction erroneous operation including the erroneous correction or non-detection in the ECC decoder and reports to the upper input/output controller. The error detecting process is executed serially with the ECC decoding.

The EDC encoder forms a plurality of error detection check bytes $D_1, D_2, \ldots, D_n$ so as to make the lengths of codewords different by a primary generator polynomial. That is, they are formed on the assumption that

| | |
|---|---|
| $D_1$: | $X \ominus \alpha^1$ |
| $D_2$: | $X \oplus \alpha^2$ |
| $D_3$: | $X \oplus \alpha^3$ |
| $D_4$: | $X \oplus \alpha^4$ |
| . | . |
| . | . |
| . | .: |
| $D_n$: | $X \oplus \alpha^n$ |

That is, the EDC encoder inputs write byte data $C_n$ to $C_1$ of the number as many as the number of subblocks constructing the user data for each of the error detection check bytes $D_1, D_2, \ldots, D_n$. The exclusive OR between those write byte data and the result of the previous calculation according to the primary generator polynomial is obtained by an EX-OR circuit. A constant $\alpha^n$ of the primary polynomial is multiplied to an output of the EX-OR circuit by a multiplying circuit. An output of the multiplying circuit is finally latched in a latch circuit until the next byte data is inputted and is subsequently fed back to the EX-OR circuit. Such a loop arithmetic operation is repeated with respect to all of the byte data in the code.

With respect to the formation of the half among the error detection check bytes $D_1, D_2, \ldots, D_n$, the EDC encoder eliminates a part of the error ECC check bytes in each subblock from the calculation targets of the primary generator polynomial. An exponent of the elements of the Galois field GF ($2^m$) is calculated by a modulus MOD $2^m-1$ and has a period of $2^m-1$. Therefore, when the same error pattern exists at the location that is away from a certain location by ($2^m-1$) bytes, the errors are extinguished and cannot be detected. In case of the elements of GF ($2^8$), when the same error pattern exists at the location that is away by 254 bytes, the errors are extinguished. To avoid such a situation, a part of the error correction check bytes in each subblock is eliminated.

The EDC encoder forms the error detection check bytes $D_1, D_2, \ldots, D_n$ by setting the error correction check bytes in the subblock to zero. This is because it is sufficient that only the data section is guaranteed. The error correction check bytes in the subblock are ignored.

On the other hand, each time the error corrected user data and the error detection check bytes are inputted, the EDC decoder of the reading system forms a plurality of syndromes $SD_1, SD_2, \ldots, SD_n$ from the (n) data of different word lengths corresponding to the check bytes $D_1, D_2, \ldots, D_n$ by the primary generator polynomial. The error operation detecting section detects whether each of the produced syndromes $SD_1, SD_2, \ldots, SD_n$ is equal to zero or non-zero. When the number of non-zero syndromes is equal to or larger than a predetermined value, it is judged that there is an erroneous operation due to the error non-detection or erroneous correction of the ECC decoder, so that it is notified to the upper input/output controller. The EDC decoder forms the syndromes $SD_1, SD_2, \ldots, SD_n$ in a manner similar to the formation of the error detection check bytes $D_1, D_2, \ldots, D_n$ in the EDC encoder.

According to such a multibyte error correcting system, each of the state having no error, the state having correctable errors, and the state having uncorrectable errors in the on-the-fly error correction in the lower input/output unit of the magnetic disk drive or the like can be recognized by the upper controller each time the user data is read. Therefore, even in the on-the-fly type, the correcting operation in the input/output unit can be known from the outside. Since the correcting operation can be monitored, the reliability of the system is improved. In the writing mode of the disk drive, after the user data in which the error correction code was encoded, the error detection check bytes are added and written. Therefore, in the data reading mode, by decoding the error corrected user data and the error detection check bytes, the non-detection and erroneous correction at the time of error correction can be detected. Therefore, by notifying the erroneous correction or non-detection in the error correction to the upper controller, the retry process can be performed and the reliability can be improved.

On the other hand, according to the invention, there is provided a multibyte error correcting system in which the solutions of the simultaneous equations of (n) unknowns which are required for the correcting ability of arbitrary (n) bytes can be realized by a relatively simple circuit construction and, further, a circuit amount is reduced by using a mathematical relation.

According to the invention, there is also provided an arithmetic operating circuit in which the simultaneous equations of (n) unknowns to obtain coefficients $\beta$ of a polynomial of error location can be solved by a relatively simple circuit construction.

In the error correction, a syndrome forming section reads a Reed-Solomon codeword and produces (2n) syndromes. Subsequently, a coefficient arithmetic operating circuit obtains coefficients $\beta_k$ (k=0 to n−1) of the error location polynomial from the solutions of the simultaneous equations of (n) unknowns by using the (2n) syndromes $S_0$ to $S_{2n-1}$ obtained by the syndrome forming section. In order to obtain values $\gamma_{n0}$ to $\gamma_{nn}$ to decide the solutions $\beta_k$ of the simultaneous equations of (n) unknowns from values $\gamma_{n-1,0}$ to $\gamma_{n-1,n-1}$ to decide the solutions of the simultaneous equations of (n−1) unknowns, the coefficient arithmetic operating circuit sequentially couples (n) arithmetic operating circuits of (n) unknowns from one element to (n) elements, thereby obtaining the values γ to decide the solutions β of simultaneous equations of (t) unknowns for an arbitrary number (t) of error bytes.

In case of the error correction of (t=3) bytes, the coefficient arithmetic operating circuit is constructed by a combination circuit of an arithmetic operating circuit of one unknown, an arithmetic operating circuit of two unknowns, and an arithmetic operating circuit of three unknowns. When t=3 bytes, a combination circuit of one unknown receives the syndromes $S_0$ and $S_1$ and supplies $\gamma_{10}$ and $\gamma_{11}$ to a combination circuit of two unknowns together with the syndromes $S_2$ and $S_3$. The combination circuit of two unknowns supplies $\gamma_{20}$, $\gamma_{21}$, and $\gamma_{22}$ to a combination circuit of three unknowns together with the syndromes $S_2$ to $S_5$. Further, the combination circuit of three unknowns generates $\gamma_{30}$, $\gamma_{31}$, $\gamma_{32}$, and $\gamma_{33}$.

A coefficient selection arithmetic operating circuit recognizes the number (t) of errors from an output of the coefficient arithmetic operating circuit and calculates coefficients $\beta_0$ to $\beta_{t-1}$ from the regularity of the simultaneous equations of (n) unknowns corresponding to the number (t) of errors. When $\gamma_{nn}$ is non-zero, it will be understood that the data has an error of (n) bytes. For example, in case of t=3, outputs $\gamma_{30}$ to $\gamma_{33}$ of the arithmetic operating circuit of three unknowns are selected and $$\beta_0 = \gamma_{30}/\gamma_{33}$$

$$\beta_1 = \gamma_{31}/\gamma_{33}$$

$$\beta_2 = \gamma_{32}/\gamma_{33}$$

are obtained. Generally, each of the arithmetic operating circuit of (n) unknowns is constructed by: a plurality of multiplying circuits for multiplying two syndromes; and an exclusive OR circuit for obtaining the exclusive OR of the plurality of multiplying circuits. The syndromes $S_{t-1+i}$ (i=0 to t) among 2t syndromes (S) are selected and supplied to the multiplier group. Further, inputs of the two multiplying circuits are made common on the basis of a principle that the syndrome inputs to the two different multiplying circuits provided for each of a plurality of arithmetic operating circuits of (n) unknowns are determined to the same value.

The circuit scale can be remarkably reduced by devising the mathematical development of the matrix equation to solve the simultaneous equations of (n) unknowns for obtaining the coefficients $\beta_k$. Therefore, not only the most general error correcting ability of (n=3) byte error can be realized but also, for example, the multibyte error correcting ability such as an (n=6) byte error which cannot be put into practical use hitherto because of an extremely large circuit scale can be realized by a simple circuit construction.

According to the invention, there is provided an on-the-fly error correcting system which can efficiently execute error correcting processes of a fixed length subblock and a variable length subblock by a small circuit amount.

The ECC decoder of the invention realizes the error correction of a variable length record according to the CKD format. Namely, in the variable length record, the number of fixed length subblocks is changed and, further, the length of the last subblock varies in order to match with the user data. Even when the variable length subblock continues to the last of the fixed length subblock as mentioned above, the arithmetic operation of the error location is efficiently performed by a small scale of the arithmetic operating circuits. Therefore, the ECC decoder has the following error location arithmetic operating circuit section.

In the case where the variable length subblock is received subsequent to the fixed length subblock is received, the error location arithmetic operating circuit section presumes the fixed length subblock with respect to the variable length subblock (corresponding to the addition of a dummy). When reaching the start location of the presumed fixed length subblock during the execution of the arithmetic operation (error search) of the error location of the preceding fixed length subblock, the arithmetic operation of the error location of the variable length subblock is started in parallel in a state in which the result of the arithmetic operation is not outputted (dummy search). Subsequently, when reaching the start location of the variable length subblock, an operating mode is switched to a state (error search) in which the arithmetic operation result is outputted.

The error location arithmetic operating circuit section comprises: a first error location arithmetic operating circuit for operating the error location of the received fixed length subblock; a second error location arithmetic operating circuit for calculating the error location of the received variable length subblock; and a control circuit section for those circuits. When the syndromes of the preceding fixed length subblock are formed, the control circuit section starts the arithmetic operation of the first error location arithmetic operating circuit, thereby generating the error location signal. At a time point when the syndromes of the next variable length subblocks are formed during the arithmetic operation, the control circuit section allows the second error location arithmetic operating circuit to start a dummy arithmetic operation such as not to generate the error location signal. Further, at a time point when the arithmetic operation of the preceding fixed length subblock is finished, an operating mode is switched to an arithmetic operating state in which the result of the arithmetic operation is outputted from the second error location arithmetic operating circuit. The control circuit section also controls the first and second error location arithmetic operating circuit sections on the basis of a mode signal indicating whether the continuous subblocks are the fixed length subblock or the last variable length subblock.

Now, assuming that the error location polynomial in which the error location was corrected is $$ELP(X) = \gamma_n X^n \oplus \gamma_{n-1} X^{n-1} \oplus \ldots + \gamma_3 X^3 \oplus \gamma_2 X^2 \oplus \gamma_1 X^1 \oplus \gamma_0$$

each of the first and second error location arithmetic operating circuit sections has the following circuit construction.

First, a first multiplier is provided for each term of the polynomial. The first multiplier previously multiplies $\alpha^0$ to $\alpha^{n(N-1)}$ to the coefficients $\gamma_0$ to $\gamma_n$ and stores the results of the multiplications into registers so that the data can be searched from the high order data at a time point when the coefficients $\gamma_0$ to $\gamma_n$ of the polynomial are obtained on the basis of the formation of the syndromes $S_0$ to $S_{2n-n}$. On the other hand, a second multiplier is provided for each term of the polynomial. The second multiplier repetitively multiplies the values $\alpha^0$ to $\alpha^{-n}$ to perform the chain search synchronously with the transfer of the values to the registers and again stores the result of the multiplication into each register. Further, an adding circuit for adding the value stored in the register in correspondence to each term of the error location polynomial and for outputting the addition result as an error location signal is provided.

Now assuming that the number of correctable errors is equal to n=3, the corrected error location polynomial becomes $$\gamma_3 X^3 \oplus \gamma_2 X^2 \oplus \gamma_1 X^1 \oplus \gamma_0$$

In this case, the first multiplier provided for each term of the polynomial respectively multiplies $\alpha^0$ to $\alpha^{3(N-1)}$ at a time point when the coefficients $\gamma_0$ to $\gamma_3$ of the polynomial are obtained on the basis of the formation of the syndromes $S_0$ to $S_5$ and stores the result of the multiplication into each register. The second multiplier provided for each term of the polynomial repetitively multiplies $\alpha^0$ to $\alpha^{-3}$ to the values of the registers and again stores the result of the multiplication into each register. The adding circuit adds the values stored in the registers corresponding to the terms of the error location polynomial obtained by the first and second multipliers at every byte location and generates the addition result as an error location signal at each byte location. The error value which is calculated simultaneously with the error location is also processed in a manner similar to the above case.

Since the subblock is matched with the user data, even when the length of the last variable length subblock according to the CKD format changes, it is sufficient that the arithmetic operating circuit of the error location merely changes the timing for switching from the arithmetic operation of the dummy search to the arithmetic operation of the ordinary chain search in accordance with the changed block length. The error locations can be calculated by one arithmetic operating circuit with respect to all of the lengths of the variable length subblocks.

According to the invention, there is provided a multibyte error correcting system of the on-the-fly in which the delay for the error correction of the header and counting section is decreased as much as possible and the reduction of the memory capacity by an increase in gap is prevented.

For this purpose, the ECC decoder of the invention has a delay circuit for reducing as much as possible the delay by the error correction of the short fixed length subblock for control serving as header and counting section provided at the head of the record of the CKD format. When the head subblock for control of the short fixed byte length and one or a plurality of subblocks for data of the fixed byte length longer than that of the subblock for control are received from the memory medium, the delay circuit switches to the delay amount according to the byte length of each received subblock, thereby allowing the error correction to be performed. The delay circuit has, for example: a first FIFO buffer memory having the fixed byte length of the subblock for control; and a second FIFO buffer memory which is cascade connected to the first FIFO buffer memory. The second FIFO buffer memory has the byte length which is obtained by subtracting the fixed byte length of the subblock for control from the fixed byte length of the subblock for data. When the subblock for control is received, an output of the first FIFO buffer memory is selected, and when the subblock for data is received, an output of the second FIFO buffer memory is selected by a switching circuit.

The delay circuit can be realized by a readable/writable memory such as an RAM or the like. In this case, there are provided: an address counter for generating an address in the memory; a first decoder for judging that the address which is away from the generated address of the address counter by only the fixed byte length of the subblock for control was designated; and a second decoder for judging that the address which is away from the generated address of the address counter by only the fixed byte length of the subblock for data was designated. The address counter executes the writing and reading operations on a byte unit basis synchronously with the byte clock. Namely, a write address of the input bytes is generated in the former half of the byte clock period and the data is written into the memory. A read address of the byte data which was written one subblock before is generated in the latter half of the byte clock period and the data is read out from the memory. By the selecting circuit, an output of a first decoder is selected when the subblock for control is received, while an output of a second decoder is selected when the subblock for data is received. Further, when a judgment output of the first or second decoder is obtained, the address counter is reset and the writing and reading operations from the head address are repeated.

Generally, the subblock for control of the header and counting section at the head of the CKD format is shorter than the subblock for data. In the case where the delay necessary for correction of the subblock for data is executed, the transmission to the upper controller is delayed. A gap between the header and counting section and the next subblock for data has to be increased. On the other hand, according to the invention, when the subblock for control of the header and counting section at the head of the record is discriminated, by switching the delay amount for error correction to the delay amount according to the short subblock for control, the error corrected header and counting section can be readily obtained without waiting for the long delay time set in the subblock for data. As a result, the delay for the upper controller is reduced and there is no need to increase the gap.

The above and other objects, features, and advantages of the present invention will become more apparent from the following detailed description with reference to the drawings.

BRIEF DESCRIPTION OF THE DRAWINGS

FIGS. 6A to 6E are timing charts for a detecting process of correctable errors in FIG. 5;

DETAILED DESCRIPTION OF THE PREFERRED EMBODIMENTS

[Hardware construction]

Figure 1:
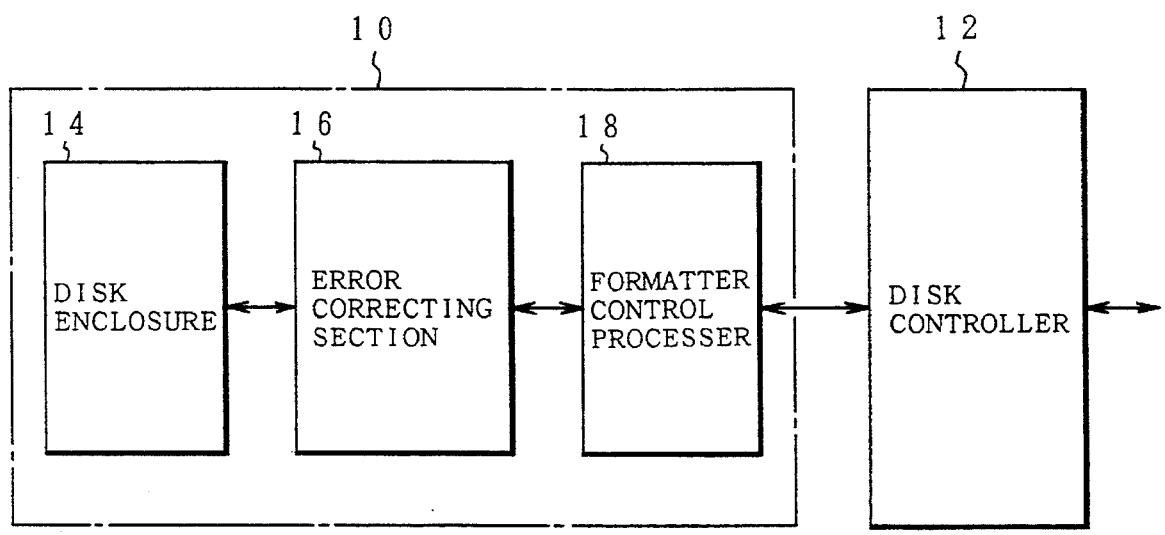
FIG. 1 is a block diagram of a disk drive to which the invention is applied.

FIG. 1 is a fundamental construction of an error correcting system for performing the on-the-fly error correction. A disk drive 10 as a lower input/output unit (I/O unit) comprises a disk enclosure 14, an error correcting section 16, and a formatter control processor 18. The disk drive 10 is connected under the domination of a disk controller 12 as an input/output controller (I/O controller). The disk controller 12 is connected to a channel apparatus of a host computer. When a write or read access is requested for the disk controller 12 from the host computer, the disk controller 12 first generates a seek command to the disk drive 10, thereby disconnecting the disk drive 10 from the disk controller 12. The formatter control processor 18 executes the seeking operation of a head mechanism provided in the disk enclosure 14, thereby positioning the head to a target track. When receiving a seek completion report from the disk drive 10, the disk drive 10 recombined to the disk controller 12. A writing operation by the transfer of write data is executed or a reading operation by the reading of the data from a disk medium is performed.

In the writing mode, the error correcting section 16 executes an encoding operation to form a Reed-Solomon code. In the reading mode, an error correction (decoding operation) of the on-the-fly type is executed while transferring the read data.

Figure 2:
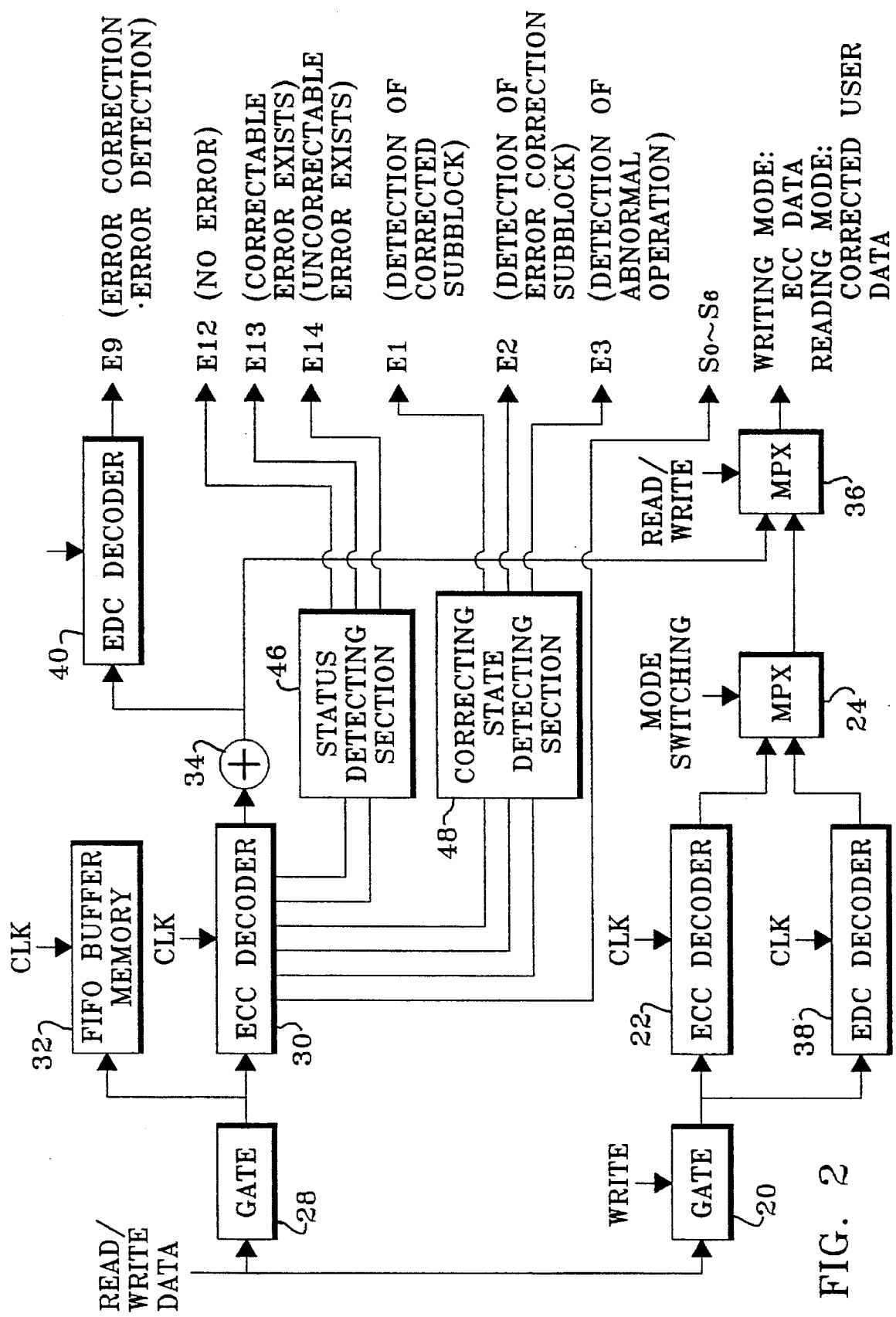
FIG. 2 is a block diagram of an error correcting section in FIG. 1.

FIG. 2 shows the error correcting section 16 provided for the disk drive 10 in FIG. 1. A writing system will be first described. The write data from the formatter control processor 18 passes through a gate 20 and is supplied to an encoder 22 for error correction (hereinafter, also simply referred to as an ECC encoder 22). In the embodiment, the case of using the Reed-Solomon code for correcting errors of a correcting ability (n=3) will be explained as an example. The write data is supplied as a stream of byte data of a width of eight bits. The ECC encoder 22 forms check bytes of an error correction code (hereinafter, also referred to as ECC check bytes) which are constructed by a Galois field GF ($2^8$). A generator polynomial in this case has elements $\alpha^0$, $\alpha^1$, $\alpha^2$, $\alpha^3$, $\alpha^4$, and $\alpha^5$ of the Galois field as solutions. Specifically speaking, the generator polynomial is as follows.

$$G(X) = (x \oplus \alpha^0)(x \oplus \alpha^1)(x \oplus \alpha^2)(x \oplus \alpha^3)(x \oplus \alpha^4)(x \oplus \alpha^5)$$

The ECC check bytes formed from the data section by the ECC encoder 22 are added after the data. The resultant data is outputted as write data to the disk enclosure 14 through multiplexers 24 and 36 and are written to a disk medium.

In the embodiment, the ECC encoder 22 executes an interleave to form the ECC check bytes for the inputted user data every even bytes and odd bytes, and adds the produced ECC check bytes every subblock and generates the resultant data.

Figure 3:
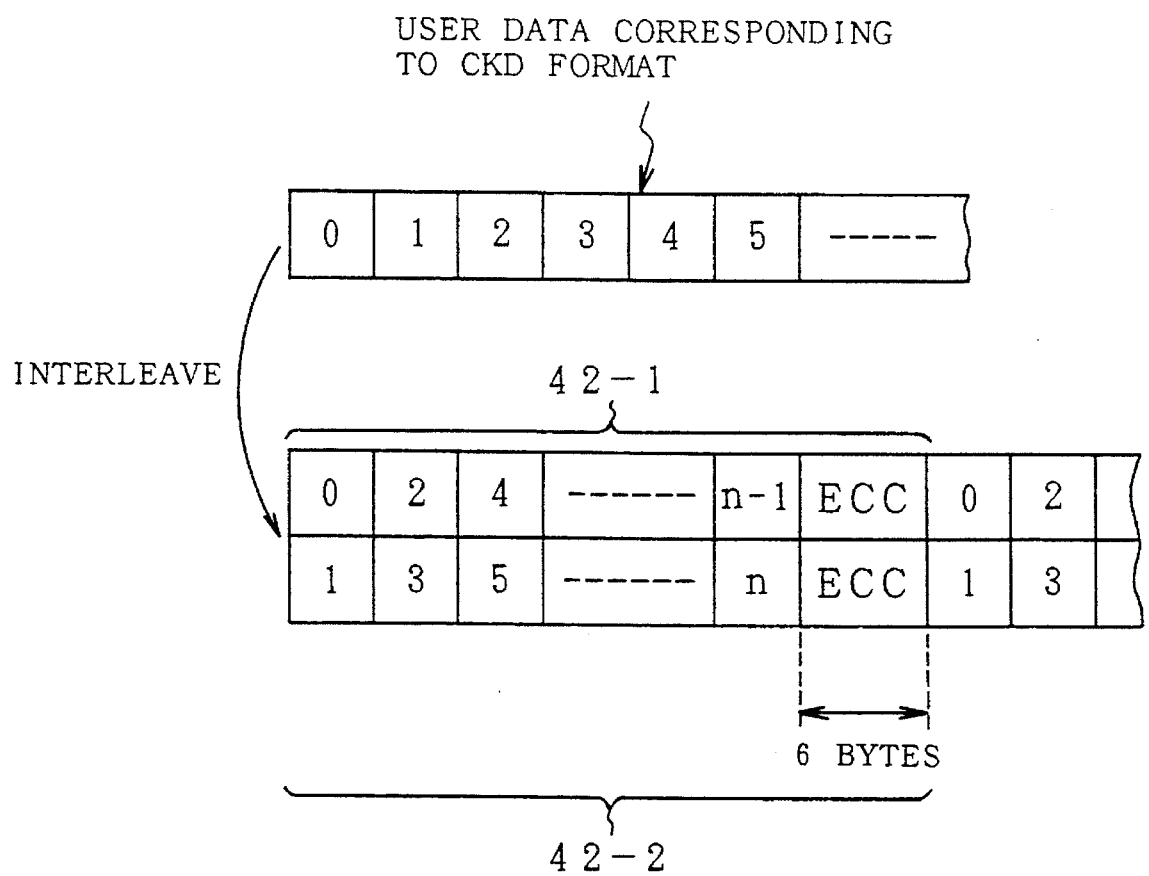
FIG. 3 is an explanatory diagram of subblocks which are formed by an interleave of user data in the invention.

FIG. 3 shows a concept of the interleave in the ECC encoder 22. The user data is shown by the numbers, each of which indicates the data separated on a byte unit basis. The user data is interleaved to even bytes 42-1 and odd bytes 42-2. A code length per interleave is equal to, for example, up to 255 bytes and can be properly decided within such a range. Although the even bytes 42-1 and odd bytes 42-2 are separately shown for convenience of explanation, they are not separated on a byte unit basis in the actual process but are handled as one byte stream.

After the interleaved even bytes 42-1 and odd bytes 42-2, check bytes ECC of six bytes are added by the ECC encoder 22. Therefore, a subblock 42 which is outputted from the ECC encoder 22 apparently has up to 500 bytes in which both of the data and the ECC check bytes of 12 bytes are added.

Further, since the disk drive 10 uses the CKD record format, the record length is variable and one record length is determined by a length of user data. The number of subblocks of the user data, therefore, also changes by the length of user data. Further, there is a case where the last subblock becomes a variable length subblock in which a range of the fixed subblock length changes in order to match with the user data.

The reading system of FIG. 2 will now be described. The original read data read out from the disk enclosure 14, namely, a codeword of a subblock unit is supplied to an ECC decoder 30 through a gate 28. At the same time, the read data from the gate 28 is branched and stored into an FIFO buffer memory 32. The FIFO buffer memory 32 performs a delay within a time of one subblock that is necessary for the correcting operation in the ECC decoder 30. The ECC decoder 30 executes a strong error correction for correcting errors of up to (n=3) bytes for two codewords as targets included in the subblocks of the read data. An error correction value is generated from the ECC decoder 30 to an exclusive OR circuit (hereinafter referred to as an EX-OR circuit) 34 at a byte timing of an error location in the subblock. The EX-OR circuit 34 gets the exclusive OR between the error correction value and the byte data before correction which is outputted from the FIFO buffer memory 32 at the same timing as that of the error correction value, thereby inverting error bits of the erroneous byte and correcting the errors. The clear data in which the errors were corrected by the EX-OR circuit 34 passes through a multiplexer 36 and is transferred as corrected user data to the upper disk controller 12 via the formatter control processor 18. Such an on-the-fly error correction of the read data enables the simultaneous correction of up to (n=3) bytes to be performed while flowing the byte stream of the read data from the disk enclosure 14 side to the formatter control processor 18 side without interrupting during the data flow.

According to the embodiment of FIG. 2, to monitor the non-detection and erroneous correction as abnormal operations in the ECC decoder 30 by using a data detection code, an EDC encoder 38 is provided for the writing system and an EDC decoder 40 is provided for the reading system.

Figure 4:
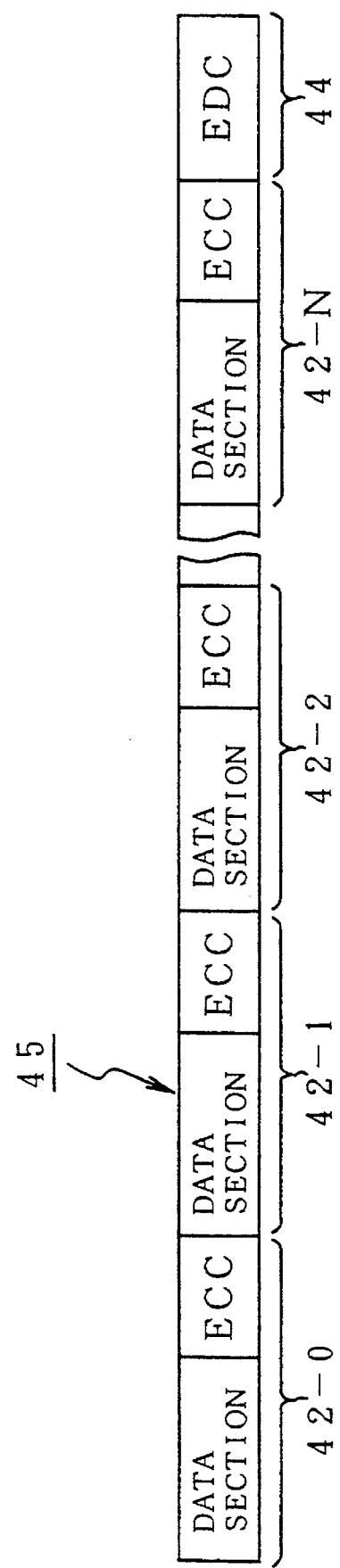
FIG. 4 is an explanatory diagram of a data structure of one record in which EDC check bytes are added after the user data having a plurality of subblocks.

FIG. 4 shows the user data added with the EDC check bytes 44. The user data is variable length data and is constructed by (n) subblocks 42-1 to 42-N according to the data length. Since the subblocks 42-1 to 42-2 are outputted from the ECC encoder 22, they are constructed by the data section of up to 500 bytes and the ECC check bytes of 12 bytes. EDC check bytes 44 formed by an EDC encoder 38 are added after the user data which is outputted from the ECC encoder 22. The EDC encoder 38 and an EDC decoder 40 will be explained in detail hereinlater.

A status detecting section 46 and a correcting state detecting section 48 are provided for the ECC decoder 30 of the reading system. The status detecting section 46 allows the formatter control processor 18 to read a status signal E12 indicative of the state having no error, a status signal E13 indicative of the state having correctable errors, or a status signal E14 indicative of the state having uncorrectable errors which were determined in the correcting operation upon reading in the ECC decoder 30 just after the user data of one record was read out from the memory medium. When receiving a status command from the upper disk controller 12, the formatter control processor 18 responds by outputting status information indicating the state having no error, the state having correctable errors, or the state having uncorrectable errors. Therefore, even in the on-the-fly type, the upper disk controller 12 can know the correcting operation in the disk drive 10 and can also monitor the correcting operation.

The correcting state detecting section 48 can notify a corrected subblock detection signal E1, an erroneous correction subblock detection signal E2, and an abnormal operation detection signal E3 to the upper disk controller 12 by using a logging function of the formatter control processor 18. The corrected subblock detection signal E1 shows that the errors which can be corrected by the ECC decoder 30 were detected and corrected. The erroneous correction subblock detection signal E2 indicates that there are errors which cannot be corrected by the ECC decoder 30. Further, the abnormal operation detection signal E3 shows that the abnormal operation such as non-detection or erroneous correction of the errors was performed in the ECC decoder 30. Syndromes $S_0$ to $S_5$ calculated in the error correcting operation are outputted from the ECC decoder 30 to the upper disk controller 12 via the formatter control processor 18.

[Detection and report of error correcting state]

Figure 5A:
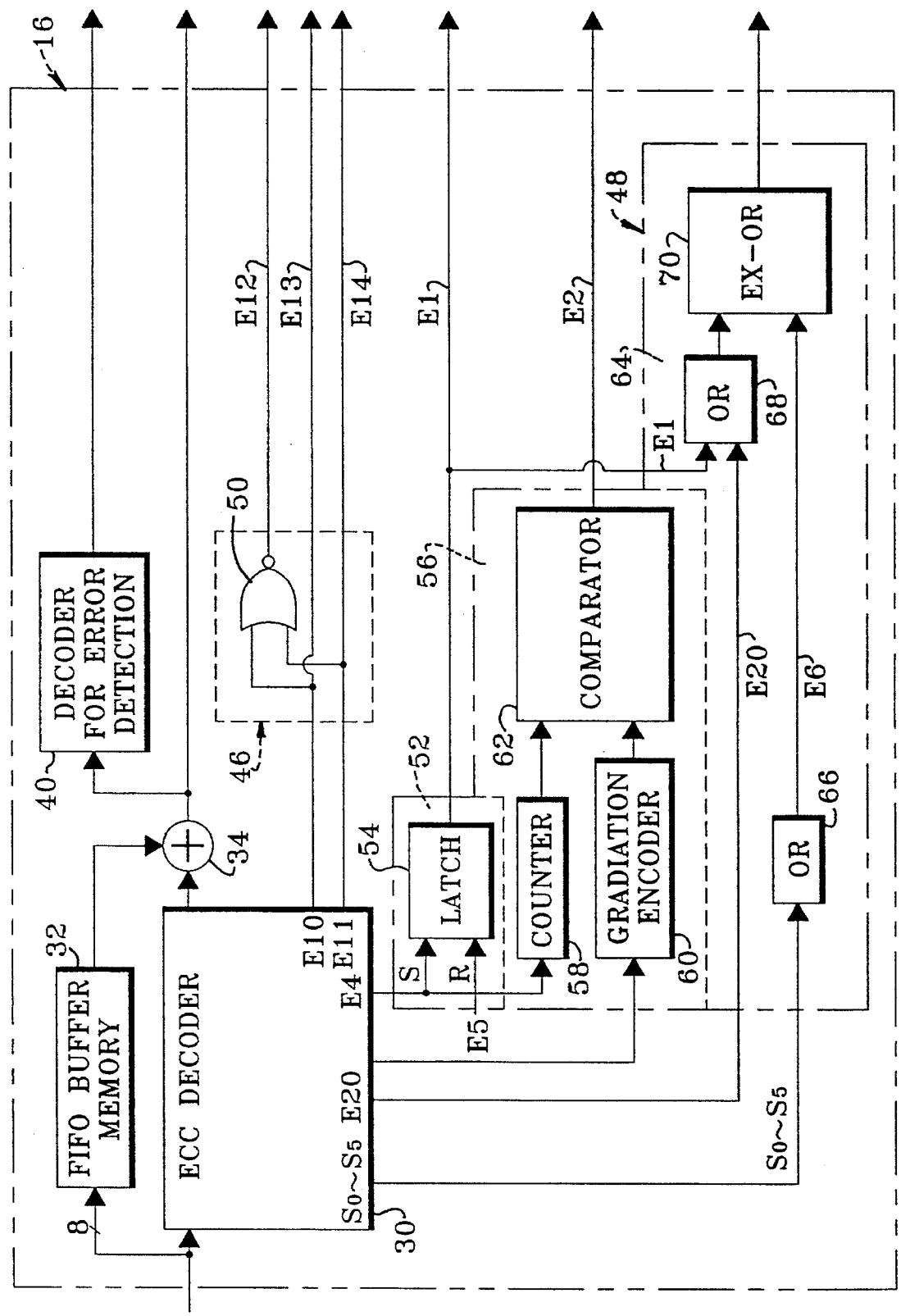
FIG. 5 is a block diagram of an embodiment in which a correcting state in the error correcting section in FIG. 1 is detected and reported.

FIG. 5 shows the error correcting section 16 in FIG. 1 in detail. The ECC decoder 30 receives the byte stream of the read data and executes the error correcting operation on a subblock unit basis. In the embodiment, the ECC decoder 30 is realized by a large scale integrated circuit using various kinds of logic elements. The ECC decoder 30 receives the read data of the subblocks and first calculates the syndromes $S_0$ to $S_5$ every code word of the subblock unit. Since the byte data inputted to the FIFO buffer memory 32 is delayed by only the transfer time of one subblock because the ECC decoder 30 needs the byte data of subblocks for the calculation of the syndromes $S_0$ to $S_5$. After completion of the calculation of the syndromes $S_0$ to $S_5$, the byte data which was delayed by the transfer time of one subblock from the input is sequentially outputted to the EX-OR circuit 34 from the head. The error value is supplied to the EX-OR circuit 34 synchronously with the transfer of the byte data at the transfer timing of the byte data of the error location which is specified by the coefficients $\beta_0$ to $\beta_2$ of the error location polynomial. Therefore, the EX-OR circuit 34 inverts the error bits in the byte data outputted from the FIFO buffer memory 32 in accordance with the error value, thereby correcting. The byte data at the locations other than the error location passes through the EX-OR circuit 34 as it is.

The correcting state detecting section 48 is provided for the ECC decoder 30. The correcting state detecting section 48 comprises: a corrected subblock detecting section 52; an erroneous correction subblock detecting section 56; and an abnormal operation monitoring section 64. The corrected subblock detecting section 52 has a latch circuit 54. An error location detection signal E4 is supplied to a set terminal (S) of the latch circuit 54 at the timing of the error byte location in the transfer subblock decided by the ECC decoder 30. On the other hand, a subblock end signal E5 indicative of the termination of the subblock is supplied to a reset terminal (R) of the latch circuit 54.

The operation of the corrected subblock detecting section 52 in FIG. 5 will now be described. FIG. 6A shows input data to the FIFO buffer memory 32 and the subblock 42 including two codewords is constructed by a data section of up to 500 bytes and an ECC check byte section of 12 bytes. An FIFO output in FIG. 6B is performed at a timing that is delayed by only the calculating time of the syndromes in the ECC decoder 30, for example, after the elapse of time of one subblock. It is now assumed that an error byte 45 exists at an arbitrary byte location of the data section of the subblock 42. FIG. 6C shows the subblock end signal E5 and is enabled at times t0, t1, and t3 of the terminations of the subblock synchronized with the FIFO output. The error location detection signal E4 shown in FIG. 6D is enabled at time t2 because the error value is supplied to the EX-OR circuit 34 at a timing when the error byte 45 in the subblock 42 in the FIFO output is outputted. For the output of the error location detection signal E4, the latch circuit 54 executes the latching operation in response to a trailing edge of the signal E4 and generates the corrected subblock detection signal E1 as a latch output to the formatter control processor 18. The formatter control processor 18 reads the corrected subblock detection signal E1 into a corrected subblock detecting register 72 in FIG. 5 at each of times t0, t1, and t3 when the subblock end signal E5 rises, thereby logging. With respect to times t0 and t1, since the error location detection signal E4 is not enabled and the latch output is not obtained, the formatter control processor 18 reads information indicative of no error. At time t3, it is recognized that the error location detection signal E4 is enabled with respect to the corresponding subblock by the reading of the latch output. Since the correctable errors exist in this subblock, it is possible to recognize that the subblock is the corrected subblock. The detection information of the corrected subblock read by the formatter control processor 18 is transferred as logging data by a request from the upper disk controller 12 and can be used as maintenance information or the like.

Referring again to FIG. 5, the erroneous correction subblock detecting section 56 comprises a counter 58, a rank encoder 60, and a comparator 62. The counter 58 counts the number of generating times of the error location detection signal E4 which is outputted from the ECC decoder 30 every subblock. Since the embodiment relates to an example of the correcting ability of the byte error of up to (n=3), the maximum number of generating times of the error location detection signal E4 which are counted by the counter 58 is equal to 3 per codeword. The rank encoder 60 detects the rank which is calculated by a hardware in the step of obtaining the coefficients $\beta_0$ to $\beta_2$ of the error location polynomial in the ECC decoder 30. When the number of errors counted by the counter differs from the number of errors counted by the rank encoder 60, the comparator 62 judges that the data is in the uncorrectable error state, so that the erroneous correction subblock detection signal E2 is stored into an erroneous correction subblock detecting register 74 of the formatter control processor 18, thereby logging.

The mathematical meaning of the error state which cannot be corrected in the ECC decoder 30 will now be described. In the ECC decoder 30, in the case where the error location polynomial having the coefficients $\beta_0$ to $\beta_2$ calculated from the syndromes $S_0$ to $S_5$ have $$(X \oplus \alpha^{L1})(X \oplus \alpha^{L2})$$

as factors, the error location polynomial is set to 0 at locations $L_1$ and $L_2$, so that the erroneous correction is performed. The output of the error location polynomial becomes an error location detection signal. Such an erroneous correction is detected by the following method. First, the coefficients of the error location polynomial are calculated from the syndromes $S_0$ to $S_5$. Now, assuming that the error locations are set to $i_1$, $i_2$, and $i_3$, the error location polynomial is $$(X \oplus \alpha^{i_1})(X \oplus \alpha^{i_2})(\oplus \alpha^{i_3}) = X^3 \oplus \beta_2 X^2 \oplus \beta_1 X \oplus \beta_0 \quad (1)$$

Now, assuming that the (n=3) correctable error patterns are set to $E_{i1}$, $E_{i2}$, and $E_{i3}$ and six syndromes are set to $S_0$, $S_1$, $S_2$, $S_3$, $S_4$, and $S_5$, they can be expressed as follows.

$$\begin{aligned}
S0 &= E_{i1} \oplus E_{i2} \oplus E_{i3} \\
S1 &= E_{i1}\alpha^{i_1} \oplus E_{i2}\alpha^{i_2} \oplus E_{i3}\alpha^{i_3} \\
S2 &= E_{i1}\alpha^{2*i_1} \oplus E_{i2}\alpha^{2*i_2} \oplus E_{i3}\alpha^{2*i_3} \\
S3 &= E_{i1}\alpha^{3*i_1} \oplus E_{i2}\alpha^{3*i_2} \oplus E_{i3}\alpha^{3*i_3} \\
S4 &= E_{i1}\alpha^{4*i_1} \oplus E_{i2}\alpha^{4*i_2} \oplus E_{i3}\alpha^{4*i_3} \\
S5 &= E_{i1}\alpha^{5*i_1} \oplus E_{i2}\alpha^{5*i_2} \oplus E_{i3}\alpha^{5*i_3}
\end{aligned} \quad (2)$$

By substituting $X=\alpha^i$ (where, $i=i_1, i_2, i_3$) into the polynomial (1), the following equation is obtained.

$$\alpha^{3*i} \oplus \beta_2 \alpha^{2*i} \oplus \beta_1 \alpha^i \oplus \beta_0 = 0 \quad (3)$$

By erasing the error patterns E and $\alpha$ from the equations (2) and (3), the following relational equations are obtained.

In the case where the number of errors=3, $$\begin{bmatrix} S0 & S1 & S2 \\ S1 & S2 & S3 \\ S2 & S3 & S4 \end{bmatrix} \begin{bmatrix} \beta_0 \\ \beta_1 \\ \beta_2 \end{bmatrix} = \begin{bmatrix} S3 \\ S4 \\ S5 \end{bmatrix} \quad (4)$$

$$\begin{aligned}
ELP &= (X + \alpha^{i_1})(X + \alpha^{i_2})(X + \alpha^{i_3}) \\
&= X^3 + \beta_2 X^2 + \beta_1 X1 + \beta_0
\end{aligned}$$

where, ELP denotes an error location polynomial.
In the case where the number of errors=2, $$\begin{bmatrix} S0 & S1 \\ S1 & S2 \end{bmatrix} \begin{bmatrix} \beta_0 \\ \beta_1 \end{bmatrix} = \begin{bmatrix} S3 \\ S4 \end{bmatrix} \quad (5)$$

$$\begin{aligned}
ELP &= (X \oplus \alpha^{i_1})(X \oplus \alpha^{i_2}) \\
&= X^2 \oplus \beta_1 X \oplus \beta_0
\end{aligned}$$

In the case where the number of errors=1, $$\begin{aligned}
\beta_0 &= S_1/S_0 \\
ELP &= X \oplus (S1/S0) = X \oplus \alpha^i
\end{aligned} \quad (6)$$

The number of errors is decided by the rank of the matrix of the left side in each of the equations (4) to (6). The rank encoder 60 provided for the erroneous correction subblock detecting section 56 in FIG. 5 decodes the error location polynomial of the ECC decoder 30, namely, the rank of the matrix of the left side in each of the equations (4) and (5), thereby detecting the number of errors. The number of errors obtained from the rank encoder 60 on the basis of the rank of the matrix and the number of times at which the error location detection signal counted by the counter 58 is enabled are compared by the comparator 62. When both of them different, the erroneous correction is detected and the erroneous correction subblock detection signal E2 is generated. There is a possibility such that the difference between the numbers of errors by the counter 58 and the rank encoder 60 occurs when the errors of the number exceeding the correcting ability of the ECC decoder 30 are generated. On the other hand, when the numbers of errors by the counter 58 and the rank encoder 60 coincide or when the errors are not detected, the erroneous correction cannot be detected by the uncorrectable subblock detecting section 56 and the subblock cannot be specified. In this case, instead of the detection of the uncorrectable errors of the subblock, by performing the error detection using the error detection code EDC in the EDC decoder 40 based on the corrected clear data outputted from the EX-OR circuit 34, subblock is specified.

The abnormal operation monitoring section 64 comprises OR circuits 66 and 68 and the EX-OR circuit 70. The six syndromes $S_0$ to $S_5$ from the ECC decoder 30 are inputted in parallel to the OR circuit 66. The OR of all of the 48 bits is calculated, thereby detecting the non-zero syndromes. That is, the presence of the errors is detected by the non-zero of the syndromes. The syndromes $S_0$ to $S_5$ is generated simultaneously with the output from the FIFO buffer memory 32. The corrected subblock detection signal E1 from the corrected subblock detecting section 52 and an uncorrectable subblock detection signal E20 which is outputted synchronously with the FIFO output from the ECC decoder 30 are inputted to the OR circuit 68. The EX-OR circuit 70 gets the exclusive OR of outputs of the OR circuits 66 and 68 and supplies it as an abnormal operation detection signal E3 to an abnormal operation detecting register 76 of the formatter control processor 18. In the abnormal operation monitoring section 64, when at least the conditions shown in the following table are satisfied on the basis of the correctable error detection result E1, the uncorrectable error detection result E20, and a syndrome non-zero detection result E6, the abnormal operation detection signal E3 which is outputted from the EX-OR circuit 70 is enabled.

| Correctable error E1 | Uncorrectable error E20 | Syndrome non-zero E5 | Abnormal operation E3 |
|---|---|---|---|
| 1 | 0 | 0 | 1 |
| 0 | 1 | 0 | 1 |
| 1 | 0 | 1 | 0 |
| 0 | 1 | 1 | 0 |
| 0 | 0 | 0 | 0 |
| 0 | 0 | 1 | 1 |

Further, the status detecting section 46 is provided for the ECC decoder 30. An error correction detection signal E10 decided by the ECC decoder 30 is inputted to the status detecting section 46 and is outputted as it is to a status reporting register 75 of the formatter control processor 18 as a status detection signal E13 indicative of the presence of the correctable errors. An uncorrectable error detection signal E11 decided by the ECC decoder 30 is inputted and is outputted as it is to the status reporting register 75 of the formatter control processor 18 as a status detection signal E14 indicative of the presence of the uncorrectable errors. Further, an NOR circuit 50 is provided for the status detecting section 46. In the case where both of the detection signals E1 and E2 are not obtained, the status detection signal E12 indicative of no error is outputted from the NOR circuit 50.

The formatter control processor 18 monitors the end of reading operation of the corrected user data which is transferred from the error correcting section 16 and reads the status detection signals E12, E13, and E14 indicative of the state having no error, the state having correctable errors, and the state having the uncorrectable errors at the timing just after completion of the reading operation and stores into the status reporting register 75. In response to the status command from the upper disk controller 12, the formatter control processor 18 returns a status response indicative of the error correcting state at the time of the reading operation according to the contents of the status reporting register 75. Therefore, the status reporting register 75 of the formatter control processor 18 has the function as status reporting means.

[ECC decoder]

Figure 7:
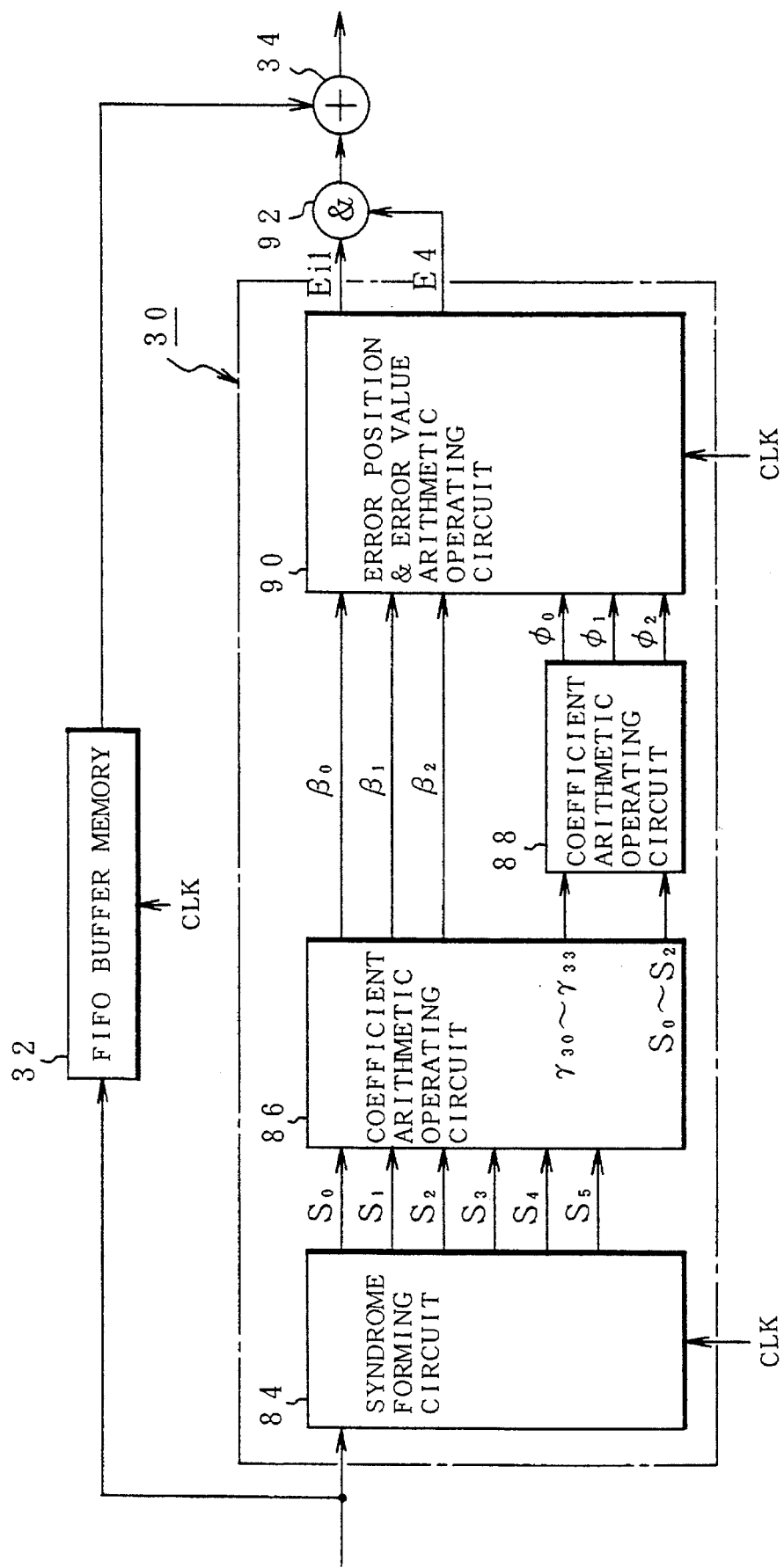
FIG. 7 is a block diagram of an error correction code decoding circuit in FIG. 5.

FIG. 7 shows the details of the ECC decoder 30 in FIG. 3. The ECC encoder 30 comprises a syndrome forming circuit 84, coefficient arithmetic operating circuits 86 and 88, and error location and error value arithmetic operating circuit 90. In case of the up to three byte error correction, the syndrome forming circuit 84 calculates the six syndromes $S_0$ to $S_5$ from the codeword and outputs them. A method of calculating the syndromes $S_0$ to $S_5$ is well known and is realized by, for example, using an exclusive OR (EX-OR) circuit, an OR circuit, and a shift register. The coefficient arithmetic operating circuit 86 receives the syndromes $S_0$ to $S_5$ and calculates the coefficients $\beta_0$ to $\beta_2$ of the following error location polynomial which is shown again below.

$$(X \oplus \alpha^{i1})(X \oplus \alpha^{i2})(X \oplus \alpha^{i3}) = X^3 \oplus \beta_2 X^2 \oplus \beta_1 X \oplus \beta_0$$

As will be obviously understood later, the coefficient arithmetic operating circuit 86 of the present invention has a novel circuit construction which can remarkably reduce a circuit amount as compared with the conventional hardware. The following coefficient arithmetic operating circuit 88 receives values $\gamma_{30}$ to $\gamma_{33}$ derived in the step of obtaining the coefficients of the error location polynomial from the coefficient arithmetic operating circuit 86 as solutions $\beta_0$, $\beta_1$, and $\beta_2$ of the simultaneous equations of (n) unknown and syndromes $S_0$, $S_1$, and $S_2$, thereby calculating coefficients $\Phi_0$, $\Phi_1$, and $\Phi_2$ to obtain the error value. The calculation of $\gamma_{30}$ to $\gamma_{33}$ will be obviously explained hereinlater. The coefficients $\Phi_0$ to $\Phi_2$ to obtain the error value are calculated by the following equations.

$$\Phi_0 = \gamma 0 \, S_0 \qquad (7)$$
$$\Phi_1 = \gamma 2 \, S_1 \oplus \gamma 3 \, S_2$$
$$\Phi_2 = \gamma 3 \, S_1$$

where, $\gamma_0$ to $\gamma_3$ have the following values for the number (t) of errors (t=1 to 3).

| | | |
|---|---|---|
| $\gamma_3$: | t = 3 | $\gamma_{33}$ |
| | t = 2 or less | 0 |
| $\gamma_2$: | t = 3 | $\gamma_{32}$ |
| | t = 2 | $\gamma_{22}$ |
| | t = 1 | 0 |
| $\gamma_1$: | t = 3 | $\gamma_{31}$ |
| | t = 2 | $\gamma_{21}$ |
| | t = 1 | $\gamma_{11}$ |
| $\gamma_0$: | t = 3 | $\gamma_{30}$ |
| | t = 2 | $\gamma_{20}$ |
| | t = 1 | $\gamma_{10}$ |

Figure 13:
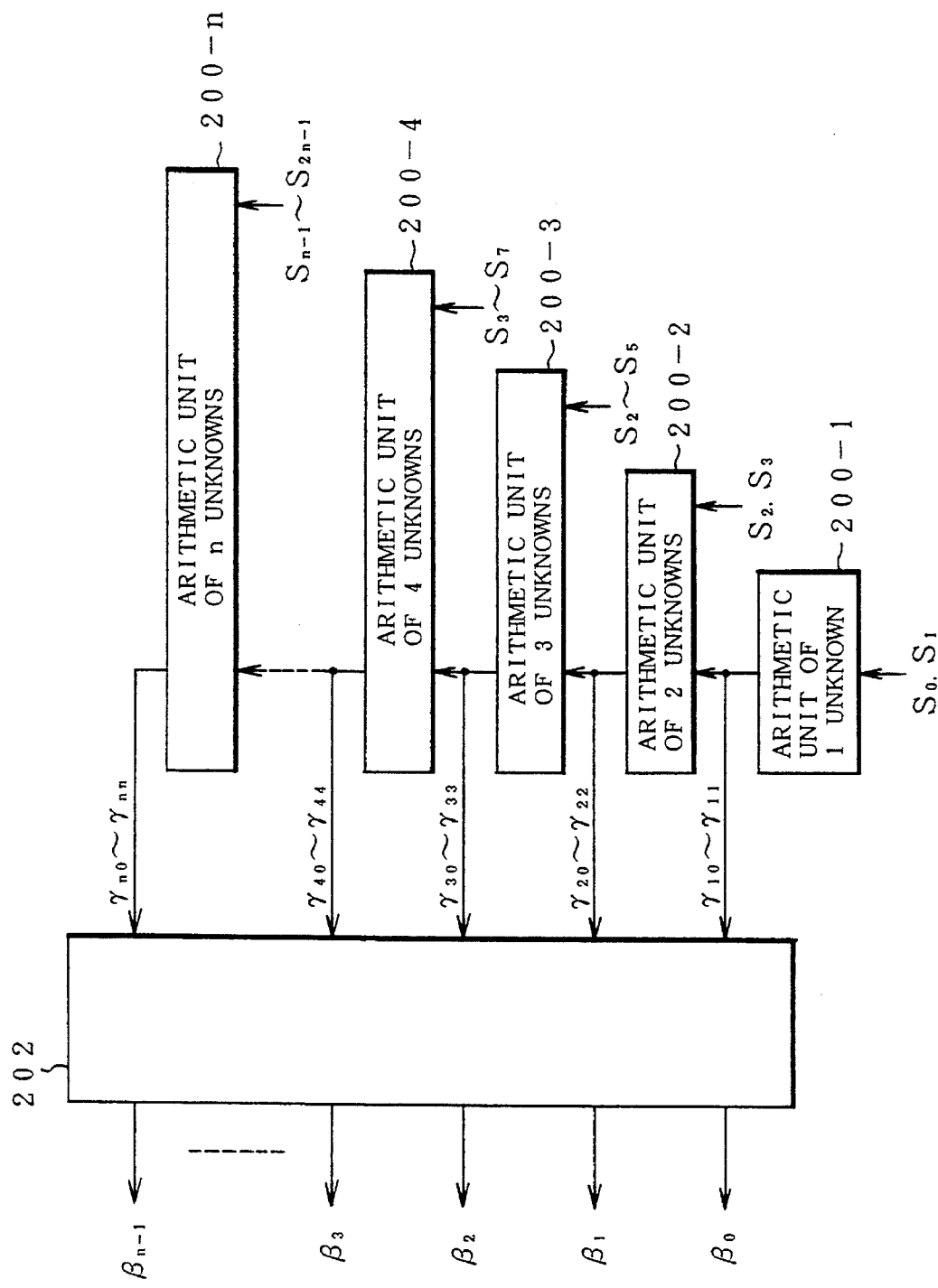
FIG. 13 is a block diagram of a coefficient arithmetic operating circuit in FIG. 7.

A process to obtain $\gamma_0$ to $\gamma_3$ with respect to the number (t) of errors (t=1 to 3) is an arithmetic operation of a coefficient selection arithmetic operation unit 202 in FIG. 13, which will be obviously explained hereinlater. The error location & error value arithmetic operating circuit 90 provided at the final stage executes a chain search like a trial and error for discrimination about the actual error location and error pattern in a state in which the error location coefficients $\beta_0$ to $\beta 2$ and error value coefficients $\Phi_0$ to $\Phi_2$ are obtained. The error location detection signal E4 is supplied to an AND circuit 92 at a timing of the calculated error location, thereby setting it into a permitting state. At the same time, the error pattern vector Ei1 obtained is outputted for the correcting operation. The error pattern vector Ei1 is given to the EX-OR circuit 34 through the AND circuit 92. The exclusive OR of the error pattern vector Ei1 and the byte data of the error location outputted from the FIFO buffer memory 32 at the same timing is calculated by the EX-OR circuit 34, thereby performing the correction to invert the error bits. A hardware construction of the error location & error value arithmetic operating circuit 90 is disclosed in detail in, for example, U.S. Pat. No. 4,494,234.

[Monitor of non-detection and erroneous correction using EDC check bytes]

In the embodiment of FIG. 2, the EDC encoder 38 is provided for the writing system and the EDC decoder 40 is provided for the reading system. The EDC encoder 38 and EDC decoder 40 monitor the non-detection and erroneous correction of the errors in the ECC decoder 30 by using the newly produced error detection code (EDC). In the ECC decoder 30 in FIG. 7, check bytes and syndromes are produced by the generator polynomial, the error location and error value are produced by the error location polynomial, and the error correction is executed while performing the data transfer of the on-the-fly type. When errors exceeding the correcting ability occur, however, there is a case where the erroneous correction such that the correct byte data is erroneously corrected or the non-detection such that the errors cannot be detected occurs. Generally speaking, assuming that the generator polynomial is set to G(X) and the error location polynomial is set to E(X), when errors such that $$E(X)=P(X)*G(X) \quad (8)$$

where, P(X) is an arbitrary function occur, the syndromes are set to zero and the non-detection occurs. On the other hand, when explaining about the case of the error correction of, for example, (n=3) bytes, in the case where the error correction such that the error location polynomial having the values calculated from the syndromes as coefficients have $$(X \oplus \alpha^{i_1}), (X \oplus \alpha^{i_2}), (X \oplus \alpha^{i_3})$$

as factors, the error location polynomial is equal to zero at the locations $i_1$, $i_2$, and $i_3$ and the erroneous correction is executed. However, $i_1$, $i_2$, and $i_3$ are different from the inherent error locations.

Figure 8:
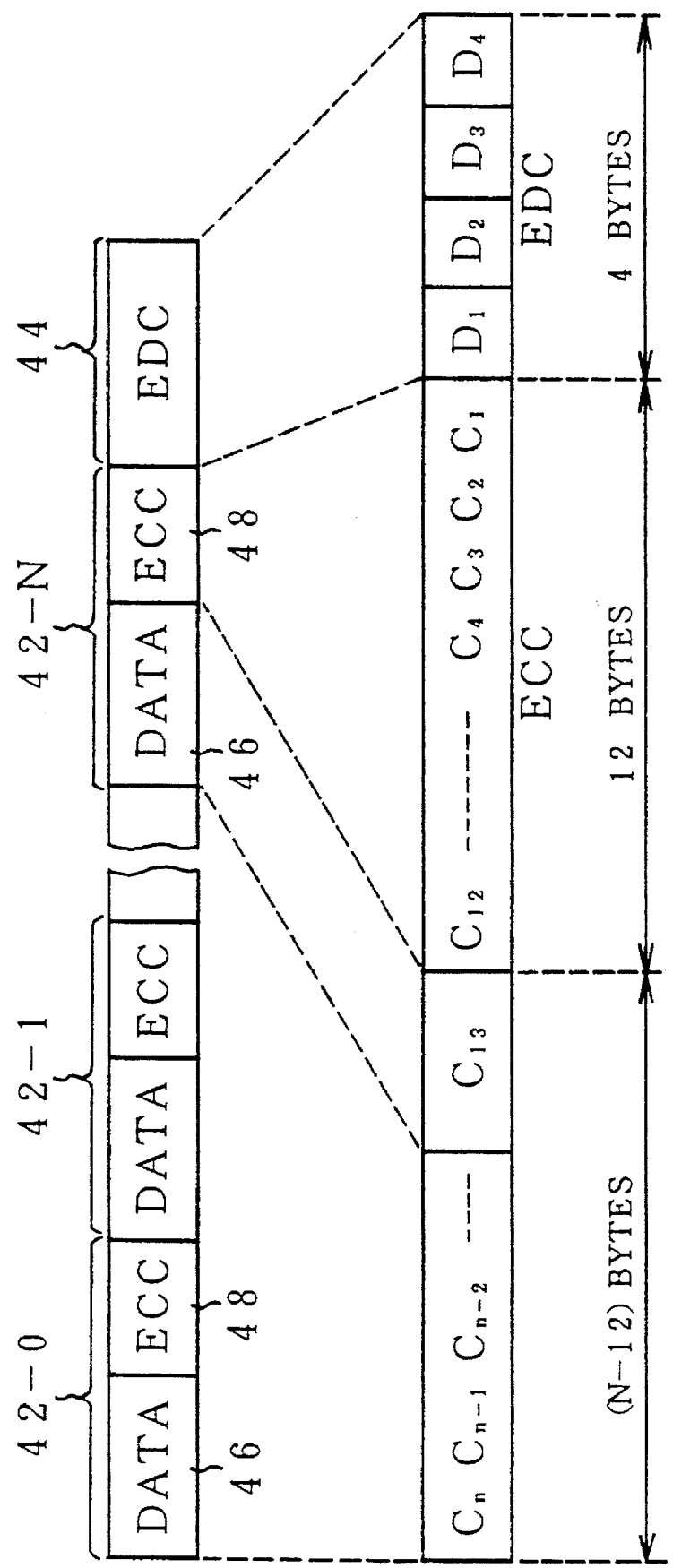
FIG. 8 is an explanatory diagram of a format of EDC bytes of the invention.

In order to detect such non-detection and erroneous correction in such an ECC decoder, the EDC check bytes 44 of a few bytes are provided after the user data comprising an arbitrary number of subblocks 42-0 to 42-N as shown in FIG. 8. The embodiment relates to the case where the EDC check bytes 44 are constructed by four check bytes D1, D2, D3, and D4 as an example. Each of the subblocks 42-0 to 42-N is the user data which is constructed by the data section and ECC check bytes and is outputted from the ECC encoder 22. The user data is handled as a continuous byte stream of character bytes $C_n$ to $C_1$ to produce the EDC check bytes D1 to D4. The EDC encoder 38 in FIG. 2 produces the EDC check bytes D1, D2, D3, and D4 from the write user data having an arbitrary number of subblocks in parallel with the formation of the error correction codes by the ECC encoder 22 and adds the EDC check bytes D1, D2, D3, and D4 after the user data which is outputted from the ECC encoder 22 by the mode switching of the multiplexer 24 in FIG. 2, thereby forming four error correction codes. On the other hand, the EDC decoder 40 outputs the user data corrected by the ECC decoder 30 which is outputted from the EX-OR circuit 34 and the EDC check bytes D1, D2, D3, and D4 to the upper disk controller 12 through a gate 34 and also receives them, thereby detecting the non-detection and erroneous correction in the ECC decoder 30.

The formation of the EDC check bytes D1 to D4 in the EDC encoder 38 is executed by the following primary polynomial in a manner such that the code word lengths are different.

| D1: | $X \oplus \alpha^{-1}$ | (9) |
| D2: | $X \oplus \alpha^{-2}$ | |
| D3: | $X \oplus \alpha^{-3}$ | |
| D4: | $X \oplus \alpha^{-4}$ | |

By adding the EDC check bytes D1 to D4 formed by such a primary polynomial so as to make the code word lengths different after the user data, a strong error detection code can be constructed. As exponents of a constant term $\alpha$ in the primary polynomial of the equations (11), by using different exponents for the EDC check bytes D1 to D4, the values can be arbitrarily determined. Although the calculation target areas of the EDC check bytes D1 to D4 correspond to the data section and ECC check bytes in each error correction code included in the character bytes $C_n$ to $C_1$ constructing the data section, since it is sufficient that the data section is guaranteed, the ECC check bytes are assumed to 0 and the calculation is performed. Further, since the exponent of the elements of the Galois field GF ($2^8$) is calculated by a modulus MOD 255, it has a period of 255 character bytes. Therefore, when the same error pattern exists at a location which is away by 254 bytes on the stream of the byte data, the errors are extinguished and cannot be detected by the error correction code. The above relation is shown by the following equation.

$$E1\alpha^{256 \; MOD \; 255} \oplus E1\alpha^1 = E1\alpha^1 \oplus E1\alpha^1 = 0 \quad (10)$$

To prevent the extinction of the errors when the equation (10) is satisfied, with respect to the calculation of the half of the EDC check bytes D1 to D4 of the error detection code, a few bytes of the ECC check byte section are eliminated from the calculation target areas. For example, in the case where one byte of the ECC check bytes is eliminated with respect to the two EDC check bytes D2 and D4, the EDC check bytes D1 to D4 are calculated as shown by the following equations.

$$D_1 = C_n \alpha^{-n} \oplus \ldots \oplus C_5 \alpha^{-5} \oplus C4 \alpha^{-4} \oplus C_3 \alpha^{-3} \oplus C_2 \alpha^{-2} \oplus C_1 \alpha^{-1} \quad (11)$$
$$D_2 = C_n \alpha^{-j} \oplus \ldots \oplus C_5 \alpha^{-10} \oplus C_4 \alpha^{-8} \oplus C_3 \alpha^{-6} \oplus C_2 \alpha^{-4}$$
$$D_3 = C_n \alpha^{-3(n+2)} \oplus \ldots \oplus C_5 \alpha^{-21} \oplus C_4 \alpha^{-18} \oplus C_3 \alpha^{-15} \oplus C_2 \alpha^{-12} \oplus C_1 \alpha^{-9}$$
$$D_4 = C_n \alpha^{-k} \oplus \ldots \oplus C_5 \alpha^{-28} \oplus C_4 \alpha^{-24} \oplus C_3 \alpha^{-20} \oplus C_2 \alpha^{-16}$$

where, (j) and (k) in the equations (11) are determined by the number of subblocks.

Figure 9:
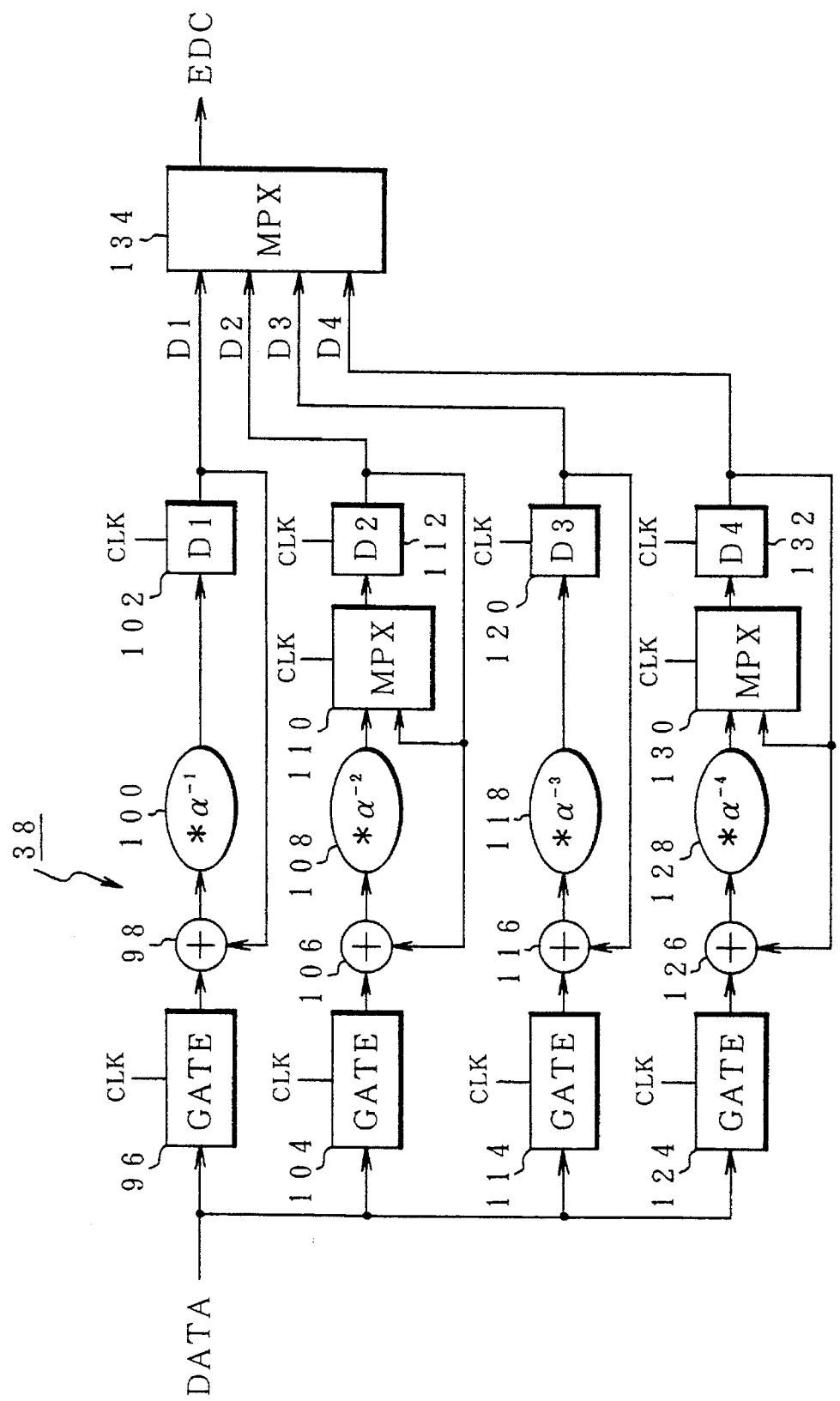
FIG. 9 is a circuit block diagram of an EDC encoder on the writing side in FIG. 2.

FIG. 9 shows an embodiment of the EDC encoder 38 in FIG. 2. A gate 96 receives the error corrected user data and the EDC check bytes D1 to D4. Gate circuits 96, 104, 114, and 124 are controlled by gate signals indicative of the locations of the data section and ECC section of the subblock constructing one error correction code and, further, the last EDC check byte location of the error detection code. At the input timing of the data section in each subblock, the gate signal is enabled, thereby inputting the data. At the input timing of the ECC check bytes, the gate signal is disenabled, thereby setting the ECC check bytes to 0 and inputting. With respect to the last EDC check byte section, the gate signal is enabled, thereby inputting the EDC check bytes D1 to D4. At the time of the encode input, all of the EDC check bytes D1 to D4 are empty bytes and are equal to 0.

After the gate circuits 96, 104, 114, and 124, logic circuits of four systems are provided in correspondence to the four EDC check bytes D1, D2, D3, and D4 which are added to the last of the error detection code. For example, the system of the check byte D1 comprises: an exclusive OR circuit (EX-OR circuit) 98, a multiplying circuit 100 to perform a multiplication of a constant $\alpha^{-1}$, and a latch circuit 102 for latching a multiplication output by a time of one byte clock and for outputting. With respect to the other three check bytes D2, D3, and D4, a circuit construction of each system has an EX-OR circuit, a multiplying circuit, and a latch circuit. As shown in the equations (11), with respect to the EDC check bytes D2 and D4, since one byte of the ECC check bytes is eliminated, multiplexers 110 and 130 are provided between multiplying circuits 108 and 128 and latch circuits 112 and 132, respectively. Switching signals are supplied to the multiplexers 110 and 130 at the locations of the bytes to be eliminated from the ECC check bytes. When the switching signals are inputted, the multiplexers 110 and 130 are switched from outputs of the multiplying circuits 108 and 128 to feedback outputs of the latch circuits 112 and 132, thereby eliminating one byte in the ECC check bytes from the calculation target. A multiplexer 134 provided at the final stage selects the outputs of the latch circuits 102, 112, 120, and 132 by byte clocks synchronized with the transfer timings of the EDC check bytes D1, D2, D3, and D4 after the user data and sequentially outputs calculated EDC check digits D1, D2, D3, and D4. Output timings of the EDC check digits D1, D2, D3, and D4 are set to the last position of the user data by the ECC encoder 22 in FIG. 2. Those EDC check digits are added when the multiplexer 24 is switched from the ECC encoder 24 to the EDC encoder 38 side.

Figure 10:
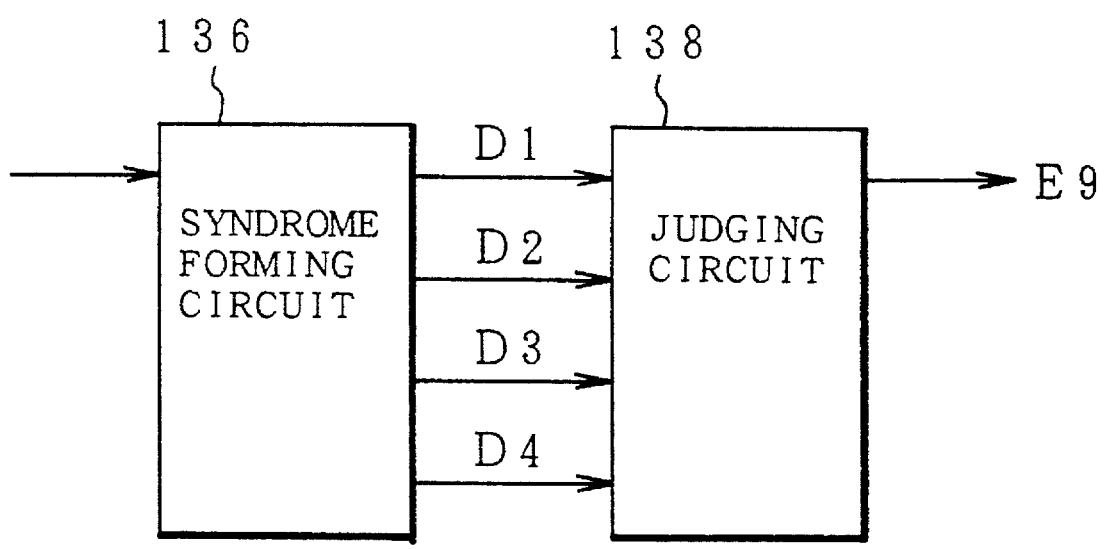
FIG. 10 is a circuit block diagram of an EDC decoder on the reading side in FIG. 2.
Figure 11:
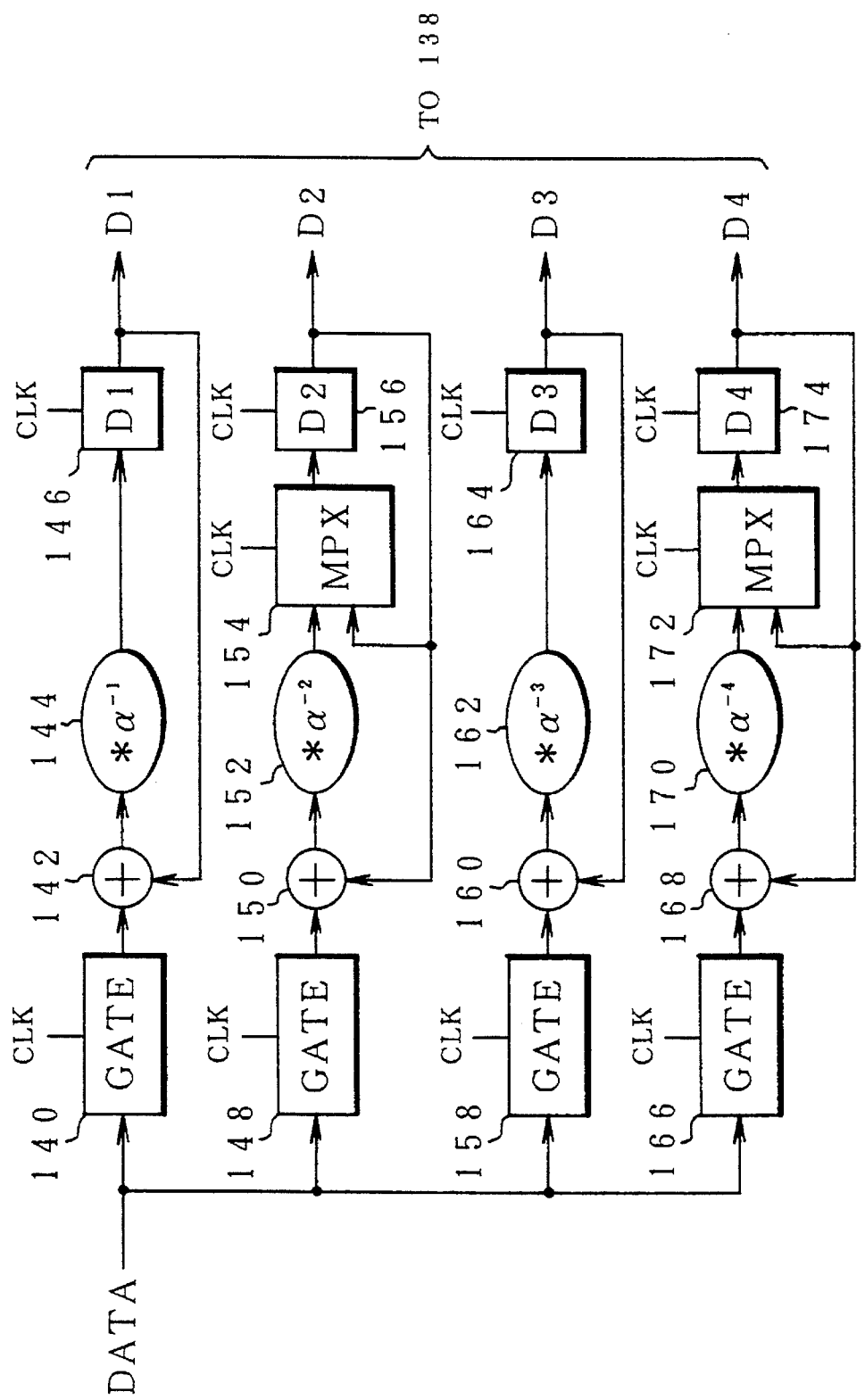
FIG. 11 is a circuit block diagram of a syndrome forming circuit in FIG. 10.

FIG. 10 shows an embodiment of the EDC decoder 40 in FIG. 2. The EDC decoder 40 has a syndrome forming circuit 136 and a judging circuit 138. The syndrome forming circuit 136 has a circuit construction shown in FIG. 11. The syndrome forming circuit 136 on the decoder side in FIG. 11 is fundamentally the same as that on the encoder side shown in FIG. 9 and calculates syndrome bytes $SD_1$, $SD_2$, $SD_3$, and $SD_4$ from the error corrected user data and EDC check bytes D1 to D4.

Figure 12:
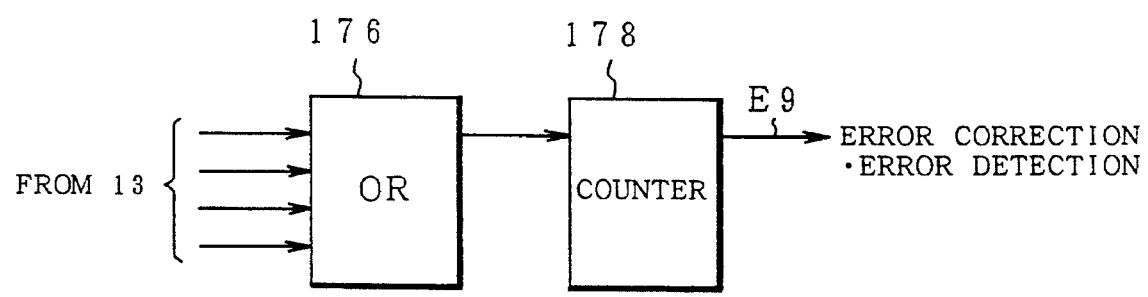
FIG. 12 is a circuit block diagram of a judging circuit in FIG. 10.

The judging circuit 138 in FIG. 10 has a construction of FIG. 12. The judging circuit 138 has a counter 178 and an OR circuit 176 which receives the syndrome bytes $SD_1$ to $SD_4$ from latch circuits 146, 156, 164, and 174 in FIG. 11. The OR circuit 176 detects whether the syndrome bytes $SD_1$, $SD_2$, $SD_3$, and $SD_4$ calculated from the error corrected user data and EDC check bytes D1, D2, D3, and D4 by using the primary polynomial of the equations (11) are non-zero or not. Namely, when either one of the syndrome bytes $SD_1$ to $SD_4$ is equal to non-zero, an output of the OR circuit 176 is set to 1. When all of them are set to zero, the output of the OR circuit 176 is set to 0. The counter 178 counts the number of non-zero syndrome registers from the OR circuit 176, thereby judging the erroneous correction and non-detection in the ECC decoder 30. Specifically speaking, when two or more syndrome non-zero data outputs are counted by the counter 178, it is judged that the erroneous correction or non-detection occurs in the error correction. An abnormal operation detection signal E9 is outputted to the upper formatter control processor 18. On the other hand, when the count value of the syndrome non-zero data of the counter 178 is equal to 1 or less, it is regarded that there is an error by a medium defect of the EDC check byte section in the memory medium. Therefore, when the count value of the counter 178 is equal to 1 or less, namely, with respect to the value of the syndrome register of one byte or less, the occurrence of the erroneous correction and non-detection by the error correction is not recognized.

[Arithmetic operating circuit of simultaneous equations of (n) unknowns]

FIG. 13 is a diagram showing an arithmetic operating circuit of simultaneous equations of (n) unknowns which is used in the coefficient arithmetic operating circuit 86 in FIG. 7. The embodiment relates to the case having the correcting ability of (t=n) byte errors. There are provided an arithmetic unit of one unknown 200-1, an arithmetic unit of two unknowns 200-2, an arithmetic unit of three unknowns 200-3, an arithmetic unit of four unknowns 200-4, . . . , an arithmetic unit of (n) unknowns 200-n.

Figure 14:
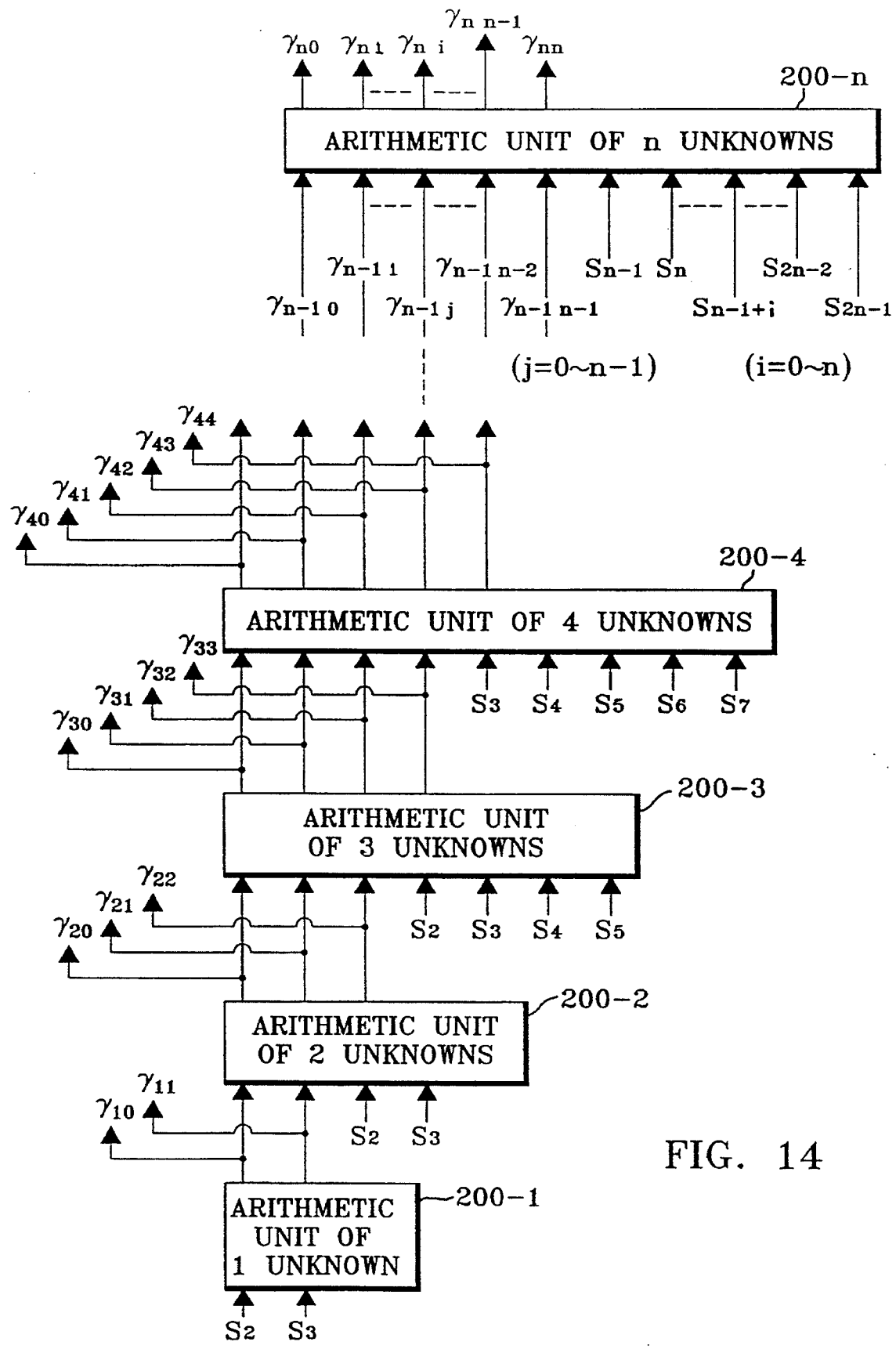
FIG. 14 is a block diagram showing in detail inputs and outputs of arithmetic units of one to (n) unknowns in FIG. 13.

In FIG. 14, the arithmetic unit of one unknown 200-1 receives the syndromes $S_0$ and $S_1$ and outputs solutions $\gamma_{10}$ and $\gamma_{11}$. The arithmetic unit of two unknowns 200-2 receives the outputs $\gamma_{10}$ and $\gamma_{11}$ of the arithmetic unit of one unknown 200-1 and the syndromes $S_2$ and $S_3$ and obtains solutions $\gamma_{20}$, $\gamma_{21}$, and $\gamma_{22}$ from the simultaneous equations of two unknowns and outputs them. The arithmetic unit of three unknowns 200-3 receives the outputs $\gamma_{20}$, $\gamma_{21}$, and $\gamma_{22}$ of the arithmetic unit of two unknowns 200-2 and the syndromes $S_2$ to $S_5$ and obtains solutions $\gamma_{30}$, $\gamma_{31}$, $\gamma_{32}$, and $\gamma_{33}$ from the simultaneous equations of three unknowns and outputs them. The arithmetic unit of four unknowns 200-4 receives the outputs $\gamma_{30}$, $\gamma_{31}$, $\gamma_{32}$, and $\gamma_{33}$ of the arithmetic unit of three unknowns 200-3 and the syndromes $S_3$ to $S_7$ and obtains solutions $\gamma_{40}$, $\gamma_{41}$, $\gamma_{42}$, $\gamma_{43}$, and $\gamma_{44}$ from the simultaneous equations of three unknowns and outputs them. Further, the arithmetic unit of (n) unknowns 200-n receives outputs $\gamma_{n-1\,0}$ to $\gamma_{n-1\,n-1}$ of an arithmetic unit of (n–1) unknowns 200-(n–1) (not shown) and the syndromes $S_{n-1}$ to $S_{2n-1}$ and obtains solutions $\gamma_{n0}$ to $\gamma_{nn}$ from the simultaneous equations of (n) unknowns and outputs them. In case of the correcting ability of the (t=3) byte error in FIG. 7, it is sufficient to use only the circuit section 202 shown by a broken line including the arithmetic unit of one unknown 200-1, arithmetic unit of two unknowns 200-2, and arithmetic unit of three unknowns 200-3.

In FIG. 13, the outputs of the arithmetic unit of one unknown 200-1, arithmetic unit of two unknowns 200-2, arithmetic unit of three unknowns 200-3, arithmetic unit of four unknowns 200-4, . . . , and arithmetic unit of (n) unknowns 200-n are supplied to the coefficient selection arithmetic unit 202 and the coefficients $\beta_k$ of the error location polynomial, namely, $\beta_0$ to $\beta_{t-1}$ are obtained.

A general equation of the coefficients $\beta_k$ is as follows.

$$\beta_k = \gamma_{nk}/\gamma_{nn}$$

where, k=0 to n–1

When considering the cases of (t=1, 2, 3) byte errors as an example, the following table is obtained.

|       | $\beta_0$ | $\beta_1$ | $\beta_2$ |
|-------|-----------|-----------|-----------|
| t = 1 | $\gamma_{10}/\gamma_{11}$ | — | — |
| t = 2 | $\gamma_{20}/\gamma_{22}$ | $\gamma_{21}/\gamma_{22}$ | — |
| t = 3 | $\gamma_{30}/\gamma_{33}$ | $\gamma_{31}/\gamma_{33}$ | $\gamma_{32}/\gamma_{33}$ |

That is, in the actual circuit, for example, when considering the case of (t=3) byte error, $\gamma$ is used in the form of $$\gamma_{33}X_3 \oplus \gamma_{32}X^2 \oplus \gamma_{31}X \oplus \gamma_{30} = 0$$

instead of the form of $$X_3 \oplus \beta_2 X^2 \oplus \beta_1 X \oplus \beta_0 = 0$$

Similarly, with respect to the (t=2) byte error, $$\gamma_{22}X^2 \oplus \gamma_{21}X \oplus \gamma_{20} = 0$$

and with regard to the (t=1) byte error, $$\gamma_{11}X \oplus \gamma_{10} = 0$$

Figure 15:
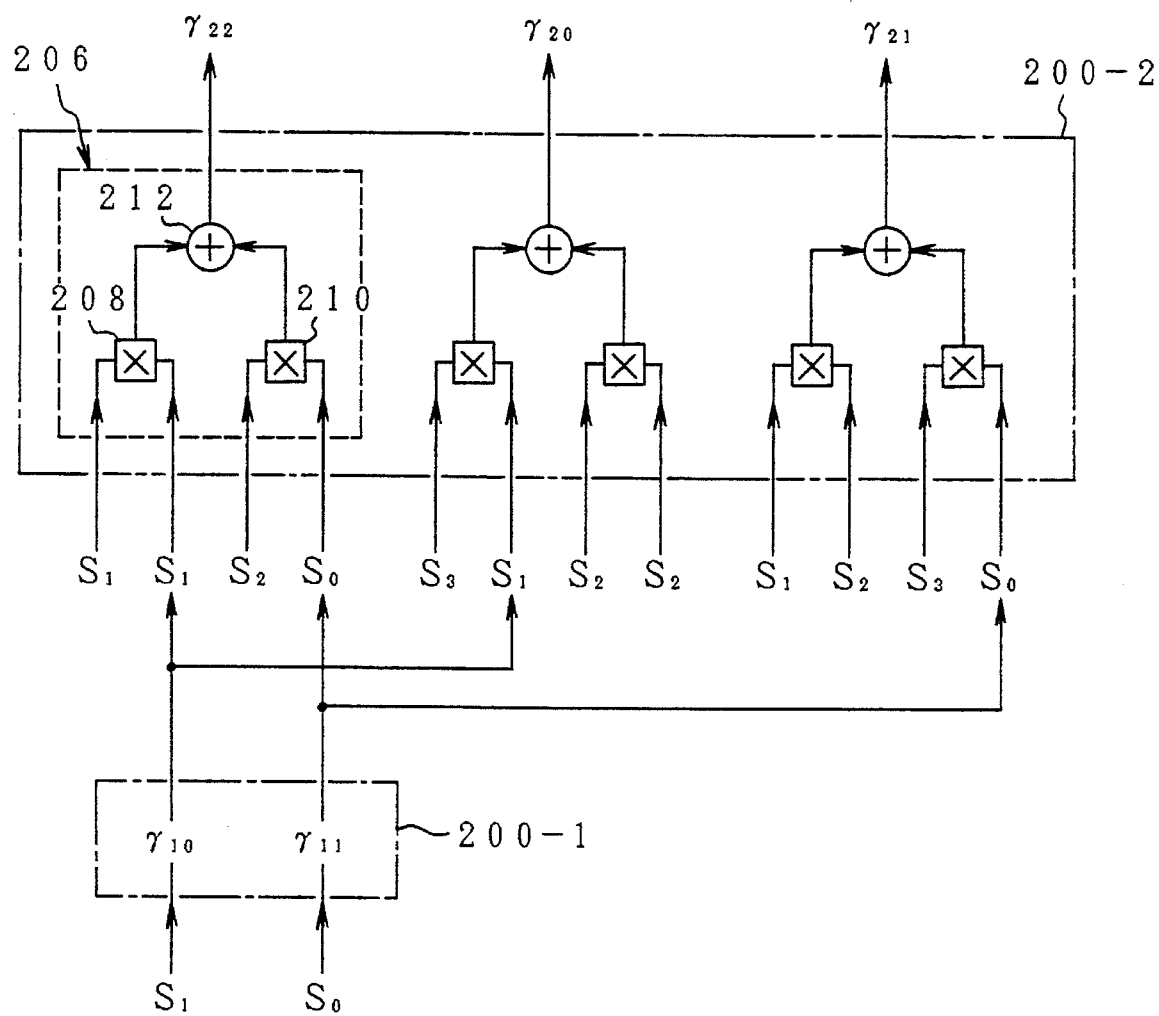
FIG. 15 is a circuit diagram of an arithmetic unit of one unknown and an arithmetic unit of two unknowns in FIG. 13.

FIG. 15 shows in detail the arithmetic unit of one unknown 200-1 and the arithmetic unit of two unknowns 200-2 in FIGS. 13 and 14. The arithmetic unit of one unknown 200-1 doesn't have any arithmetic element and outputs the inputted syndromes $S_0$ and $S_1$ as solutions $\gamma_{10}$ and $\gamma_{11}$ of the simultaneous equations of one unknown as they are. A fundamental circuit 206 surrounded by a broken line is provided for the arithmetic unit of two unknowns 200-2. The circuit 206 comprises multiplying circuits 208 and 210 and an exclusive OR circuit 212. The multiplying circuits 208 and 210 execute multiplications of two 8-bit binary vectors in the Galois field GF ($2^8$) and are respectively constructed by 71 EX-OR gates and 64 AND gates. The EX-OR circuit 212 obtains the exclusive OR of every bit by using eight 2-input EX-OR gates.

Figure 16:
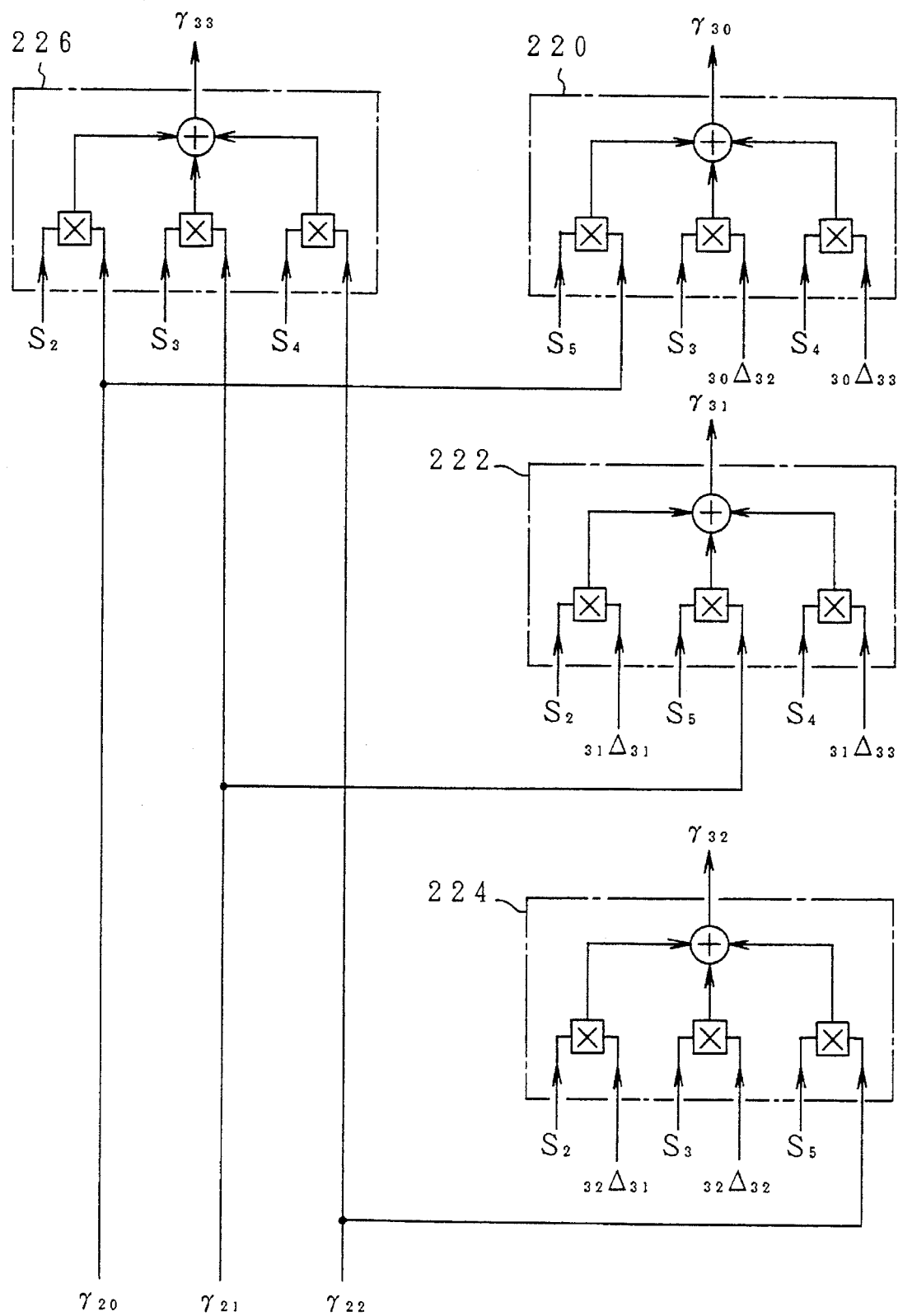
FIG. 16 is a circuit diagram of an arithmetic unit of three unknowns in FIG. 13.

FIG. 16 shows an embodiment of the arithmetic unit of three unknowns 200-3 in FIGS. 13 and 14. The arithmetic unit of three unknowns 200-3 is fundamentally constructed by four logic circuits 220, 222, 224, and 226. Each of the logic circuits 220, 222, 224, and 226 comprises three multiplying circuits and one EX-OR circuit.

Figure 17:
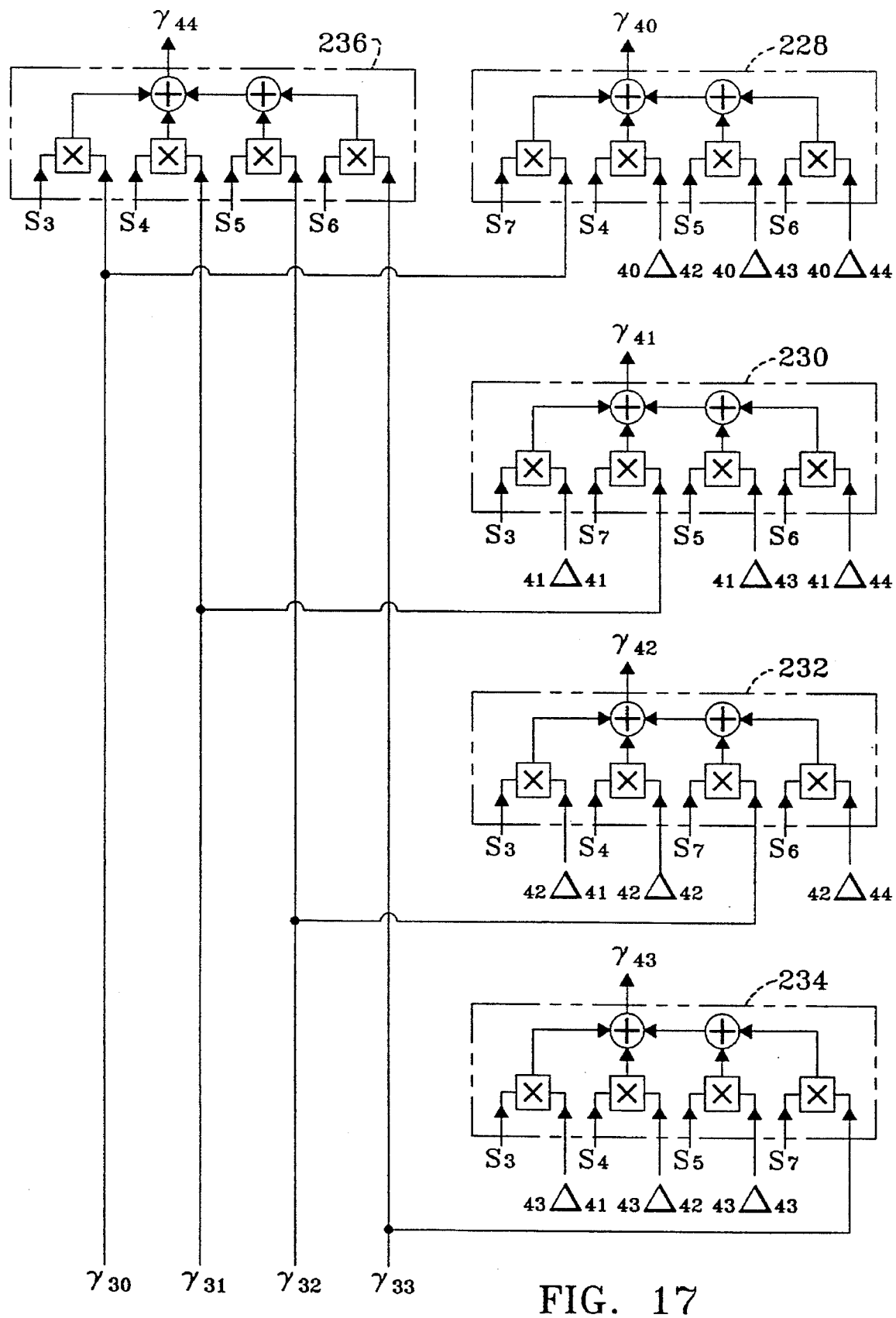
FIG. 17 is a circuit diagram of an arithmetic unit of four unknowns in FIG. 13.

FIG. 17 shows an embodiment of the arithmetic unit of four unknowns 200-4 in FIGS. 13 and 14. The arithmetic unit of four unknowns 200-4 comprises fundamental five logic circuits 228, 230, 232, 234, and 236. Each logic circuit comprises four multiplying circuits and two EX-OR circuits.

Figure 18B:
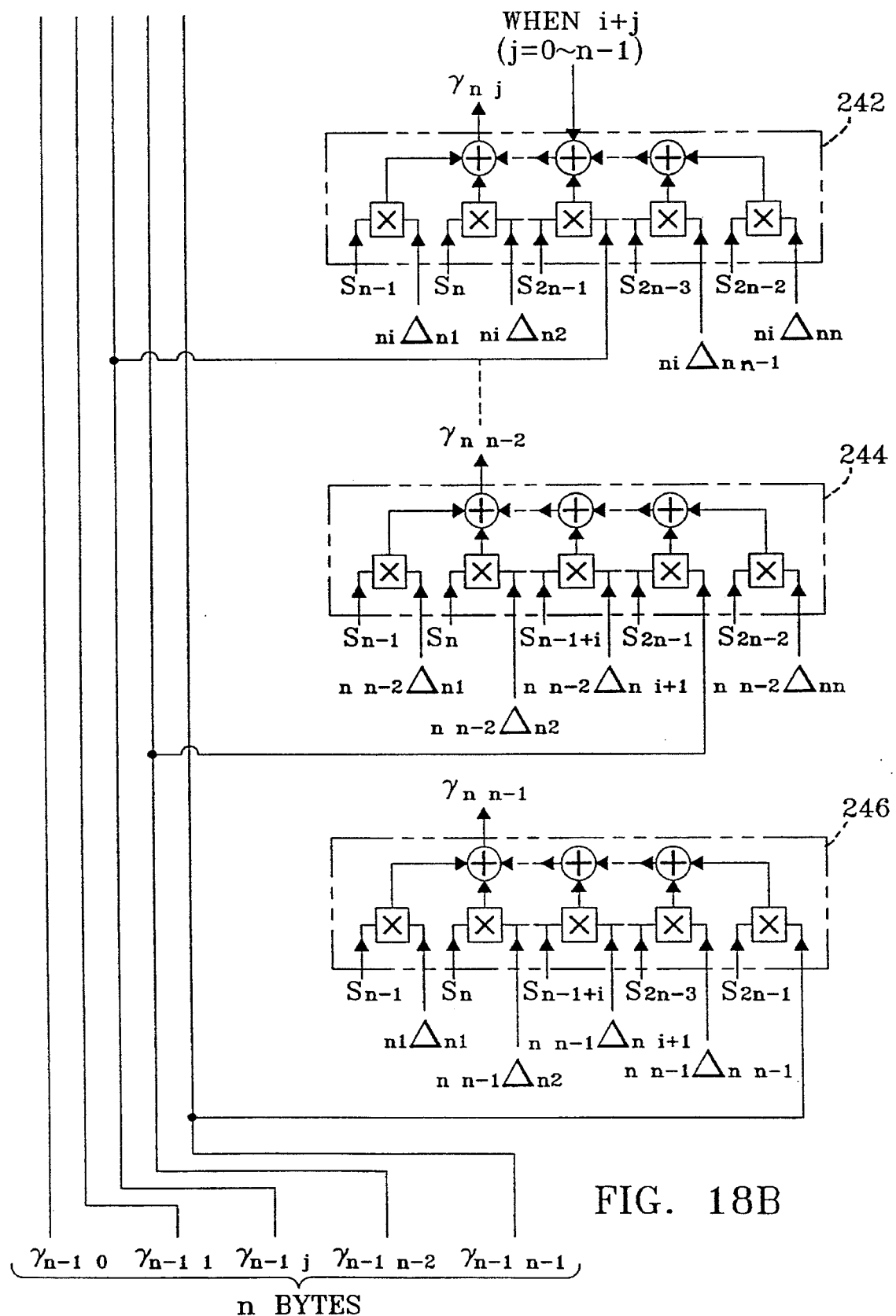
FIG. 18 is a circuit diagram of an arithmetic unit of (n) unknowns in FIG. 13.

Further, FIG. 18 shows an embodiment of the arithmetic unit of (n) unknowns 200-n in FIGS. 13 and 14. The arithmetic unit of (n) unknowns 200-n comprises fundamental (n) logic circuits 238, 240, 242, 244, 246, ..., 248. Each logic circuit comprises (n) multiplying circuits and (n−2) EX-OR circuits.

A method of deriving the solutions of the simultaneous equations of (n) unknowns will now be shown. First, the error location polynomial is as follows.

$$(X \oplus \alpha^{i1})(X \oplus \alpha^{i2})(X \oplus \alpha^{i3}) \ldots (X \oplus \alpha^{in}) = X^n \oplus \beta_{n-1} X^{n-1} \oplus \beta_{n-2} X^{n-2} \oplus \ldots \oplus \beta_1 X \oplus \beta_0 \quad (12)$$

Now, assuming that the (t=n) error patterns are set to $E_{i1}$ to $E_{in}$ and (2n) syndromes are set to $S_j$ (j=0 to 2n−1), the syndromes $S_j$ can be expressed by $$S_j = E_{i1} \alpha^{j*i1} \oplus E_{i2} \alpha^{j*i2} \oplus \ldots \oplus E_{in} \alpha^{j*in} \quad (j=0\text{-}2n-1) \quad (13)$$

By substituting $x = \alpha^i$ (i=i1 to in) into the equation (13), $$\alpha^{n*i} \oplus \beta_{n-1} \alpha^{(n-1)*i} \oplus \beta_{n-2} \alpha^{(n-2)*i} \oplus \ldots \oplus \beta_0 = 0 \quad (14)$$

(i=i1~in)

is obtained. By erasing E and a from the equations (13) and (14), the following relation is derived.

$$\begin{bmatrix} S_0 & S_1 & S_2 & \ldots S_{n-2} & S_{n-1} \\ S_1 & S_2 & S_3 & \ldots S_{n-1} & S_n \\ S_2 & S_3 & S_4 & \ldots S_n & S_{n+1} \\ \cdot & \cdot & \cdot & & \cdot \\ \cdot & \cdot & \cdot & & \cdot \\ \cdot & \cdot & \cdot & & \cdot \\ S_{n-2} & S_{n-1} & S_n & \ldots S_{2n-4} & S_{2n-3} \\ S_{n-1} & S_n & S_{n+1} & \ldots S_{2n-3} & S_{2n-2} \end{bmatrix} \begin{bmatrix} \beta_0 \\ \beta_1 \\ \beta_2 \\ \cdot \\ \cdot \\ \cdot \\ \beta_{n-2} \\ \beta_{n-1} \end{bmatrix} = \begin{bmatrix} S_n \\ S_{n+1} \\ S_{n+2} \\ \cdot \\ \cdot \\ \cdot \\ S_{2n-2} \\ S_{2n-1} \end{bmatrix} \quad (15)$$

According to the equation (15), there are (n) coefficients $\beta_0$ to $\beta_{n-1}$. When the matrix equation of the matrix of the left side of the equation (15) is set to |S| and the Cramer's formula is used, the coefficients $\beta_k$ can be expressed as follows.

$$\beta_k = \frac{1}{|S|} \begin{vmatrix} S_0 & \ldots & S_n & \ldots & S_{n-1} \\ S_1 & \ldots & S_{n+1} & \ldots & S_n \\ \cdot & & \cdot & & \cdot \\ \cdot & & \cdot & & \cdot \\ \cdot & & \cdot & & \cdot \\ S_{n-1} & \ldots & S_{2n-1} & \ldots & S_{2n-2} \end{vmatrix} \quad (16)$$

(k = 0–n − 1)

The values of the matrix equation of the numerator of the right side of the equation (16) are equal to $\gamma_{nk}$. The numerator of the equation (16) is obtained by replacing the (k+1) column of the absolute value S by the right side of the equation (15).

The equation (16) can be symbolized as follows.

$$\beta_k = \frac{\gamma_{nk}}{\gamma_{nn}} \quad (17)$$

(k = 0–n − 1)

When $\gamma_{nn}=0$ in the equation (17), this means that the equation (15) has solutions less than (n). The number of errors can be known from them. It is necessary to develop $\gamma$ in order to obtain the coefficients $\beta$. The circuit to develop $\gamma$ is the arithmetic unit of (n) unknowns 200-n in FIG. 13. Now, assuming that cofactors of the n-th order square matrix A=[$a_{ij}$] are set to $\Delta_{ij}$, they can be developed with respect to the (i) row as follows.

$$|A| = a_{i1}\Delta_{i1} \oplus a_{i2}\Delta_{i2} \oplus \ldots \oplus a_{in} \quad (18)$$

$\gamma$ can be developed as follows from the relations of the equations (16), (17), and (18).

$$\gamma_{nn} = \sum_{m=0}^{n-1} S_{n-1+m} \gamma_{n-1+m} \quad (19)$$

$$\begin{bmatrix} \gamma_{n0} \\ \gamma_{n1} \\ \gamma_{n2} \\ \cdot \\ \cdot \\ \cdot \\ \gamma_{nn-2} \\ \gamma_{nn-1} \end{bmatrix} = S_{2n-1} \begin{bmatrix} 1 & & & & \\ & 1 & & 0 & \\ & & 1 & & \\ & & & \ddots & \\ & 0 & & & 1 \\ & & & & & 1 \end{bmatrix} \begin{bmatrix} \gamma_{n-10} \\ \gamma_{n-11} \\ \gamma_{n-12} \\ \cdot \\ \cdot \\ \cdot \\ \gamma_{n-1n-2} \\ \gamma_{n-1n-1} \end{bmatrix} + \begin{bmatrix} 0 & n0\Delta_{n2} & \ldots & n0\Delta_{nn-1} & n0\Delta_{nn} \\ n1\Delta_{n1} & 0 & \ldots & n1\Delta_{nn-1} & n1\Delta_{nn} \\ n2\Delta_{n1} & n2\Delta_{n2} & \ldots & n2\Delta_{nn-1} & n2\Delta_{nn} \\ \cdot & \cdot & & \cdot & \cdot \\ \cdot & \cdot & & \cdot & \cdot \\ nn-2\Delta_{n1} & nn-2\Delta_{n2} & \ldots & 0 & nn-2\Delta_{nn} \\ nn-1\Delta_{n1} & nn-2\Delta_{n2} & \ldots & nn-1\Delta_{nn-1} & 0 \end{bmatrix} \begin{bmatrix} S_{n-1} \\ S_n \\ S_{n+1} \\ \cdot \\ \cdot \\ \cdot \\ S_{2n-3} \\ S_{2n-2} \end{bmatrix} \quad (20)$$

FIG. 14 shows an embodiment which realizes the equation (20) as a circuit. In the equation (20), $_{n0}\Delta_{n2}$ shows a cofactor $\Delta_{n2}$ of $\gamma_{n0}$. Namely, it shows the development about the (n) row and the matrix cannot be expressed like the equation (20) in the development about the other row. By repetitively using the equation (20), the development in case of n≧3 can be generally performed and the solutions are obtained. When n<3, it will be obviously understood without needing any explanation. When developing like the equation (20), it will be understood that the (ij) component (i<j) and the (ji) component of the matrix of the second term of the right side of the equation (20) are equal. This point will be shown below. The equation (15) is rewritten to the following component display.

$$\begin{bmatrix} a_{11} & a_{12} & \ldots & a_{1n} \\ a_{21} & a_{22} & \ldots & a_{2n} \\ \cdot & \cdot & & \cdot \\ \cdot & \cdot & & \cdot \\ \cdot & \cdot & & \cdot \\ a_{n1} & a_{n2} & \ldots & a_{nn} \end{bmatrix} \begin{bmatrix} X_1 \\ X_2 \\ \cdot \\ \cdot \\ \cdot \\ X_n \end{bmatrix} = \begin{bmatrix} b_1 \\ b_2 \\ \cdot \\ \cdot \\ \cdot \\ b_n \end{bmatrix} \quad (21)$$

By using the Cramer's formula, $$X_j = \frac{1}{|A|} \begin{vmatrix} a_{11} & \ldots & b_1 & \ldots & a_{1n} \\ a_{21} & \ldots & b_2 & \ldots & a_{2n} \\ \cdot & & \cdot & & \cdot \\ \cdot & & \cdot & & \cdot \\ \cdot & & \cdot & & \cdot \\ a_{n1} & \ldots & b_n & \ldots & a_{nn} \end{vmatrix} \quad (22)$$

$(j = 1 \sim n)$

When the equations (21) and (22) are developed like the equation (20), the (ij) component of the matrix of the second term of the matrix of the right side is expressed by $\epsilon_{ij}$ (i<j). The sum of the Galois field GF ($2^m$) denotes the exclusive OR arithmetic operation and has no polarity. Therefore, even when the columns of the matrix equation are exchanged, the value of the matrix equation is unchanged. By paying an attention to such a fact, the following relation is obtained.

$$\epsilon_{ij} = \begin{vmatrix} a_{11} & \ldots a_{1i-1} & b_1 & a_{1i+1} & \ldots a_{1j-1} & a_{1j+1} & \ldots a_{1n} \\ a_{21} & \ldots a_{2i-1} & b_2 & a_{2i+1} & \ldots a_{2j-1} & a_{2j+1} & \ldots a_{2n} \\ \cdot & \cdot & \cdot & \cdot & \cdot & \cdot & \cdot \\ \cdot & \cdot & \cdot & \cdot & \cdot & \cdot & \cdot \\ \cdot & \cdot & \cdot & \cdot & \cdot & \cdot & \cdot \\ a_{n-11} & \ldots a_{n-1i-1} & b_{n-1} & a_{n-1i+1} & \ldots a_{n-1j-1} & a_{n-1j+1} & \ldots a_{n-1n} \end{vmatrix} \quad (23)$$

$$= \begin{vmatrix} a_{11} & \ldots a_{1i-1} & a_{1i+1} & \ldots a_{1j-1} & b_1 & a_{1j+1} & \ldots a_{1n} \\ a_{21} & \ldots a_{2i-1} & a_{2i+1} & \ldots a_{2j-1} & b_2 & a_{2j+1} & \ldots a_{2n} \\ \cdot & \cdot & \cdot & \cdot & \cdot & \cdot & \cdot \\ \cdot & \cdot & \cdot & \cdot & \cdot & \cdot & \cdot \\ \cdot & \cdot & \cdot & \cdot & \cdot & \cdot & \cdot \\ a_{n-11} & \ldots a_{n-1i-1} & a_{n-1i+1} & \ldots a_{n-1j-1} & b_{n-1} & a_{n-1j+1} & \ldots a_{n-1n} \end{vmatrix}$$

$= \epsilon_{ji}$

From the relation of the equation (23), it will be understood that when the equation (20) is realized by the circuit, the circuit amount can be reduced to the half as compared with the case of the other development.

Figure 19:
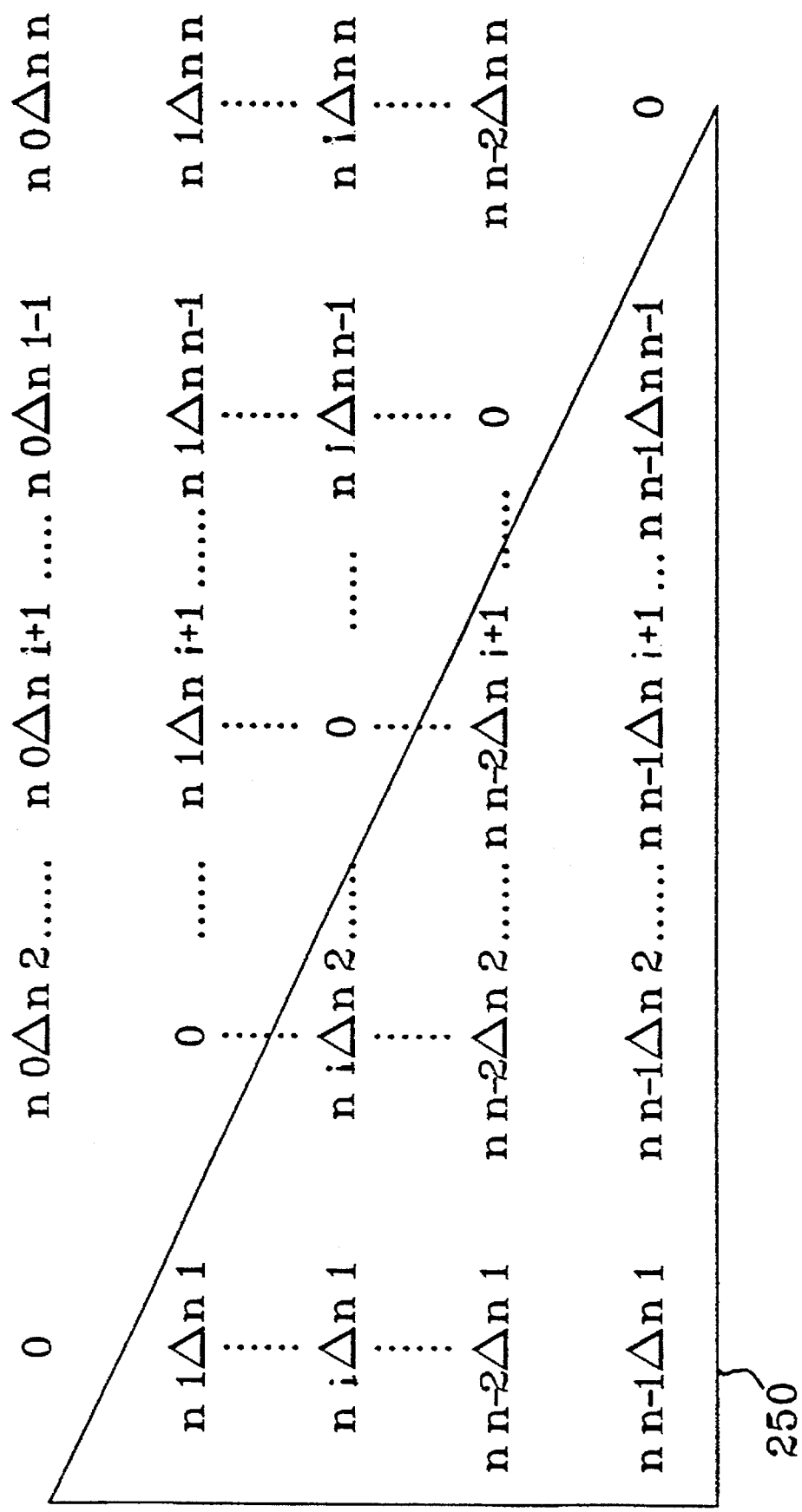
FIG. 19 is an explanatory diagram showing that an (i j) component and a (j i) component in a developed matrix equations are equal.
Figure 20:
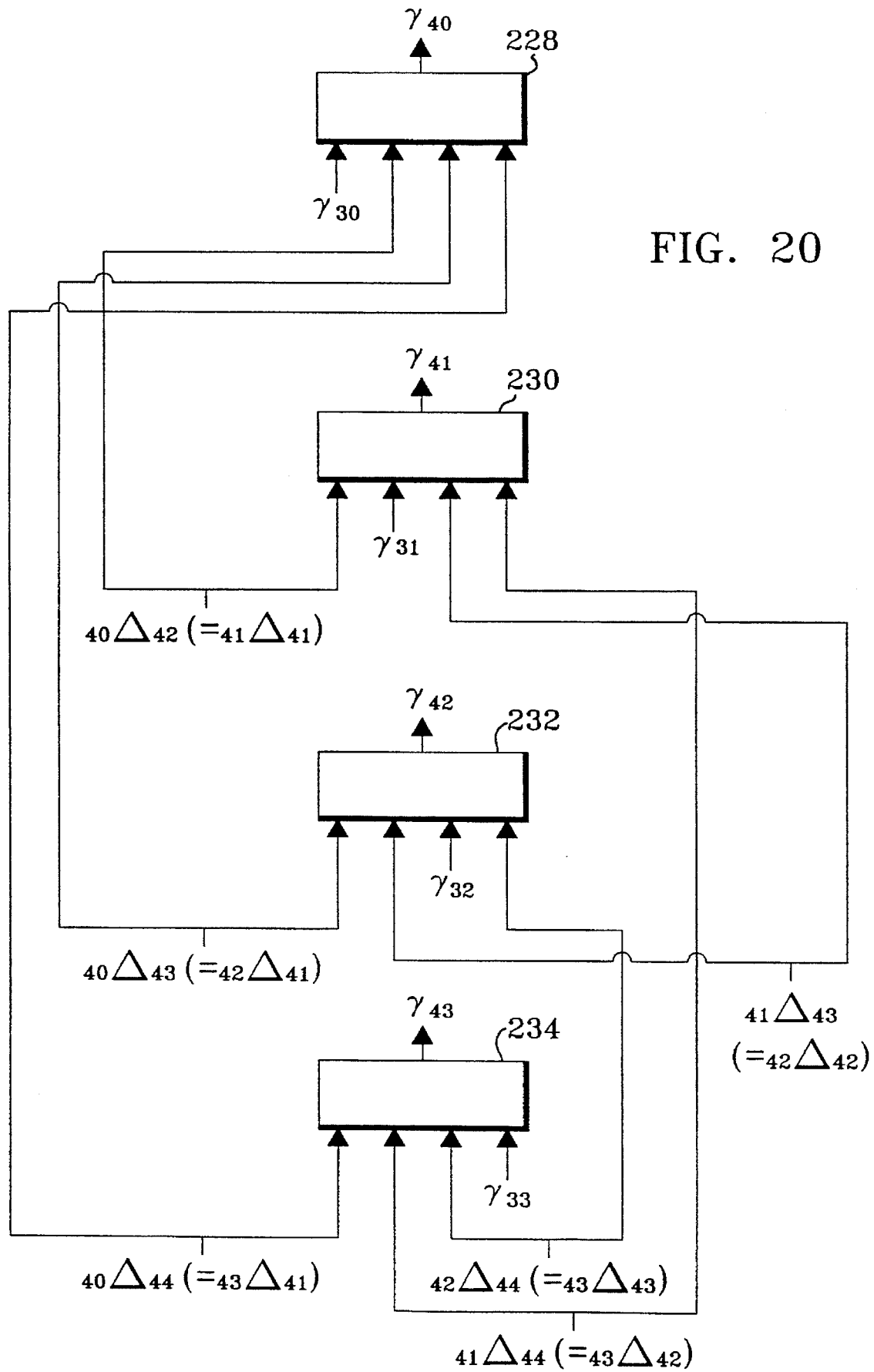
FIG. 20 is a circuit diagram of an embodiment in which inputs are made common with respect to an arithmetic operating circuit of four unknowns in FIG. 14.

FIG. 19 shows the second term of the right side of the equation (20). A non-target component 250 surrounded by a solid line, namely, the (i, j) component is equal to the (j, i) component which is not surrounded by the solid line. Therefore, for example, when considering the logic circuits 228, 230, 232, and 234 in the arithmetic unit of four unknowns in FIG. 17, as shown in FIG. 20, a circuit construction in which common terms are combined can be obtained. Thus, the input connections to the logic circuits can be reduced and the circuit amount can be decreased to ½.

[Error correction of variable length block]

Figure 21:
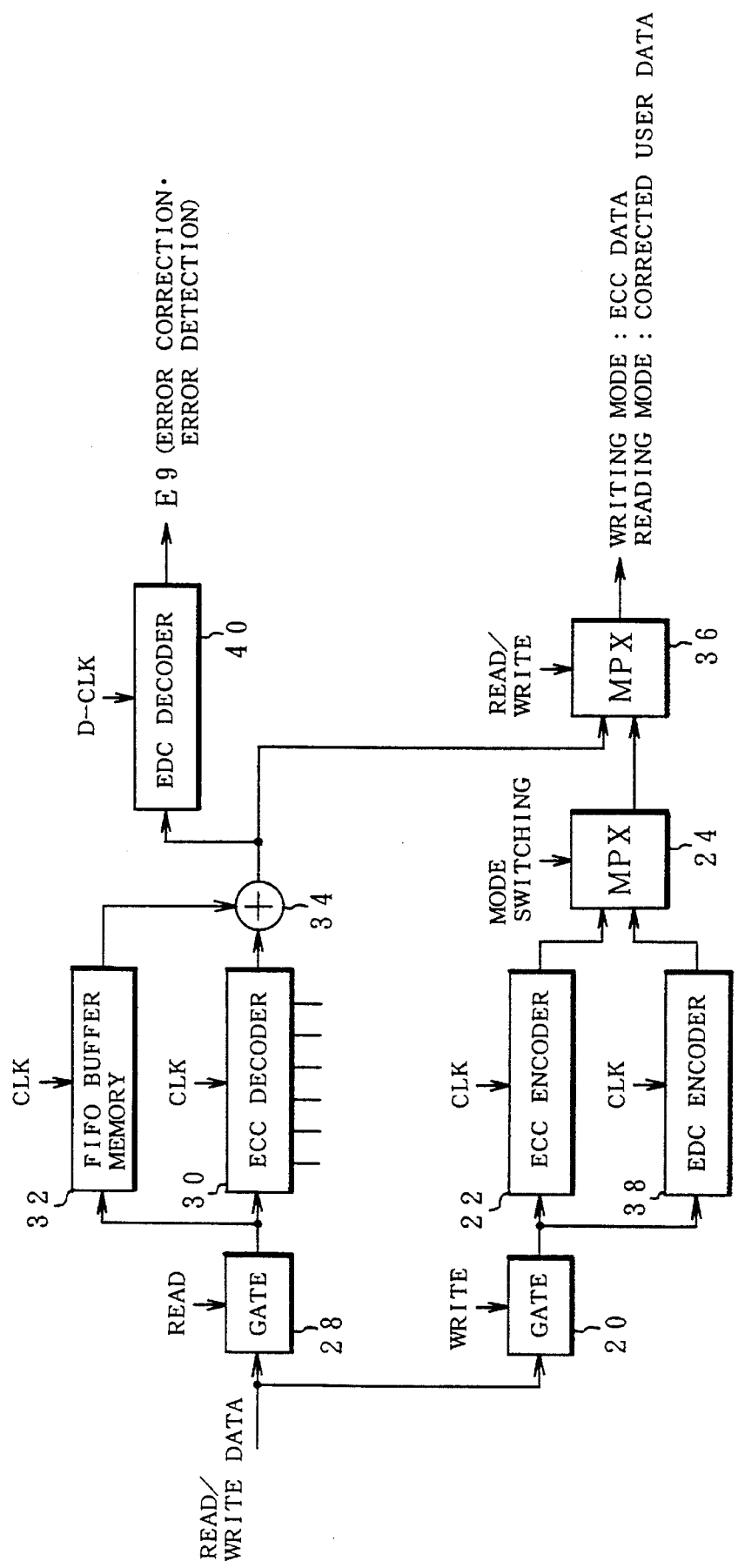
FIG. 21 is a block diagram of an error correcting section.

FIG. 21 shows an error correcting system of the on-the-fly type. The system is obtained by eliminating the status detecting section 46 and correcting state detecting section 48 from the embodiment of FIG. 2 and the other portions are substantially the same as those of FIG. 2. The system will now be simply explained as follows.

The write data from the formatter control processor 18 passes through the gate 20 and is supplied to the ECC encoder 22. The embodiment relates to the case of using the Reed-Solomon code for correcting errors of the correcting ability of (n=3) bytes as an example. The write data is supplied as a stream of the byte data having a width of eight bits. The ECC encoder forms the ECC check bytes of the codeword constructed by the Galois field GF ($2^8$). As a generator polynomial in this case, for example, a generator polynomial having elements $\alpha^0, \alpha^1, \alpha^2, \alpha^3, \alpha^4$, and $\alpha^5$ of the Galois field as solutions can be mentioned.

Specifically, the generator polynomial is as follows.

$$G(X) = (x \oplus \alpha^0)(x \oplus \alpha^1)(x \oplus \alpha^2)(x \oplus \alpha^3)(x \oplus \alpha^4)(x \oplus \alpha^5) \quad (24)$$

The ECC check bytes formed from the data section by the ECC encoder 22 are added after the data and the resultant data is outputted as write data to the disk enclosure 14 through the multiplexers 24 and 36 and is written to the disk medium. The disk drive uses a CKD record formatter, the record length is variable, and one record length is determined by a length of user data. The number of subblocks of the user data, therefore, is also changed depending on the length of user data. Further, the last subblock becomes the variable length subblock whose length varies due to the range of fixed subblock length.

The reading system will now be described. The original read data read out from the disk enclosure side, namely, the codeword of the subblock unit is supplied to the ECC decoder 30 through the gate 28. At the same time, the read data from the gate 28 is branched and stored into the FIFO buffer memory 32. The FIFO buffer memory 32 performs the delay within the time of one subblock that is necessary for the correcting operation in the ECC decoder 30. The ECC decoder 30 executes the error correction of up to (n=3) bytes for the codeword as a target included in the subblocks of the read data. The error value is outputted to the EX-OR circuit 34 at the byte timing of the error location in the subblock. The exclusive OR of the error value and the byte data before correction which is outputted from the FIFO buffer memory 32 at the same timing as that of the error value is calculated, thereby inverting the error bits of the erroneous bytes and performing the error correction. The clear data whose errors were corrected by the EX-OR circuit 34 is transmitted through the multiplexer 36 and is transferred as corrected user data to the upper disk controller 12 through the formatter control processor 18. Further, in order to monitor the non-detection and erroneous correction in the ECC decoder 30 by using the error detection code (EDC), the EDC encoder 38 is provided for the writing system and the EDC decoder 40 is provided for the reading system.

Figure 22:
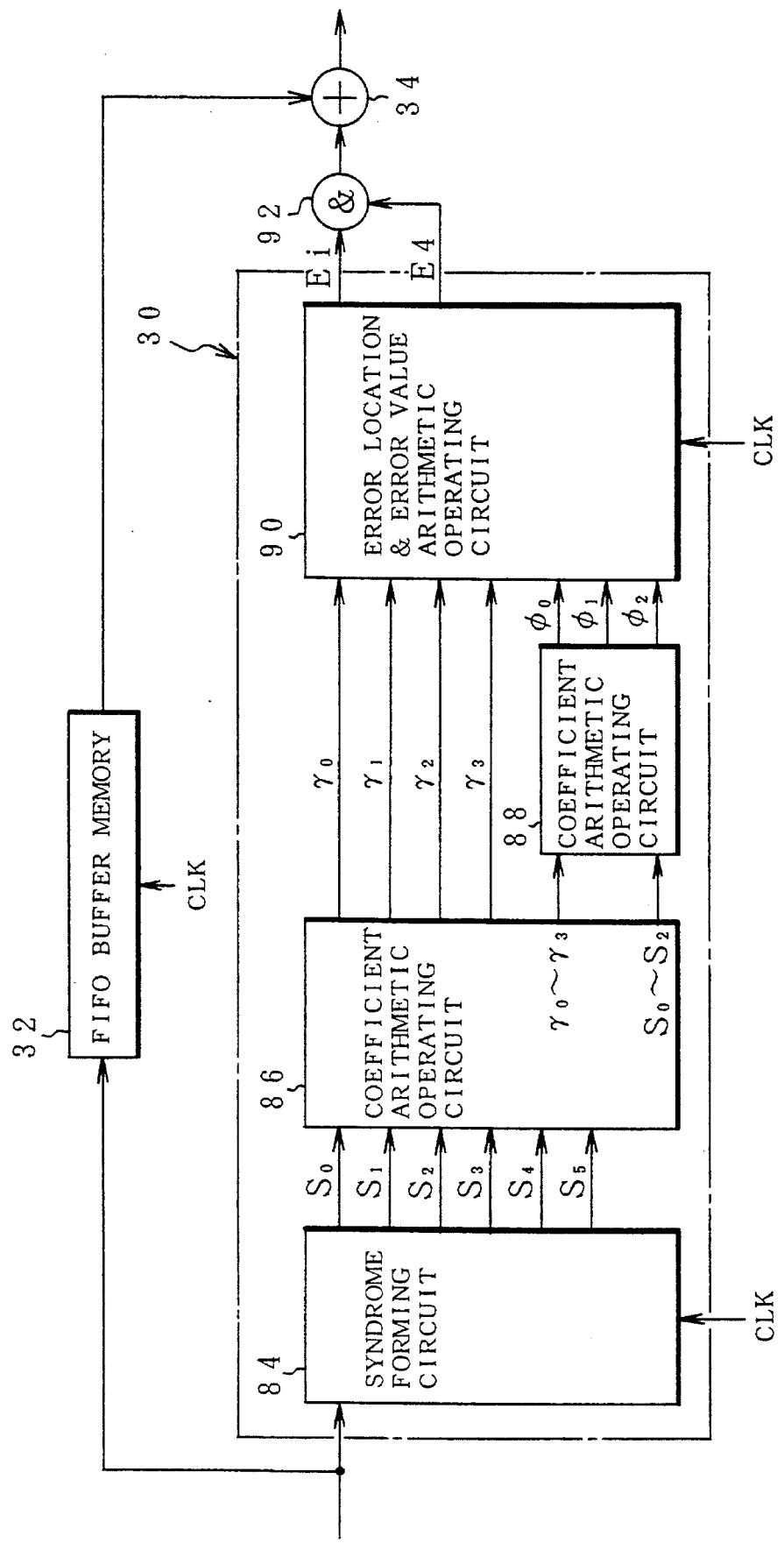
FIG. 22 is a block diagram of an ECC decoder.

FIG. 22 shows the details of the ECC decoder 30 in FIG. 21. Although the operation of the ECC decoder 30 is fundamentally the same as that of FIG. 7, it differs with respect to a point that the coefficients which are outputted from the coefficient arithmetic operating circuit 86 to the error location & error value arithmetic operating circuit 90 are set to $\gamma_0$ to $\gamma_3$.

The ECC decoder 30 is constructed by the syndrome forming circuit 84, coefficient arithmetic operating circuits 86 and 88, and error location & error value arithmetic operating circuit 90. In case of the up to 3-byte error correction, the syndrome forming circuit 84 calculates six syndromes $S_0$ to $S_5$ from the read data and outputs them. The method of calculating the syndromes $S_0$ to $S_5$ is well known and is realized by using, for example, exclusive OR circuits (EX-OR circuits), OR circuits, and shift registers. The coefficient arithmetic operating circuit 86 receives the syndromes $S_0$ to $S_5$ and calculates the coefficients $\gamma_0$ to $\gamma_2$ of the next error location polynomial.

$$\begin{aligned} ELP &= (X \oplus \alpha^{i_1})(X \oplus \alpha^{i_2})(X \oplus \alpha^{i_3}) \\ &= X^3 \oplus \beta_2 X^2 \oplus \beta_1 X \oplus \beta_0 \\ &= \gamma_3 X^3 \oplus \gamma_2 X^2 \oplus \gamma_1 X \oplus \gamma_0 \end{aligned} \quad (25)$$

The next coefficient arithmetic operating circuit 88 receives the values $\gamma_0$ to $\gamma_3$ and syndromes $S_0$, $S_1$, and $S_2$ derived in the step of obtaining the coefficients of the error location polynomial from the coefficient arithmetic operating circuit 86 as solutions $\beta_0$, $\beta_1$, and $\beta_2$ of the simultaneous equations of (n) unknowns and calculates the coefficients $\Phi_0$, $\Phi_1$, and $\Phi_2$ to obtain the error value by the following equations.

$$\begin{aligned} \Phi_0 &= \gamma_0 S_0 \\ \Phi_1 &= \gamma_2 S_1 \oplus \gamma_3 S_2 \\ \Phi_2 &= \gamma_3 S_1 \end{aligned} \quad (26)$$

where, $\gamma_0$ to $\gamma_3$ are set to the following values for the numbers of errors (t=1 to 3).

| | |
|---|---|
| t = 3 | $\gamma_3 = \gamma_{33}$ |
| | $\gamma_2 = \gamma_{32}$ |
| | $\gamma_1 = \gamma_{31}$ |
| | $\gamma_0 = \gamma_{30}$ |
| t = 2 | $\gamma_3 = 0$ |
| | $\gamma_2 = \gamma_{22}$ |
| | $\gamma_1 = \gamma_{21}$ |
| | $\gamma_0 = \gamma_{20}$ |
| t = 1 | $\gamma_3 = 0$ |
| | $\gamma_2 = 0$ |
| | $\gamma_1 = \gamma_{11}$ |
| | $\gamma_0 = \gamma_{10}$ |

The error location & error value arithmetic operating circuit 90 provided at the final stage executes a chain search like trial and error for discrimination about actual error location and error value in a state in which the error location coefficients $\gamma_0$ to $\gamma_2$ and error value coefficients $\Phi_0$ to $\Phi_2$ are obtained. At the timing of the error location obtained by the chain search, the error location detection signal E4 is outputted to the AND circuit 92, thereby setting into the permitting state. The error pattern vectors $E_i$ ($i = i_1, i_2, i_3$) based on the error value obtained at the same time are outputted for the correcting operation. The error pattern vectors $E_i$ are given by the following equation.

$$E_i = (\Phi_2 \alpha^{2i} \oplus \Phi_1 \alpha^i \oplus \Phi_0)/(\gamma_2 \alpha^{2i} \oplus \gamma_0) \quad (27)$$

The error pattern vectors $E_i$ are supplied to the EX-OR circuit 34 through the AND circuit 92. The exclusive OR of the error pattern vectors $E_i$ and the byte data of the error location outputted from the FIFO buffer memory 32 at the same timing is calculated, thereby inverting the error bits and performing the correction. The error location is determined in accordance with a procedure of the well-known chain search. When the error location is decided, the following corrected error location polynomial is used.

$$ELP = \gamma_n X^n \oplus \gamma_{n-1} X^{n-1} \oplus \ldots \gamma_1 X \oplus \gamma_0 \quad (28)$$

When expressing the polynomial (28) with respect to the number (t=3) of errors which can be corrected, $$ELP = \gamma_3 X^3 \oplus \gamma_2 X^2 \oplus \gamma_1 X^1 \oplus \gamma_0 \quad (29)$$

is obtained.

The error pattern vectors $E_i$ as an error value in this case are as follows.

$$E_i = (\Phi_0 \oplus \Phi_1 \alpha^i \oplus \Phi_2 \alpha^{2i})/(\gamma_0 \oplus \gamma_2 \alpha^{2i}) \quad (30)$$

In the error location & error value arithmetic operating circuit 90 of the ECC decoder 30, when the decoder data which was variable length controlled by the CKD format is received from the memory medium, the variable length record has a plurality of fixed length subblocks and the last variable length subblock. Therefore, the arithmetic operation of the error location according to the ordinary chain search is performed with respect to the fixed length subblock. On the other hand, with respect to the variable length subblock which is finally received, a special arithmetic operation of the error location including the dummy search is performed. In case of the (n=3) byte error correction, the error location polynomial (ELP) which is used for the arithmetic operation of the error location is expressed as follows.

$$ELP = \gamma_3 X^3 \oplus \gamma_2 X^2 \oplus \gamma_1 X^1 \oplus \gamma_0 \quad (31)$$

The coefficients $\gamma_3$ to $\gamma_0$ in the polynomial (8) are decided on the basis of the syndromes $S_0$ to $S_5$ formed from the received subblock. An element $\alpha^n$ of a finite field indicative of the location of the byte data is substituted to (X) of the error location polynomial and the location at which the value of the error location polynomial is equal to 0 indicates the error location. (n) denotes a value showing the byte location of the subblock and n=0 to N−1. (N) denotes the number of bytes per interleave of the fixed length subblock.

The data is sequentially read out from the memory medium in accordance with the order from the high order to low order. Therefore, in the chain search, elements $\alpha^{3(N-1)}$, $\alpha^{2(N-1)}$, $\alpha^{(N-1)}$, and $\alpha^0$ of the finite field at the byte location (N−1) are respectively multiplied to the coefficient $\gamma$ derived on the basis of the formation of the syndromes. At the subsequent timings of the byte locations N−2 to 0, $\alpha^{-3}$, $\alpha^{-2}$, $\alpha^{-1}$, and $\alpha$ are repetitively calculated synchronously with the byte data, so that the arithmetic operation of the error location by the chain search can be performed from the high-order byte location (N−1).

In the case where the subblock has a fixed length, the error location can be obtained by only the above operations. In case of the variable length subblock, however, since the data length changes in a range from (N−2) to 1 for the number (N) of bytes of the fixed length subblock, it is necessary to use a multiplier corresponding to each data length. In case of providing the multiplier corresponding to the data length of the variable length subblock as mentioned above, however, the multipliers of the number as many as the number (N) of bytes of the fixed length subblock are necessary, so that the circuit scale is too large.

According to the invention, therefore, a dummy search in which the start location of the fixed length subblock is presumed with respect to the variable length subblock is performed. The circuit is switched at the start location of the actual variable length subblock. The correction by the ordinary error search is executed to the variable length subblock. This point shall also apply to the arithmetic operation of the error value.

Figure 23:
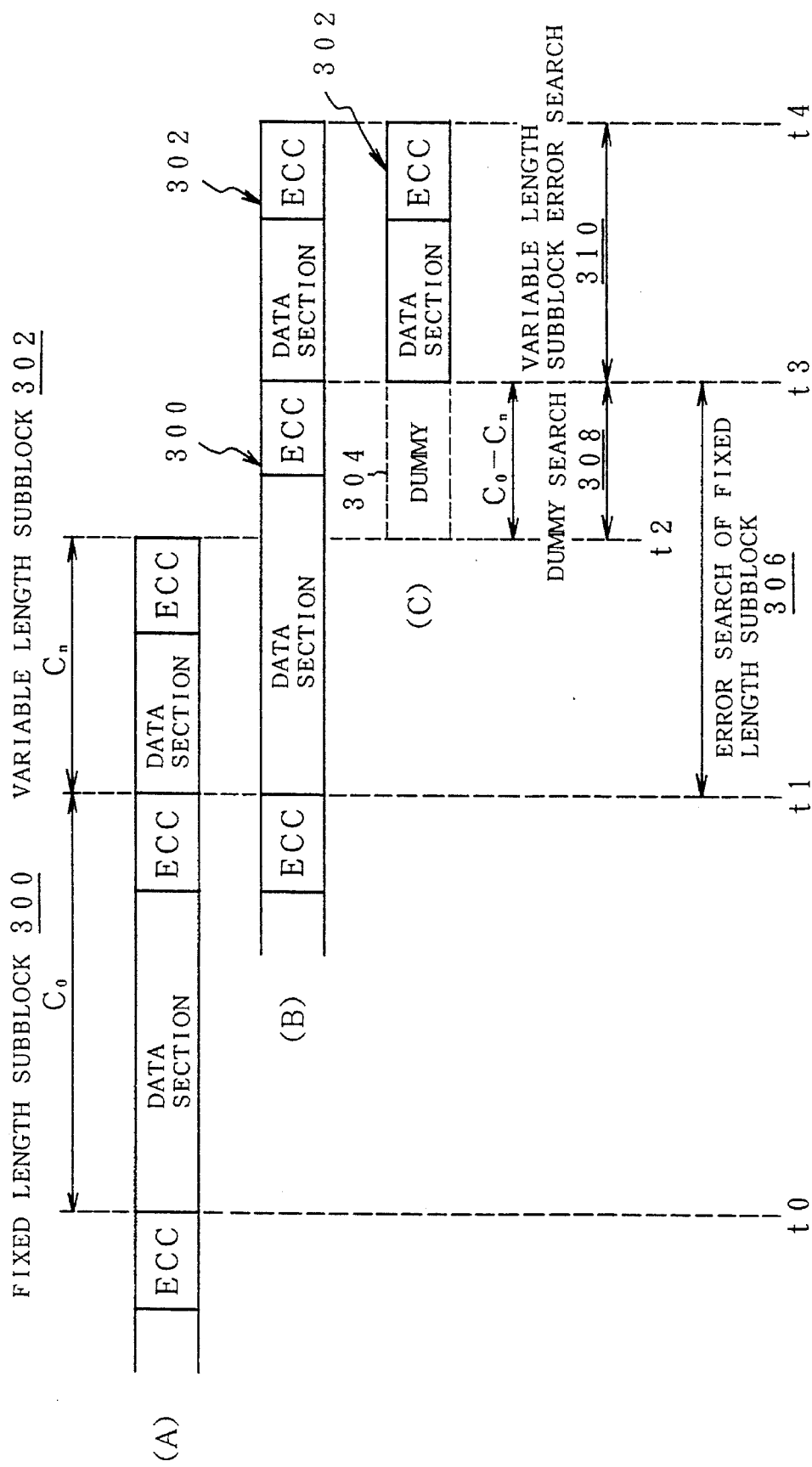
FIG. 23 is an explanatory diagram of an error search of variable length subblocks.

FIG. 23 shows a procedure for the error search of the variable length subblock. First, (A) in FIG. 23 denotes a data input to the ECC decoder 30. The reception of a fixed length subblock 300 is started at time t0. The fixed length subblock 300 has a fixed byte length CO. After completion of the reception of the fixed length subblock 300, the reception of a variable length subblock 302 is started from time t1. The variable length subblock 302 has a byte length Cn (Cn<C0). After the fixed length subblock 300 was received at time t0, a delay time corresponding to the fixed byte length CO is necessary until the syndromes $S_0$ to $S_5$ are formed. Therefore, as shown in (B) in FIG. 23, the syndromes $S_0$ to $S_5$ of the fixed length subblock 300 are formed at time t1. On the basis of them, the coefficient γ of the error location polynomial is obtained. An error search 306 of the fixed length subblock 300 is started from time t1.

With respect to the variable length subblock 302, as shown in (C) in FIG. 23, a fixed length subblock added with a dummy block 304 is presumed. In this case, a byte length of the dummy block 304 is equal to (CO−Cn) and the start location of the dummy block 304, namely, the start location of the fixed length subblock presumed with respect to the variable length subblock 302 can be recognized. As shown in the input data of (A) in FIG. 23, the start location of the dummy block 304 coincides with a timing of time t2 at which the input of the variable length subblock 302 is finished.

When the start location of the dummy block 304 presumed with respect to the variable length subblock 302, namely, time t2 is recognized during the error search 306 of the fixed length subblock, the syndromes $S_5$ to $S_0$ of the variable length subblock 302 are formed at this time point. The coefficient γ of the error location polynomial is obtained. Therefore, the error search is started from the start location of the dummy block 304. The error search of the dummy block 304 is a dummy search 308 because it corresponds to the repetition of the internal arithmetic operation loop in which the result of the calculated error location is not outputted for error correction. Therefore, both of the error search 306 of the fixed length subblock and the dummy search 308 about the dummy block 304 presumed with respect to the variable length subblock 302 are executed in parallel from time t2.

When the error search 306 of the fixed length subblock is finished at time t3 and a timing reaches time t3 of the head byte location of the inherent variable length subblock 302, the arithmetic operating circuit is switched from the dummy search 308 so far to an error search 310 of the variable length subblock. Specifically speaking, although the arithmetic operation result is not outputted in the dummy search 308, in case of the error search 310, the arithmetic operation result is outputted, thereby executing the error correction.

Figure 24:
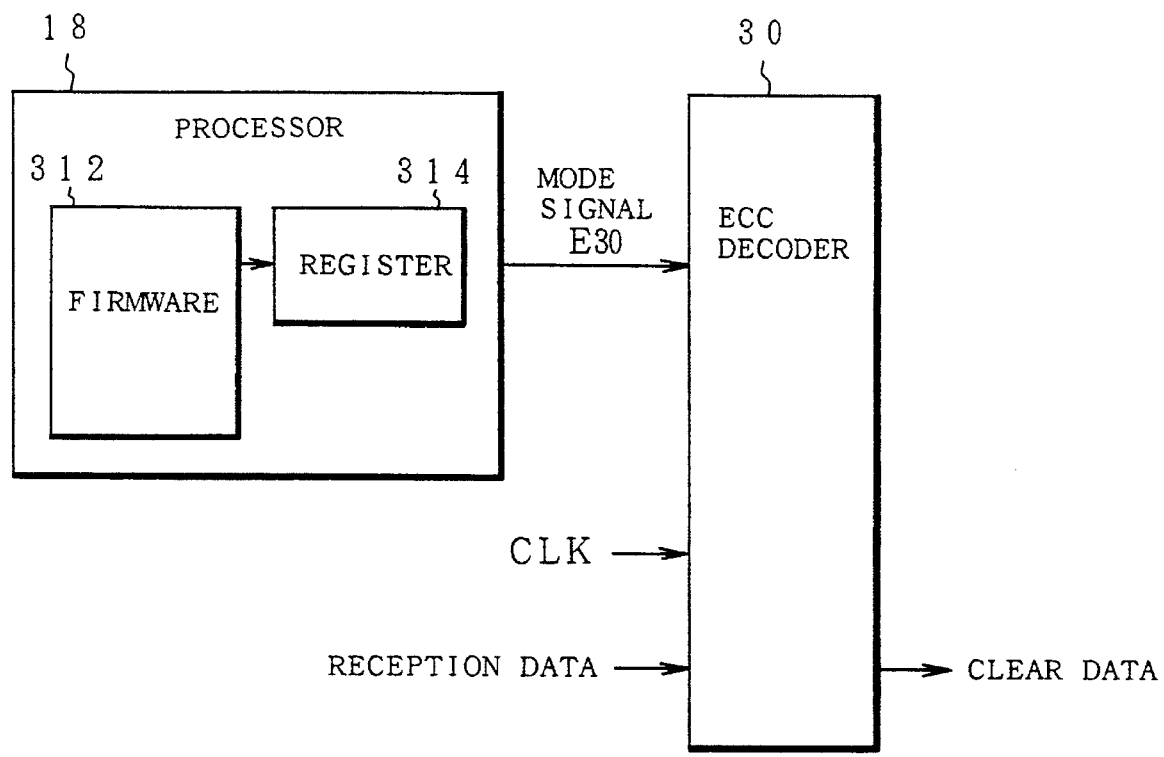
FIG. 24 is a block diagram of the first embodiment having an error correcting function of the variable length subblocks.

FIG. 24 shows functions of the ECC decoder 30 to execute arithmetic operations of the error location and error value of the variable length subblock in FIG. 23 and the formatter control processor 18 serving as a control circuit section for such operations. A function to form a mode signal E30 indicating whether the received data is the fixed length subblock or the variable length subblock is provided as a firmware 312 for the formatter control processor 18. The mode information formed by the firmware 312 is stored into a register 314 and is outputted as a mode signal E30 synchronously with the data to the ECC decoder 30.

Figure 25:
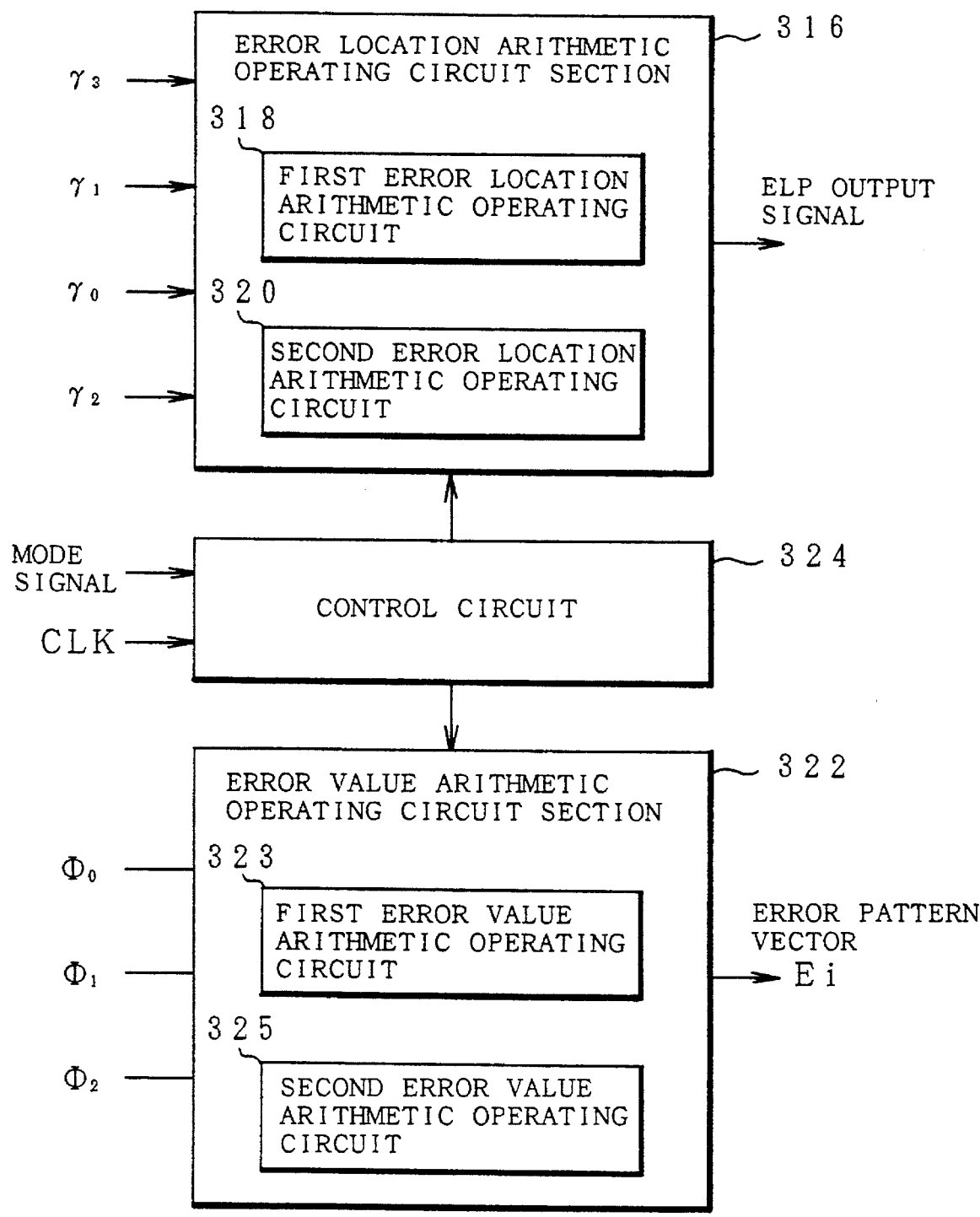
FIG. 25 is a block diagram of an error location and error value arithmetic operating section of the ECC decoder in FIG. 24.

FIG. 25 shows an embodiment of the error location & error value arithmetic operating circuit 90 which is provided for the ECC decoder 30 in FIG. 24. The arithmetic operation of the error location is executed by an error location arithmetic operating circuit 316. The arithmetic operation of the error value is executed by an error value arithmetic operating circuit 322. The error location arithmetic operating circuit 316 and error value arithmetic operating circuit 322 are controlled by a control circuit section 324 on the basis of the mode signal E30 and a clock CLK. The error location arithmetic operating circuit 316, for example, includes: a first error location arithmetic operating circuit 318 to perform an error search of a fixed length subblock; and a second error location arithmetic operating circuit 320 to execute an error search of a fixed length subblock. In the case where the fixed length subblock is discriminated from the mode signal E30, the first error location arithmetic operating circuit 318 operates. The syndromes are formed from the fixed length subblock. On the basis of the coefficients $\gamma_0$ to $\gamma_3$ of the error location polynomial which are inputted from the coefficient arithmetic operating circuit 86 in FIG. 22, the arithmetic operation of the chain search according to the polynomial (31) is executed synchronously with the data.

When the reception of the variable length subblock is discriminated, the control circuit section 324 makes the second error location arithmetic operating circuit 320 operative at the timing when the start location as a fixed length subblock of the variable length subblock is presumed during the error search of the preceding fixed length subblock, thereby executing what is called a dummy search in which the result is not outputted. When the timing of the start location of the variable length subblock is detected, the control circuit section 324 outputs the arithmetic operation result of the second error location arithmetic operating circuit 320 which is executing the dummy search to the outside as an output signal ELP. At the same time, the control circuit section 324 allows the error correction to be executed at each byte location of the variable length subblock on the basis of the error pattern vectors $E_i$ which are outputted from the error value arithmetic operating circuit 322.

The error value arithmetic operating circuit 322 also similarly includes: a first error value arithmetic operating circuit 323 to calculate an error pattern vector of the fixed length subblock; and a second error value arithmetic operating circuit 325 to calculate an error value of the variable length subblock. Each of the error value arithmetic operating circuits 323 and 325 calculates an error pattern vector at each byte location on the basis of the coefficients $\Phi_0$ to $\Phi_2$ and the syndromes $S_0$ to $S_2$ which are obtained from the coefficient arithmetic operating circuit 88 in FIG. 6. The second error value arithmetic operating circuit 325 to execute the arithmetic operation of the error location of the variable length subblock doesn't generate the arithmetic operation result at the timing of the dummy search and is switched to a mode to effectively output the arithmetic operation result at the start location of the variable length subblock, thereby enabling the error correction to be substantially executed.

Figure 26:
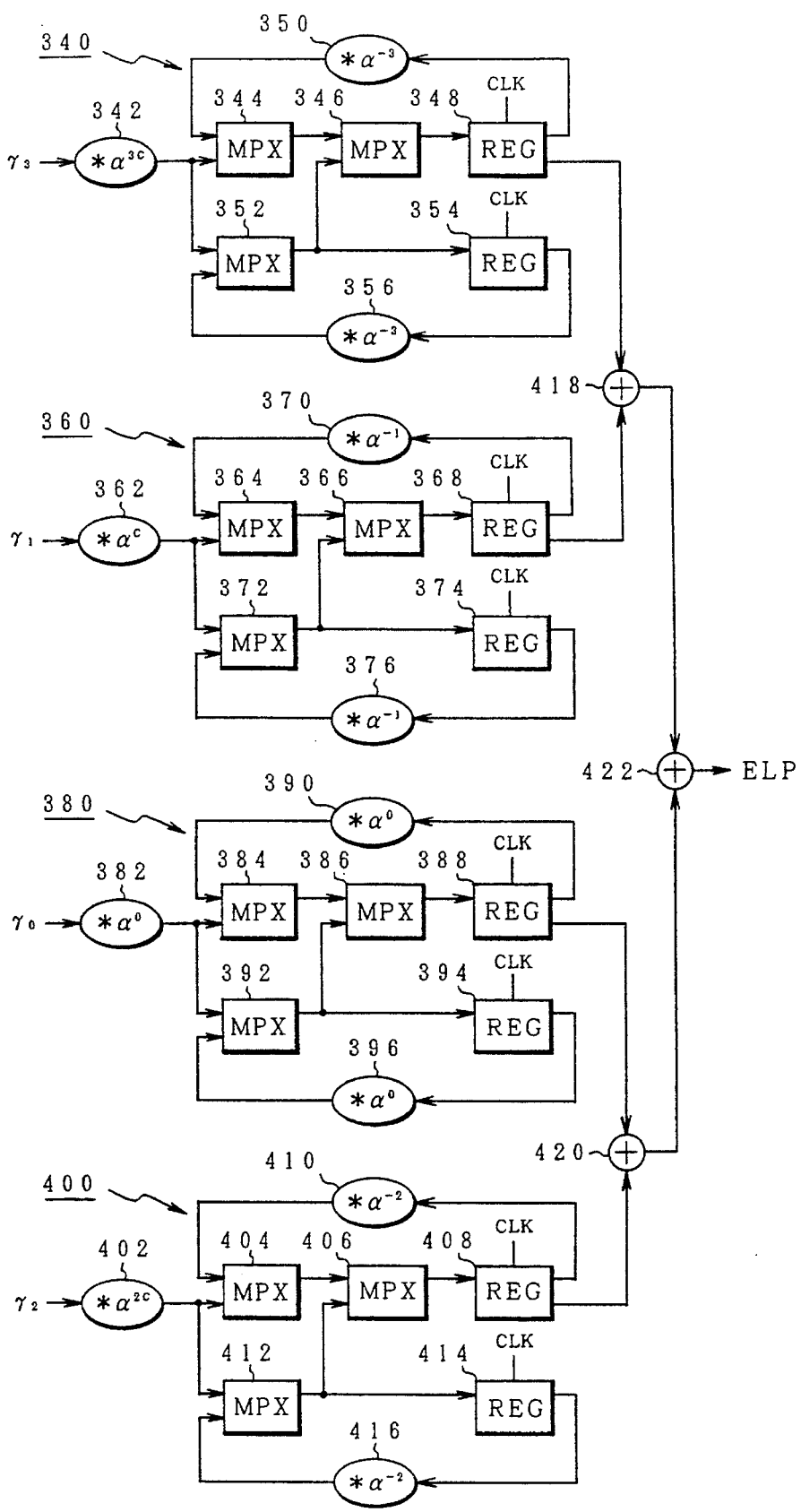
FIG. 26 is a circuit block diagram of an error location arithmetic operating circuit section.

FIG. 26 shows an embodiment of the error location arithmetic operating circuit 316 in FIG. 25. According to the embodiment, four arithmetic operating circuit sections 340, 360, 380, and 400 are provided for each term of the error location polynomial (31). The arithmetic operation results of the terms are added by three adders 418, 420, and 422 and the error location information ELP is outputted. The arithmetic operating circuit section 340 executes an arithmetic operation of the term of the coefficient $\gamma_3$ of the error location polynomial. In the arithmetic operating circuit section 340, a part of the first error location arithmetic operating circuit 318 to execute the error search with respect to the fixed length subblock is constructed by a first multiplier 342, multiplexers 344 and 346, a register 348, and a second multiplier 350. On the other hand, a part of the second error location arithmetic operating circuit section 320 to perform the dummy search and error search of the variable length subblock is constructed by a multiplexer 352, a register 354, and a second multiplier 356. In the actual operation of the error location arithmetic operating circuit section side, the circuit operation in which the first multiplier 342 and register 348 on the fixed length subblock side are commonly used is performed. The arithmetic operating circuit section 360 executes the error search of the term of the coefficient $\gamma_1$. The arithmetic operating circuit section 380 executes the arithmetic operation of the term of the coefficient $\gamma_0$. Further, the arithmetic operating circuit section 400 executes the arithmetic operation of the term of the coefficient $\gamma_2$. Each of the arithmetic operating circuit sections 360, 380, and 400 has substantially the same circuit construction as the arithmetic operating circuit section 340.

Figure 27A:
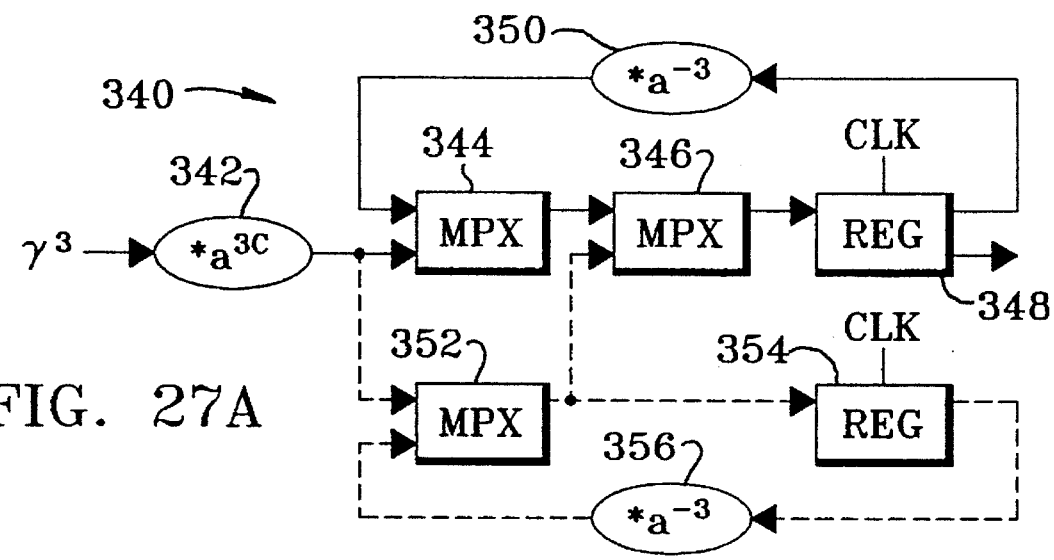
FIGS. 27A to 27C explanatory diagrams of the arithmetic operation of the error location arithmetic operating circuit section.
Figure 27B:
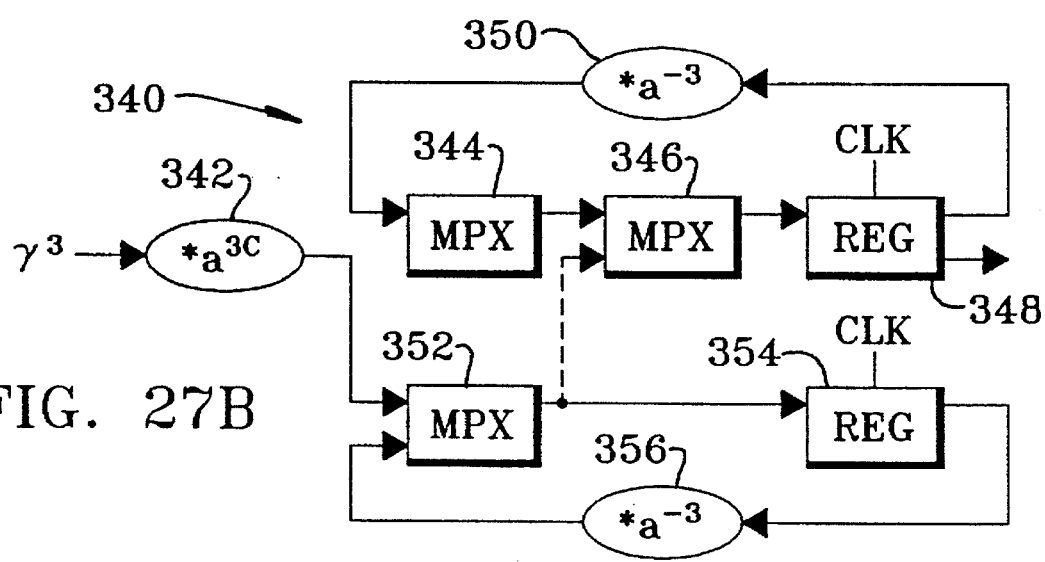
Figure 27C:
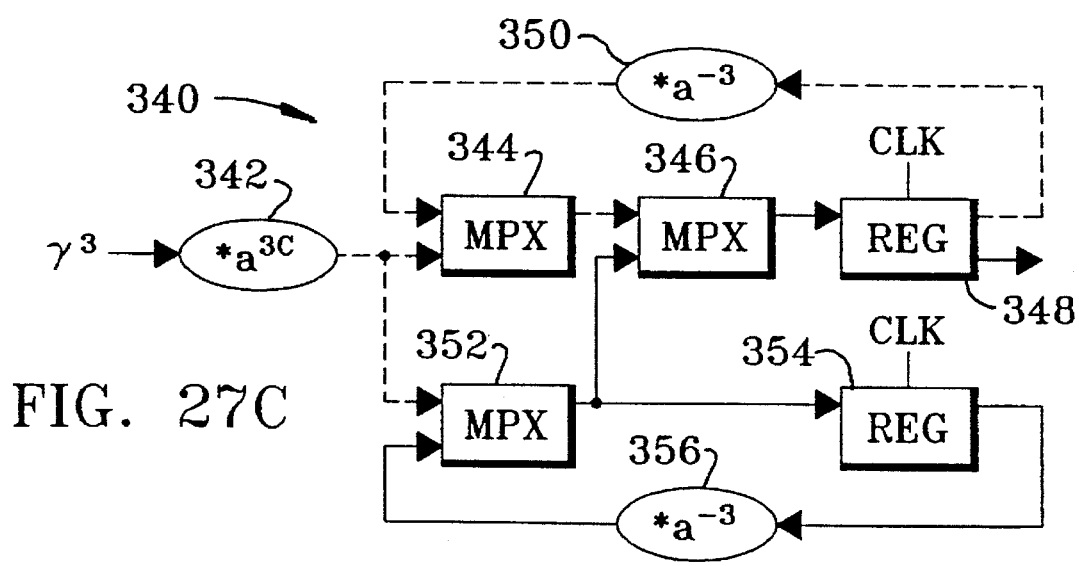

FIGS. 27A to 27C show the arithmetic operations of the error search of the fixed length subblock and the dummy search and error search of the variable length subblock with respect to the arithmetic operating circuit section 340 of the term of the coefficient $\gamma_3$ in FIG. 26 as an example. FIG. 27A shows the arithmetic operation of the fixed length subblock. First, since the syndromes are formed at the timing when the reception of the fixed length subblock is finished, the coefficient $\gamma_3$ is supplied to the first multiplier 342 on the basis of the syndromes formed and is multiplied to an element $\alpha^{3c}$ of a finite field. The result is stored into the register 348 through the multiplexers 344 and 346. Since the element $\alpha^{3c}$ which is multiplied by the multiplier 342 relates to the fixed length subblock, C=N−1. The value stored in the register 348 is outputted to the adder 418 in FIG. 26 as a value of the term of the coefficient $\gamma_3$ of the head byte of the fixed length subblock and is added to the results of the other circuit sections 360, 380, and 400. The addition result is outputted as an ELP signal at the head byte location from the adder 422. With respect to the bytes after the second byte of the fixed length subblock, the arithmetic operation of the error search such that the value of the register 348 is supplied to the multiplier 350 every byte and is multiplied to $\alpha^{-3}$ and the result is again stored into the register 348 again is repeated.

FIG. 27B shows the arithmetic operation in the case where during the arithmetic operation of the dummy search of the fixed length subblock in FIG. 27A, the timing reaches the start location of the fixed length subblock which was presumed with respect to the next variable length subblock and the dummy search is started. At the start timing of the dummy search, the syndromes are produced with respect to the variable length subblock subsequent to the fixed length subblock. The coefficient $\gamma_3$ of the error location polynomial is inputted to the multiplier 342. In a manner similar to the case of the fixed length subblock, the value multiplied with $\alpha^{3c}$ is stored into the register 354 through the multiplexer 352. In this instance, the multiplexer 346 has been switched to the multiplier 350 side which is executing the dummy search of the fixed length subblock and disconnects the register 354 side. Therefore, the value stored in the register 354 is not outputted. After the multiplication result was stored into the register 354, at the next byte location, the dummy search such that the value of the register 354 is inputted to the multiplier 356 and is multiplied to $\alpha^{-3}$ and the result is again stored into the register 354 is executed. In this instance, even in the upper multiplier 350, the value of the register 348 is multiplied with $\alpha^{-3}$ and the result is stored into the register 348. The stored result is outputted to the outside, so that the effective error search is performed.

FIG. 27C shows a state in which the timing reaches the start location of the variable length subblock and the operating mode is switched to the arithmetic operation of the ordinary error search with respect to the variable length subblock. That is, the multiplexer 346 is switched to a state in which the arithmetic operation result on the side of the register 354, multiplier 356, and multiplexer 352 is stored into the register 348. Therefore, the result obtained by inputting the value of the register 354 to the multiplier 356 and multiplying is stored into the register 348 through the multiplexers 352 and 346 and is outputted to the outside. The arithmetic operation result is stored into the register 354.

Figure 28:
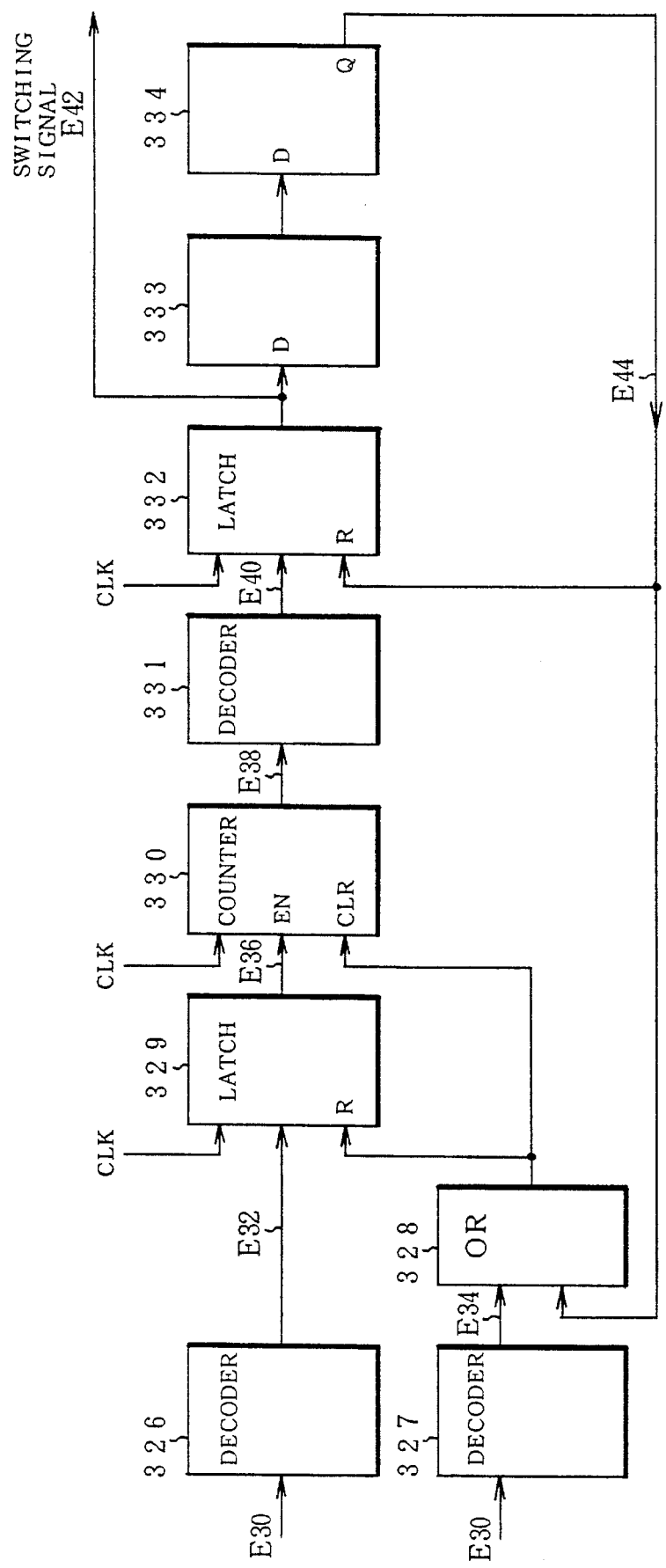
FIG. 28 is a circuit block diagram of a control circuit section of an error location arithmetic operation.
Figure 29:
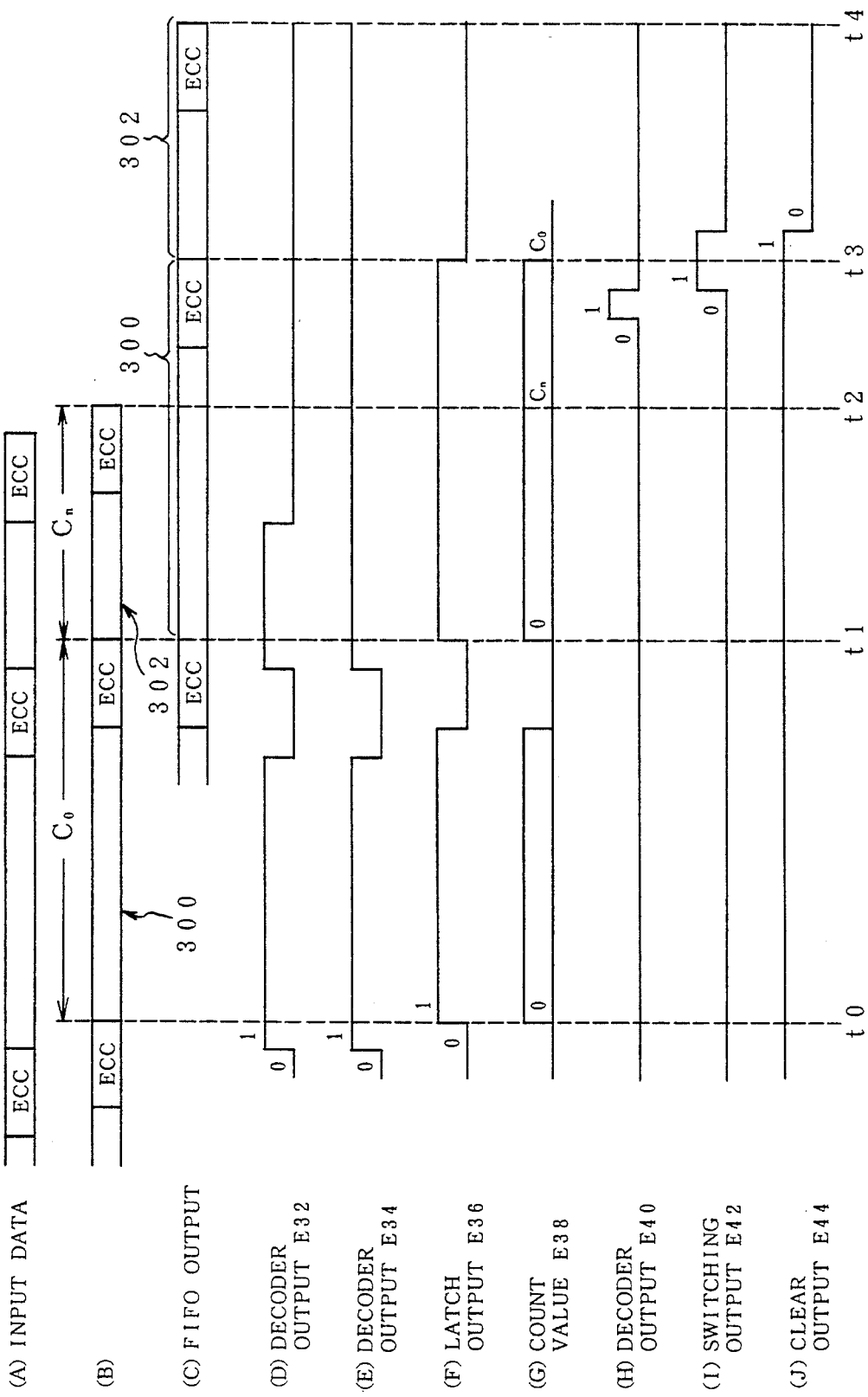
FIG. 29 is a timing chart of the control circuit sections.

FIG. 28 shows an embodiment of the control circuit section 324 to control the error location arithmetic operating circuit section 316 in FIG. 26. First, the mode signal E30 is inputted to decoders 326 and 327. The mode signal E30 is a signal to discriminate the data section and ECC section of each subblock in the input data of (A) in FIG. 29. The decoder 326 which received the mode signal E30 generates a decoder output E32 whose bit is set to 1 in the data mode in (D) in FIG. 29. On the other hand, the decoder 327 discriminates a difference between the ECC section of the fixed length subblock 300 in (E) in FIG. 29 and the ECC section of the variable length subblock 302 and generates a decoder output E34 whose bit is set to 1 at the timing of the data section of the variable length subblock 302. The output E32 of the decoder 326 is latched into a latch 329 at the next clock timing, so that a latch output E36 in (F) in FIG. 29 is generated. The latch output E36 of the latch 329 becomes an enable signal for a counter 330. The counting operation of the clocks CLK is started from the timing at which the latch output E36 rises to bit 1. Since the counter 330 is set into the enable state by the latch output E36, as shown in (F) and (G) in FIG. 29, the counting operation is repeated for an enable period of time during which the latch output E36 is set to bit 1 with respect to the fixed length subblock 300 in (B) in FIG. 29. On the other hand, when the variable length subblock 302 is inputted, the enable state of the latch output E36 is maintained for a period of time of the fixed length CO of the fixed length subblock, so that the counter 330 executes the counting operation for a period of time from 0 to CO. When a count value E38 of the counter 330 reaches the timing t3 to switch from the dummy search of the variable length subblock to the ordinary error search, namely, when the counter value CO is discriminated by the decoder 331, a decoder output E40 of a decoder 331 is set to bit 1 and is latched into a latch 332. A switching signal E42 to switch from the dummy search to the ordinary error search is outputted. An output of the latch 332 is further fed back as a reset signal through latches (D-FFs) 333 and 334. Therefore, the latch 332 is reset two clocks later. The switching signal E42 is returned to bit 0. At this timing, the resetting of the latch 329 and the clearing of the counter 330 are executed through an OR gate 328.

Figure 30:
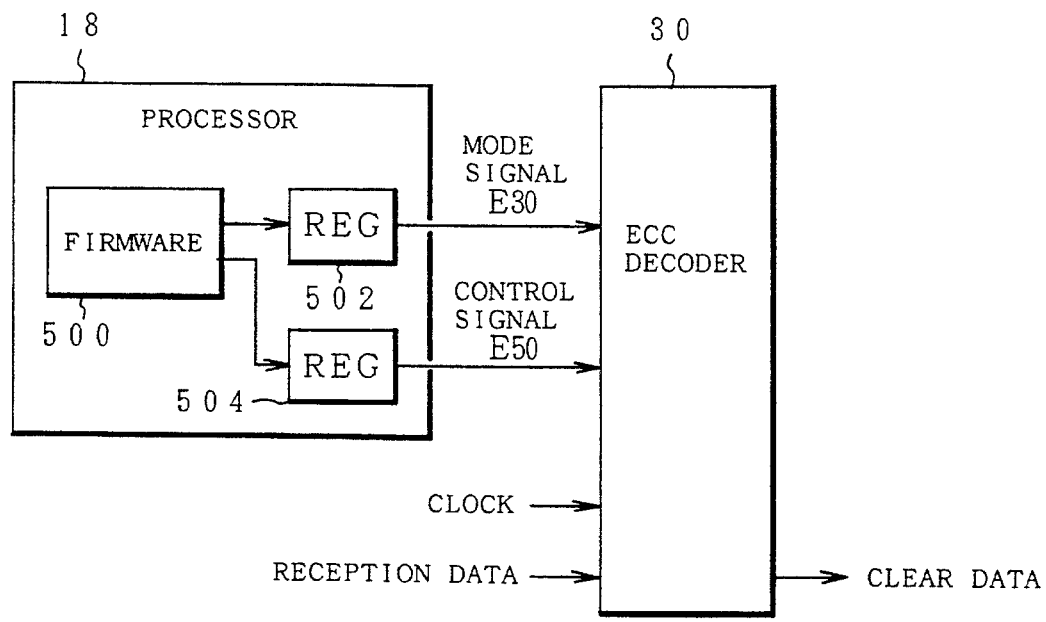
FIG. 30 is a block diagram of the second embodiment having the error correcting function of variable length subblocks.

FIG. 30 shows another embodiment for performing the error correction of the variable length subblock. The embodiment is characterized in that the control circuit section is provided on the formatter control processor 18 side without providing the control circuit section on the ECC decoder 30 side as shown in FIG. 24. Namely, both of the function to form the mode signal E30 and the function of the control circuit section as shown in FIG. 12 are built in the formatter control processor 18 as a firmware 500. The mode information from the firmware 500 is stored into a register 502 and is outputted as a mode signal E30 to the ECC decoder 30. Control information formed synchronously with the data transmission by the firmware 500 is stored into a register 504 and is outputted as a control signal E50 to the ECC decoder 30.

Figure 31:
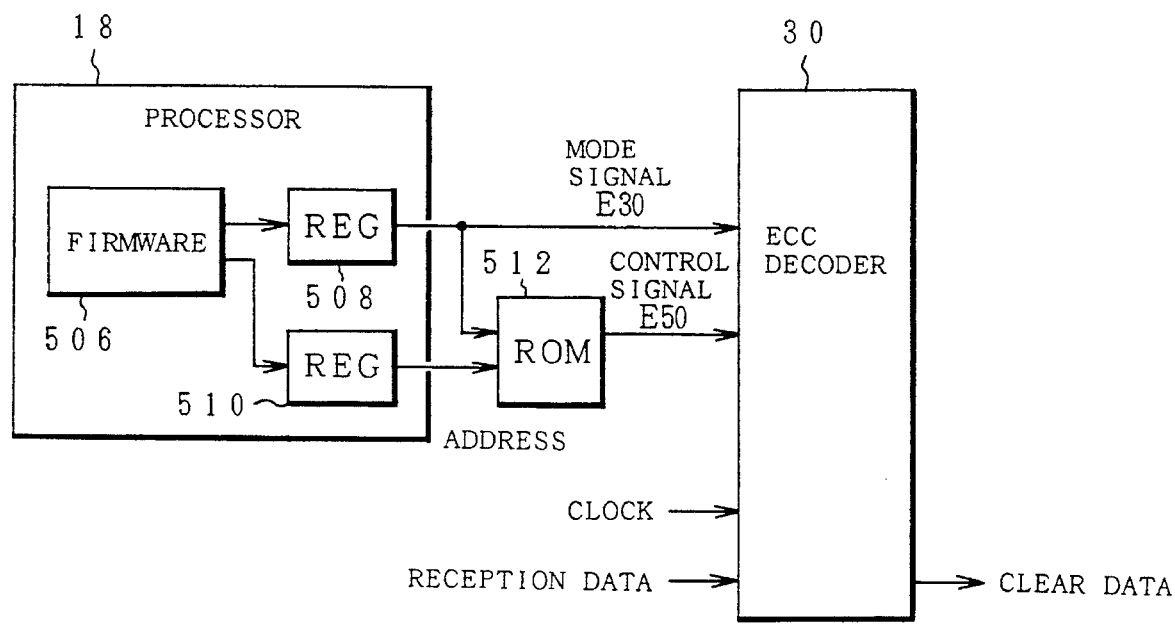
FIG. 31 is a block diagram of the third embodiment having the error correcting function of the variable length subblocks.

FIG. 31 shows an embodiment using an ROM in the control circuit section. According to the embodiment, various kinds of control signals E50 for the ECC decoder 30 are stored as data in an ROM 512. A firmware 506 provided for the formatter control processor 18 produces address information to select a bit pattern of a predetermined control signal in accordance with the mode and state of the received data and designates an address in the ROM 512 from a register 510, thereby allowing the control signal E50 of the corresponding bit pattern to be outputted.

Further, in the firmwares 500 and 506 provided for the formatter control processor 18 in FIGS. 30 and 31, control signals for not only the error correction in the reading mode but also the ECC encoder 22 and EDC encoder 38 in FIG. 21 in the writing mode are formed and generated on the basis of the mode signal at that time.

Figure 32:
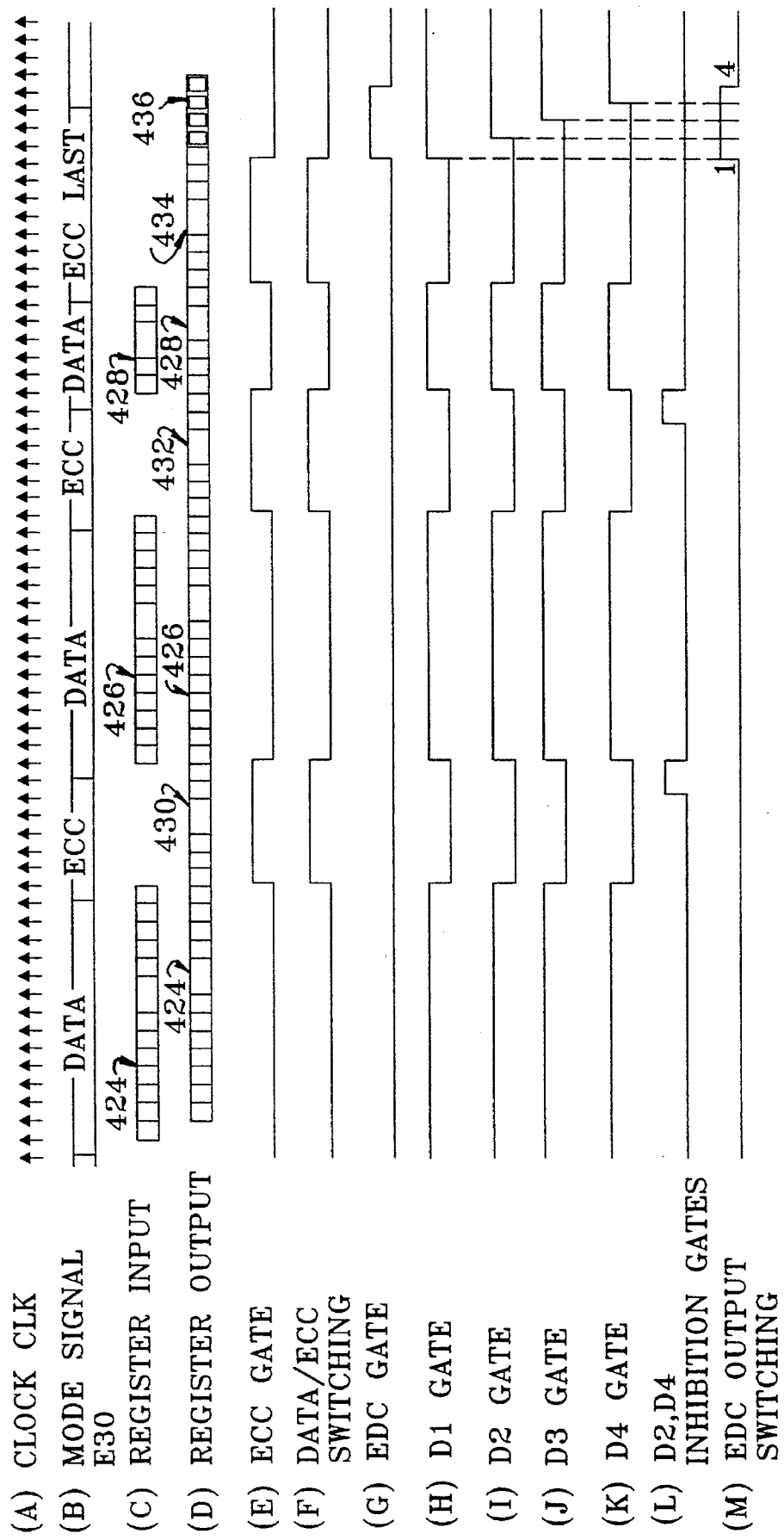
FIG. 32 is a timing chart for the ECC encoding to form ECC check bytes synchronously with the data transfer.

FIG. 32 is a timing chart for the encoding operation for adding ECC check bytes and EDC check bytes synchronously with the transfer of the write data by the formatter control processor 18 in FIGS. 30 and 31.

(A) in FIG. 32 shows a clock CLK and the data transfer is executed in response to the mode signal E30 in (B) in FIG. 32. Subblock data in (C) in FIG. 32 is inputted to a register provided at the input stage of the ECC encoder 22 and EDC encoder 38 in FIG. 21. The register input is shown as an example with respect to the case where a variable length subblock 428 is inputted subsequent to two fixed length subblocks 424 and 426. The ECC encoder 22 and EDC encoder 38 which received such a register input execute the writing operation to a disk medium or the like by a register output of (D) in FIG. 32. As shown in (D) in FIG. 32, ECC check bytes 430, 432, and 434 are added after the fixed length subblocks 424 and 426 and variable length subblock 428 and the resultant subblocks are outputted. Further, EDC check bytes 436 (D1, D2, D3, D4) formed by the EDC encoder 38 are added to the last location. (E) in FIG. 32 relates to an ECC gate and shows a timing of the ECC check bytes after the subblocks 424, 426, and 428 which were register inputted. (F) in FIG. 32 shows a switching signal between the data and the ECC. The switching signal is synchronized with the ECC gate. (G) in FIG. 32 relates to a gate to add the EDC check bytes 346 which are added at last. D1 to D4 gates in (H) to (K) in FIG. 32 are gates to fetch the subblocks 424, 426, and 428 for calculating the EDC check bytes D1 to D4 in the EDC encoder 38 in FIG. 21. (L) in FIG. 32 relates to a gate to inhibit the fetching of the byte data at the timings of the ECC check bytes with respect to the EDC check bytes D2 and D4 in the EDC encoder 38. Further, (M) in FIG. 32 relates to a signal to switch the mode of the multiplexer 24 in FIG. 21. For a period of time during which the mode switching signal at the high level, the output of the EDC encoder 38 is selected. The EDC check bytes 436 of four bytes are added at the last location of the series of data to which the ECC check bytes were added.

Figure 33B:
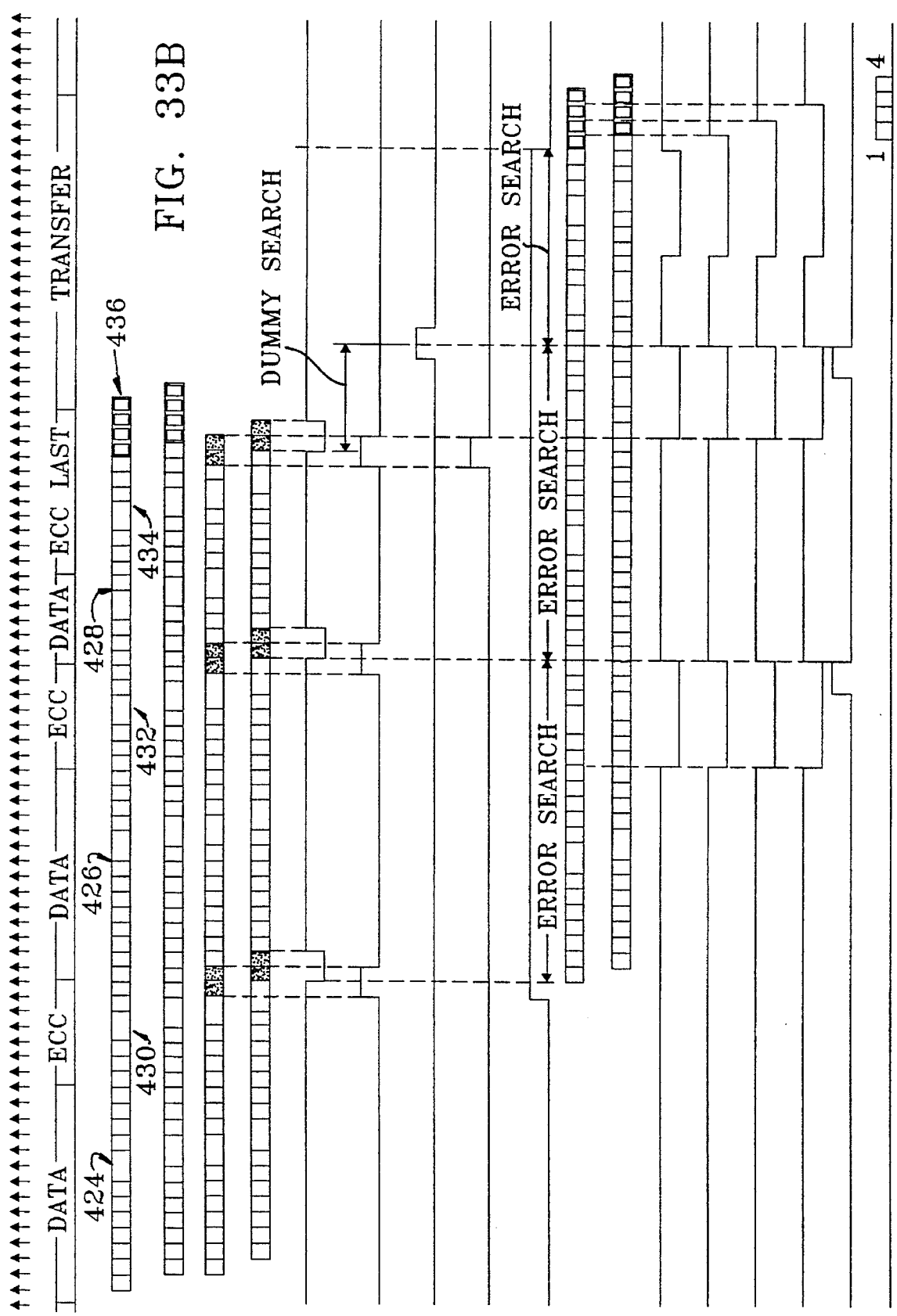
FIG. 33 is a timing chart for the ECC decoding for correcting errors synchronously with the data transfer.

FIG. 33 shows the error detecting and correcting operations synchronized with the data transfer by the formatter control processor 18 in FIGS. 30 and 31. The mode signal E30 in (B) in FIG. 33 is obtained synchronously with the clock CLK of (A) in FIG. 33. An input of two fixed length subblocks and one variable length subblock shown in (C) in FIG. 33 is derived as a register input to the ECC encoder 22. Since it corresponds to the data written register output of (D) in FIG. 32, such a register input is shown by the same reference numeral. A register input of (C) in FIG. 33 is delayed by one clock and becomes an input to the FIFO buffer memory 32 in (D) in FIG. 33. In the ECC encoder 22, the syndromes as syndrome register inputs 1 and 2 shown in (E) and (F) in FIG. 33 are formed synchronously with the FIFO inputs every byte input synchronized with the clock. As shown at a timing of a fixed length syndrome forming gate of (H) in FIG. 33, the syndromes are respectively formed with respect to the fixed length subblocks 424 and 426. The syndromes formed are read out at the timing of the syndrome register gate of (G) in FIG. 33. On the basis of the syndromes, the coefficients $\gamma_0$ to $\gamma_3$ of the error location polynomial for the error location arithmetic operating circuit section 316 in FIG. 25 are obtained and supplied. Therefore, as shown in an error search gate of (K) in FIG. 33, the error search is executed about the fixed length subblocks 424 and 426 at the timing of the syndrome register gate.

With respect to the variable length subblock 428, the syndromes of the variable length subblock are formed at the timing of the formation of the variable length syndromes of (J) in FIG. 33 like a syndrome register input 1 of (E) in FIG. 33. Subsequently, a syndrome register input 2 of (F) in FIG. 33 is obtained at the timing of a syndrome register gate of (G) in FIG. 33. The coefficients $\gamma_0$ to $\gamma_3$ of the error location polynomial obtained from the syndromes are similarly set into the error location arithmetic operating circuit section 316 in FIG. 9. The dummy search of the fixed length subblock 426 is executed from this time point in parallel with the error search of the fixed length subblock 426. As will be obviously understood from an FIFO output of (L) in FIG. 33, at the timing of the end of the error search of the preceding fixed length subblock 426, an error search switching signal shown in (I) in FIG. 33 is made effective. The searching mode is switched from the dummy search of the variable length subblock 428 to the ordinary error search. The error correction corresponds to the interleave upon encoding and the syndromes are formed separately with respect to the even bytes and odd bytes of the received subblock.

(M) to (S) in FIG. 33 relate to processes of the EDC decoder 40 in FIG. 21. The clear data which was error corrected by the EX-OR circuit 34 on the basis of the error location signal and error value from the ECC decoder 30 is transmitted to the upper controller. As shown in (M) in FIG. 33, the clear data becomes a register input of the EDC decoder 40 at the timing that is delayed by one clock. For the register input, by setting the D1 to D4 gates and D2 and D4 inhibition gates in (N) to (R) in FIG. 33, the erroneous correction or non-detection in the ECC decoder 30 using the EDC check bytes 436 is detected. (S) in FIG. 33 shows a decoding switching timing of the EDC check bytes 436.

[Error correction of header and counting section]

In the CKD format to perform the variable length control, a subblock for control of a fixed length as a header and counting section is provided at the head of a record. A data length of the control subblock is shorter than that of the fixed length subblock constructing a record as user data. In the on-the-fly error correcting system, a condition such that the error correction is executed by setting the fixed length subblock subsequent to the head header and counting section to one unit is used as a prerequisite. Therefore, the delay amount by the FIFO buffer memory or the like for error correction is set to an amount corresponding to the data length of the fixed length subblock.

Figure 34:
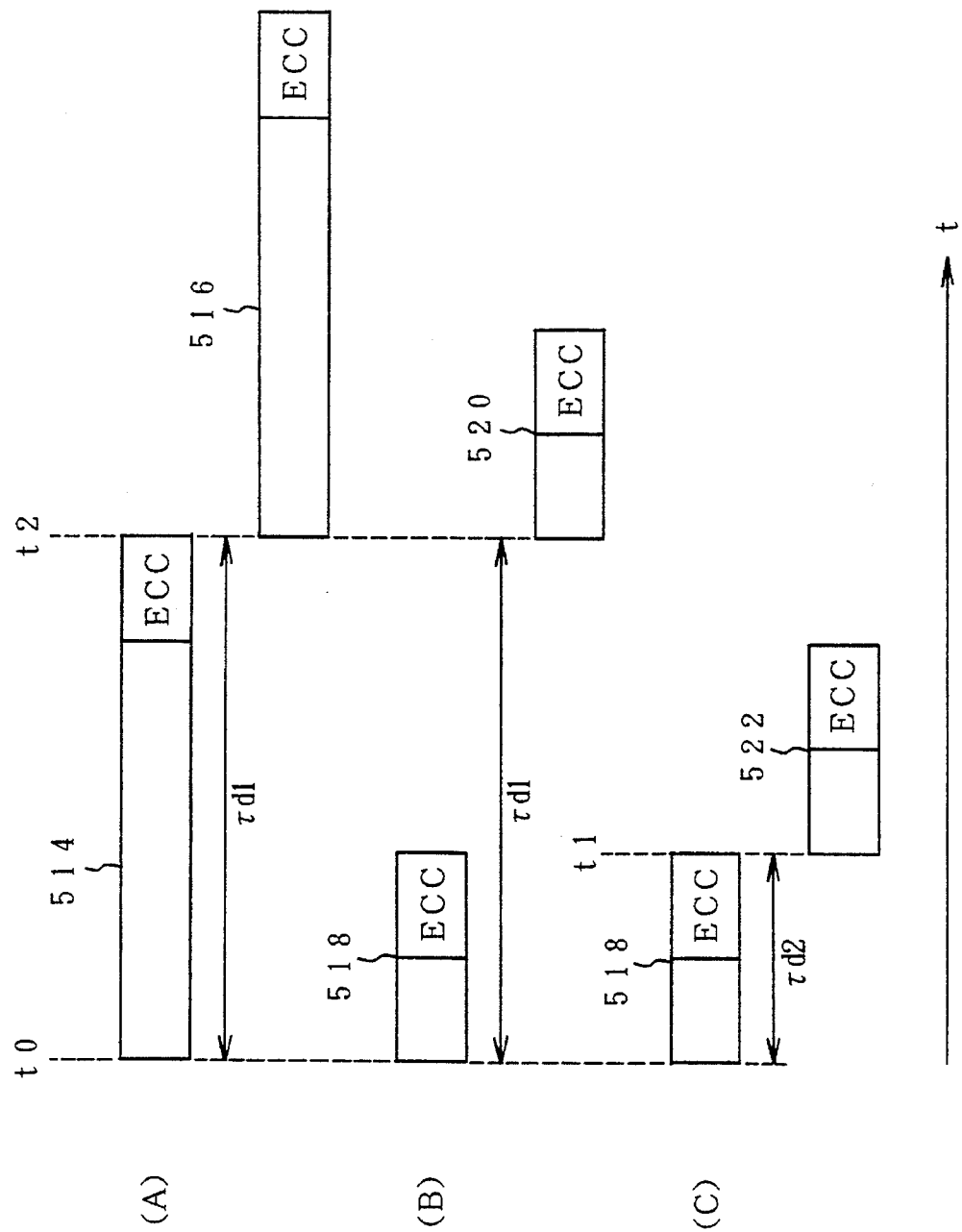
FIG. 34 is an explanatory diagram of the delay at the time of the error correction of a header and counting section and subblocks for data.

(A) in FIG. 34 shows the delay operation at the time of the error correction of a fixed length subblock 514. When the fixed length subblock 514 is inputted at time t0, the input of up to the last byte of the fixed length subblock 514 is needed to form the syndromes. Therefore, a delay time τd1 corresponding to the byte length of the fixed length subblock 514 for a time interval from t0 to t2 is necessary. Therefore, the error corrected data is sent to the upper controller from time t2 after the elapse of the delay time τd1.

(B) in FIG. 34 shows the delay operation at the time of the error correction of the fixed length subblock 518 of the header & counting section. A byte length of a fixed length subblock 518 of the header & counting section is shorter than that of the fixed length subblock 514 of the data section. The control subblock 518 serving as a header & counting section is transferred to the upper controller and is used for the subsequent control judgment of the reading/writing process of the data section. Therefore, it is demanded that the delay time for the upper controller is reduced as much as possible. In the on-the-fly error correcting system, however, the fixed length subblock 514 is delayed by the delay time at the time of the error correction. Therefore, with respect to the fixed length subblock 518 for control of the header & counting section as well, in a manner similar to the above, it is sent as an error corrected fixed length subblock 520 for control to the upper apparatus after the delay time τd1, so that the time delay fairly increases. When the time delay is so large as mentioned above, the fixed length subblock of the data section must not be received until the corrected fixed length subblock 520 for control is received and decoded by the upper controller and the necessary control is executed to the drive side. Therefore, a gap between the control fixed length subblock at the record head and the subsequent data section has to be increased in the recording state of the disk medium in accordance with the delay amount. Such a long gap causes a problem of the decrease in recording capacity of the disk medium.

According to the invention, therefore, as shown in (C) in FIG. 34, when it is judged that the received data is the control subblock 518 of the header & counting section, the data is delayed by only a delay time τd2 according to the byte length of the control fixed length subblock 518, thereby enabling an error corrected subblock 522 for control to be transmitted.

Figure 35:
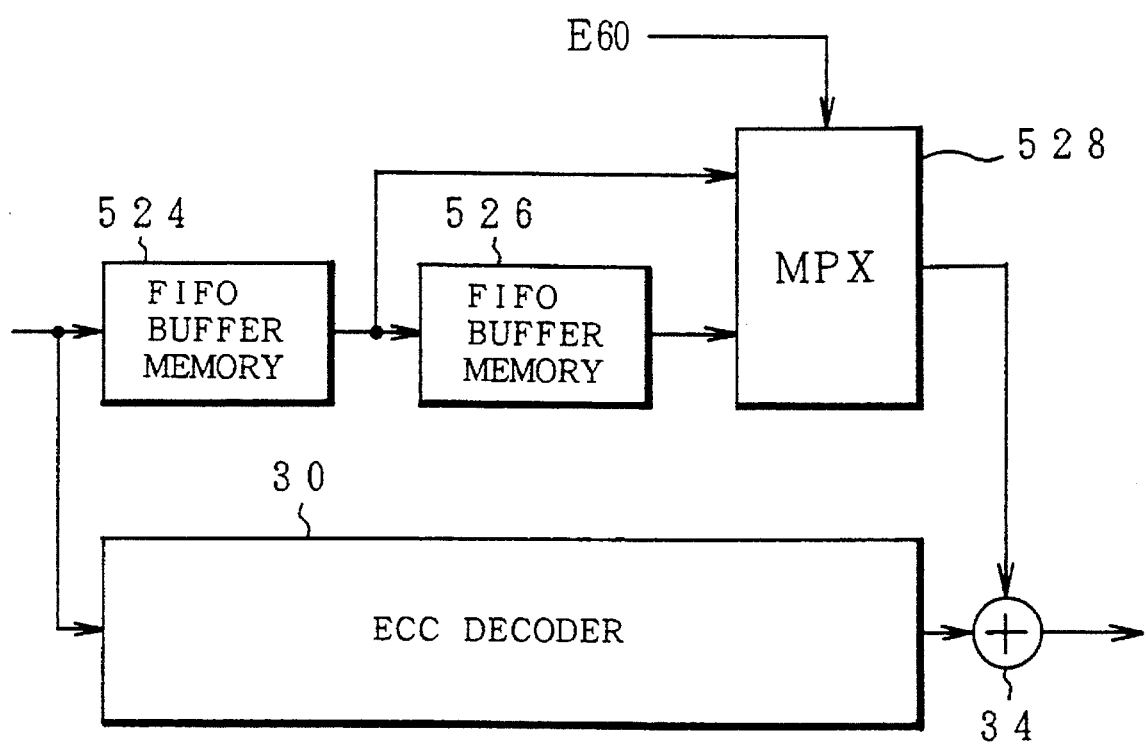
FIG. 35 is a block diagram of a delay circuit using FIFO memories.

FIG. 35 shows an embodiment for switching a delay amount according to the subblock for control. The embodiment is characterized in that the FIFO buffer memory provided for the ECC decoder 30 in order to delay the received data by only the time necessary for the error correction is devised. First, the FIFO buffer memory is separated into a first FIFO buffer memory 524 and a second FIFO buffer memory 526. The first FIFO buffer memory 524 gives a delay amount of the delay time τd2 according to the byte length of the control subblock of the header & counting section to the received data. The second FIFO buffer memory 526 has a capacity enough to give a delay amount (τd1−τd2) obtained by subtracting the delay time τd2 of the subblock for control from the delay time τd1 of the subblock for data to the received data from the first FIFO buffer memory 524. Outputs of the FIFO buffer memories 524 and 526 are supplied to a multiplexer 528. The multiplexer 528 is switched by a switching signal E60 based on the discrimination result between the control subblock and the data subblock. Namely, when the control subblock is detected, the output of the FIFO buffer memory 524 is selected and supplied to the EX-OR circuit 34. When the data subblock is detected, the output of the FIFO buffer memory 526 is selected and supplied to the EX-OR circuit 34. That is, in case of the data subblock, the error correction result is obtained by the output selection of the FIFO buffer memory 524 after the elapse of the delay time τd2 by the FIFO buffer memory 524. After the elapse of a short delay time, the error corrected subblock of the header & counting section can be transmitted to the upper controller. With respect to the fixed length subblock for data, the chain search arithmetic operation in the ECC decoder 30 is as mentioned above. However, with regard to the control subblock of the header & counting section, an arithmetic operating circuit based on an exclusive-use error location polynomial is separately provided.

Figure 36:
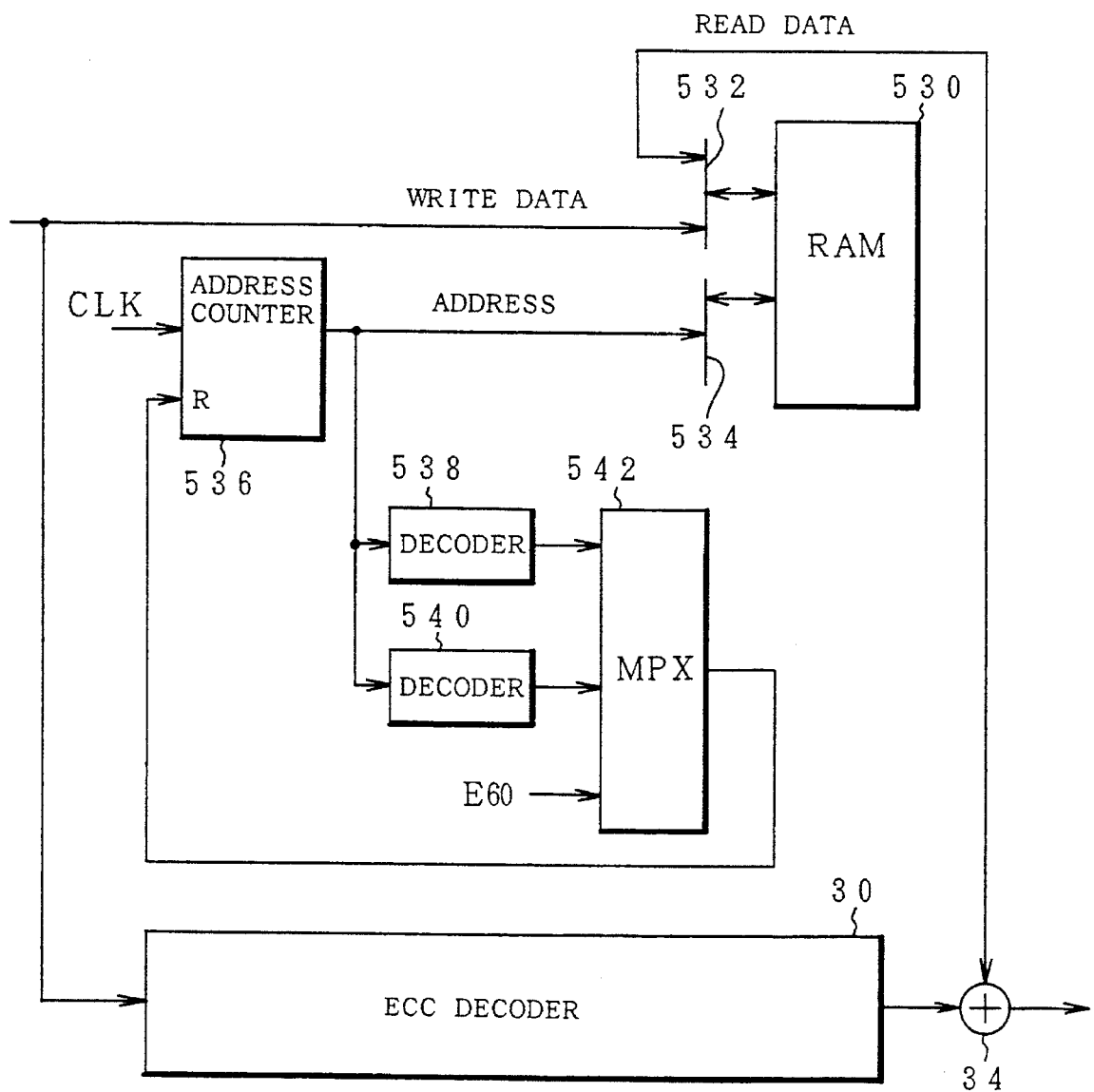
FIG. 36 is a block diagram of a delay circuit using an RAM.

FIG. 36 shows an embodiment using a readable and writable RAM with respect to the error correction of the control subblock of the header & counting section. The byte data received through a data bus 532 is written in an RAM 530 synchronously with a byte clock. At the same time, the byte data which was written one subblock before is also read out synchronously with the byte clock and is supplied to the EX-OR circuit 34. Specifically speaking, the former half of the byte clock period is set to a writing cycle of the byte data into the RAM 530. The latter half of the byte clock period is set to the reading cycle of the byte data from the RAM 530. An address counter 536 generates a write address which changes in a range of a few bytes of the subblock and a read address which is deviated from the write address by only the subblock length, namely, a read address of the byte data written one subblock before synchronously with the byte clock. The maximum value of the addresses generated is determined by a reset signal from the outside. The addresses of the address counter 536 are decoded by a first decoder 538 and a second decoder 540. The first decoder 538 discriminates that the address designation of the RAM 530 by the address counter 536 was executed by only the number of times as many as the number of bytes corresponding to the byte length of the header & counting section, and generates a decoding output, and resets the address counter 536. The second decoder 540 discriminates that the address designation by the address counter 536 was performed by only the number of times as many as the number of bytes of the fixed length subblock for data, and generates a decoding output, and resets the address counter 536. A multiplexer 542 selects either one of outputs of the decoders 538 and 540 in accordance with the switching control signal E60 based on the detection of the control subblock and data subblock. Namely, when the control subblock of the header & counting section is detected, the multiplexer 542 selects and outputs the decoding output of the first decoder 538 by the switching control signal E60. On the other hand, when the fixed length subblock for data is detected, the multiplexer 542 selects the decoding output of the second decoder 540 by the switching control signal E60. Therefore, with respect to the control subblock of the header & counting section, the address designation of the number of times corresponding to the number of bytes is discriminated by the first decoder 538. Therefore, after the fixed length subblocks for control of the number as many as the number of bytes were written into the RAM 530, the reading operation is performed and the error correction is executed by the delay amount according to the byte length. With respect to the fixed length subblock for data, since the addresses of the number as many as the number of bytes are discriminated by the second decoder 540, after the fixed length subblocks for data of the number as many as the number of bytes were written into the RAM 530, the reading operation is executed and the error correction is performed by the delay amount according to the byte length.

According to the invention as mentioned above, the state having no error, the state having correctable errors, the state having uncorrectable errors, and the abnormal correcting operation in the lower error correcting unit can be recognized by the upper control processor. The correcting operation of the memory apparatus can be known and the correcting operation can be monitored from the outside. Therefore, the reliability of the system is improved.

When the data is written, the error detection codewords are formed by adding the check bytes for error detection formed from the data section. When the data is read out, by decoding the error detection codes after the error correction was performed, the non-detection and erroneous correction at the time of error correction can be detected.

The arithmetic operating circuit to obtain the error location coefficients through the simultaneous equations of (n) unknowns can be simply constructed. The circuit amount can be reduced to ½ by commonly forming the inputs among the logic circuits constructing the arithmetic operating circuit.

In the variable length control according to the CKD format, after the dummy search which presumed the fixed length subblock was executed with respect to the error correction of the last variable length subblock, the search mode is switched to the ordinary error search at the start of the fixed length subblock. Thus, there is no need to individually provide the arithmetic operating circuit of the error search every length of variable length subblock which changes. The error correction of the variable length subblock can be efficiently executed by the simple arithmetic operating circuit construction.

Further, by performing the error correction by the delay amount adapted to the data length of the subblock with regard to the error correction of the fixed length subblock for control of the header & counting section at the record head of the CKD format, the delay of the error correction data of the header & counting section for the upper controller can be minimized. There is no need to increase the gap between the header & counting section at the head on the disk medium and the data section. Therefore, the proper on-the-fly error correction can be realized without reducing the capacity of the disk medium.

Although the above embodiments have been described with respect to the case where the number of correctable errors has been set to (n=3) as an example, the invention can be also similarly applied to a multibyte error correction exceeding (n=3). Although the embodiments have been described with respect to the case where the ECC check bytes are formed from the subblocks in which the user data was interleaved on a byte unit basis and are added as an example, the ECC check bytes can be also formed every subblock and added without interleaving. The invention, further, is not limited by the numerical values shown in the embodiments.

What is claimed is:

1. An on-the-fly multibyte error correcting system in which check bytes and syndromes are formed by a generator polynomial such that symbols of a codeword are constructed by elements of a Galois field GF ($2^m$), which is defined by an arbitrary natural number (m), and that roots $\alpha^a$, $\alpha^{a+1}$, . . . , $\alpha^{a+2n-1}$ ($\alpha$ denotes a primitive element of said Galois field; (a) is an arbitrary natural number and satisfies a+2n−1≦$2^m$−1; and (n) is a constant indicative of the maximum number of correctable error bytes) are possessed as solutions, and which corrects up to (n) byte errors in said codeword by processing (2n) syndrome bytes, comprising:

an error correction code decoder for deciding coefficients $\beta_0$ to $\beta_{t-1}$ (where, t≦n, t denotes a variable indicative of the number of error bytes generated) of an error location polynomial from said syndrome bytes each time said codeword is inputted, thereafter for deciding an error byte location and an error byte correction value synchronously with a data transfer, and for correcting the errors while continuously transferring a byte stream of said codeword;

a status reporting section for reading, by a control processor, status information indicative of any one of a state having no error, a state having correctable errors, and a state having uncorrectable errors at the time of a reading operation decided by said error correction code decoder, thereby enabling said status information to be reported to an upper controller just after user data of one record was read from a memory medium; and a correcting state detecting section for detecting a corrected code, an error correction code, or an abnormal correcting operation on a codeword unit basis from the operating state of said error correction code decoder.

2. A system according to claim 1, wherein said status reporting section receives a first detection signal indicative of the presence of the correctable errors or a second detection signal indicative of the presence of the uncorrectable errors from said error correction code decoder and sends the corresponding status information to said control processor, and when both of said first and second detection signals are not obtained, said status reporting section sends the status information indicative of no error to said control processor.

3. A system according to claim 1, wherein said correcting state detecting section makes one codeword correspond to one subblock and comprises:

a corrected subblock detecting section for correcting the corrected subblock having the errors which can be corrected by said error correction code decoder;

an erroneous correction subblock detecting section for detecting the subblock whose errors were erroneously corrected by said error correction code decoder; and an abnormal operation monitoring section for detecting an abnormality of the correcting operation by said error correction code decoder.

4. A system according to claim 3, wherein each of said corrected subblock detecting section, said erroneous correction error detecting section, and said abnormal operation monitoring section makes one codeword correspond to one subblock, and each time the reading operation of the subblock in the user data constructed by one or a plurality of subblocks is finished, the detecting state is read by said control processor, thereby enabling the detecting state to be reported to said upper controller.

5. A system according to claim 4, wherein said corrected subblock detecting section latches the detection signal of said error byte location obtained during the correcting process of said subblock by said error correction code decoder until the end of the correction of the subblock and sends to said control processor, and said control processor reads the corrected subblock detection signal from said corrected subblock detecting section synchronized with a transfer end timing of the subblock, thereby enabling said corrected subblock detection signal to be reported to said upper controller.

6. A system according to claim 5, wherein said erroneous correction subblock detecting section compares the number of errors which is calculated in a step of obtaining the coefficients ($\beta_0$ to $\beta_{t-1}$) of the error location polynomial from the syndromes ($S_0$ to $S_5$) in said error correction code decoder and the number of errors which is decided from said error location polynomial, and when both of said error numbers differ, said erroneous correction subblock detecting section detects that the subblock was erroneously corrected, and outputs such a detection result to said control processor.

7. A system according to claim 3, wherein said abnormal operation monitoring section detects the abnormal operation of said error correction code decoder on the basis of the detection output of said corrected subblock detecting section and a detection result of the uncorrectable errors and non-zero syndromes obtained by said error correction code decoder.

8. A system according to claim 3, wherein said abnormal operation monitoring section detects the abnormal operation in the case where a non-zero syndrome is not detected and the correctable errors are detected, in the case where the non-zero syndrome is not detected and the uncorrectable errors are detected, or in the case where the correctable errors and the uncorrectable errors are not detected and the non-zero syndromes are detected.

9. An on-the-fly multibyte error correcting system in which check bytes and syndromes are formed by a generator polynomial such that symbols of a codeword for error correction are constructed by elements of a Galois field GF ($2^m$), which is defined by an arbitrary natural number (m), and that roots $\alpha^a$, $\alpha^{a+1}$, $\alpha^{a+2}$, ..., $\alpha^{a+2n-1}$ ($\alpha$ denotes a primitive element of said Galois field; (a) is an arbitrary natural number which satisfies $a+2n+1 \leq 2^m-1$; and (n) is a constant indicative of the maximum number of correctable error bytes) are possessed as solutions, and (n) byte errors in said codeword are corrected by processing (2n) syndrome bytes, comprising:

an error correction code encoder for forming the check bytes for error correction by using said generator polynomial from write data of one subblock when data is written to a memory medium and for constructing the codeword of said one subblock by arranging said error correction check bytes after said write data;

an error detection code encoder performing a process for forming a plurality of check bytes D1, D2, ..., Dn for error detection from user data constructed by one or a plurality of subblocks when data is written to said memory medium, a process for arranging said error detection check bytes D1, D2, ..., Dn after one or a plurality of codewords corresponding to the user data that is outputted from said error correction code encoder, and a process for writing the resultant codewords to said memory medium;

wherein said forming process, said arranging process and said writing process are executed in parallel with said error correction code encoder;

an error correction code decoder for deciding coefficient $\beta_o$ to $\beta_{t-1}$ ($t \leq n$; (t) denotes a variable indicative of the number of error bytes generated) of an error locator polynomial from said syndrome bytes each time said codeword read out from said memory medium is inputted, and thereafter, for deciding an error byte location and an error byte correction value synchronously with a data transfer, by correcting errors while continuously transferring a byte stream of said codeword; and an error detection code decoder performing a process for receiving corrected user data and check bytes D1, D2, ..., Dn for error detection by said error correction code decoder, a process for forming the syndromes, a process for detecting an erroneous correcting operation including an erroneous correction or a non-detection in said error correction code decoder, and a process for reporting said detected erroneous correcting operation to an upper controller;

wherein said receiving process, said forming process, said detecting process and said reporting process are executed in series with said error correction code decoder.

10. A system according to claim 9, wherein said error detection code encoder has a code generating section for generating said plurality of error detection check bytes D1, D2, ..., Dn having different codeword lengths by a primary generator polynomial.

11. A system according to claim 10, wherein said code generating section comprises:

an exclusive-OR circuit for receiving byte data $C_n$ to $C_1$ of said write user data for each of said error detection check bytes D1, D2, ..., Dn and for obtaining an exclusive OR with a preceding calculation result according to said primary generator polynomial;

a multiplying circuit for multiplying a constant $\alpha^n$ of said primary generator polynomial to an output of said exclusive OR circuit; and a latch circuit for latching an output of said multiplying circuit until the next byte data is inputted and for feedback inputting said output to said exclusive-OR circuit.

12. A system according to claim 10, wherein said code generating section eliminates a part of the error correction check bytes in each subblock constructing said write data from calculation targets of said error detection check bytes with respect to the generation of the half of said error detection check bytes D1, D2, ..., Dn.

13. A system according to claim 10, wherein said code generating section sets the error correction check bytes in said subblock to 0 and forms said error detection check bytes D1, D2, ..., Dn.

14. A system according to claim 9, wherein said error detection code decoder comprises:

a syndrome forming section for forming a plurality of syndromes $SD_1$, $SD_2$, ..., $SD_n$ from (n) data of different code lengths corresponding to said error detection check bytes D1, D2, ..., Dn by said primary generator polynomial; and an erroneous operation detecting section for detecting whether each of said syndromes $SD_1$, $SD_2$, ..., $SD_n$ formed by said syndrome forming section is zero or nonzero, when the number of non-zero syndromes is equal to or larger than a predetermined number, for discriminating the occurrence of an erroneous operation by a non-detection or an erroneous correction of said error correction code decoder, and for reporting to said upper controller.

15. A system according to claim 14, wherein said erroneous operation detecting section comprises:

an exclusive-OR circuit for receiving byte data $C_n$ to $C_1$ constructing a data section of said error corrected error detection codeword for each of said syndromes $SD_1$, $SD_2$, ..., $SD_n$ and for obtaining an exclusive OR between said byte data and the preceding calculation result by said primary generator polynomial;

a multiplying circuit for multiplying a constant $\alpha^n$ of said primary generator polynomial to an output of said exclusive OR circuit; and a latch circuit for latching an output of said multiplying circuit until the input of the next byte data and for feedback inputting said output to said exclusive OR circuit.

16. A system according to claim 14, wherein said syndrome forming section eliminates a part of the error correction check bytes in each subblock constructing said data detection codeword from calculation targets of said syndrome generator polynomial with respect to the formation of the half of said syndromes $SD_1, SD_2, \ldots, SD_n$.

17. A system according to claim 14, wherein said syndrome forming section sets the error correction check bytes in said subblock to 0 and forms said syndromes $SD_1, SD_2, \ldots, SD_n$.

18. A system according to claim 14, wherein in the case where the number of non-zero syndromes among said syndromes $SD_1, SD_2, \ldots, SD_n$ is equal to or larger than 2, said erroneous operation detecting section of said error detection code decoder detects the erroneous operation of said error correction code decoder and notifies to said upper controller.

19. A system according to claim 9, wherein said error correction code decoder comprises:

a syndrome forming section for reading said codeword and forming (2n) syndromes; and a coefficient forming section for obtaining coefficients $\beta_k$ (k=0 to n−1) of an error location polynomial by using the (2n) syndromes obtained by said syndrome forming section from solutions of simultaneous equations of (n) unknowns, wherein said coefficient forming section comprises, a coefficient arithmetic operating section for sequentially coupling (n) arithmetic operating circuits of (n) unknowns from one unknown to (n) unknowns in order to obtain values $\gamma_{n-1, 0}$ to $\gamma_{n-1, n-1}$ to decide solutions of simultaneous equations of (n=1) unknowns and values $\gamma_{n0}$ to $\gamma_{nn}$ to decide solutions $\beta_k$ of simultaneous equations of (n) unknowns from (n+1) syndromes, thereby obtaining a value $\gamma$ to decide a solution $\beta$ of simultaneous equations of (t) unknowns for an arbitrary number (t) of error bytes, and a coefficient selection arithmetic operating section for recognizing the number (t) of errors from an output of said coefficient arithmetic operating section and for calculating said coefficients $\beta_0$ to $\beta_{t-1}$ from a regularity of said simultaneous equations of (n) unknowns by said coefficient arithmetic operating section corresponding to said number (t) of errors.

20. A system according to claim 19, wherein said arithmetic operating circuit of (n) unknowns is constructed by a plurality of multiplying circuits, each for multiplying two syndromes, and an exclusive OR circuit for obtaining an exclusive OR of outputs of said plurality of multiplying circuits, and syndromes $S_{t-1+i}$ (i=0 to t) among (2t) syndromes $S_{2t-1}$ are selected and inputted to said multiplying circuits.

21. A system according to claim 20, wherein when syndrome inputs to two different multiplying circuits provided for each of said (n) arithmetic operating circuits of (n) unknowns are determined to be a same value, each of said (n) arithmetic operating circuit of (n) unknowns is constructed in a manner such that the inputs to said two multiplying circuits are made common.

22. An on-the-fly multibyte error correcting system in which check bytes and syndromes are formed by a generator polynomial such that symbols of a codeword are constructed by elements of a Galois field GF ($2^m$), which is defined by an arbitrary natural number (m), and roots $\alpha^a, \alpha^{a+1}, \ldots, \alpha^{a+2n-1}$ ($\alpha$ denotes a primitive element of said Galois field; (a) is an arbitrary natural number which satisfies a+2n−1$\leq 2^m$−1; (n) is a constant indicative of the maximum number of correctable error bytes) are possessed as solutions and (t) byte errors are corrected, comprising:

a syndrome forming section for reading said codeword and forming (2n) syndromes; and a coefficient forming section for obtaining coefficients $\beta_k$ (k=0 to n−1) of an error location polynomial by using the (2n) syndromes obtained by said syndrome forming section from solutions of simultaneous equations of (n) unknown, wherein said coefficient forming section comprises, a coefficient arithmetic operating section for sequentially coupling (n) arithmetic operating circuits of (n) unknowns from one unknown to (n) unknowns in order to obtain values $\gamma_{n-1, 0}$ to $\gamma_{n-1, n-1}$ to decide solutions of simultaneous equations of (n=1) unknowns and values $\gamma_{n0}$ to $\gamma_{nn}$ to decide solution $\beta_k$ of simultaneous equations of (n) unknowns from (n+1) syndromes, thereby obtaining a value $\gamma$ to decide a solution $\beta$ of simultaneous equations of (t) unknowns for an arbitrary number (t) of error bytes, said arithmetic operating circuit of (n) unknowns being constructed by a plurality of multiplying circuits, each for multiplying two syndromes, and an exclusive OR circuit for obtaining an exclusive OR of outputs of said plurality of multiplying circuits;

wherein syndromes $S_{t-1+i}$ (i=0 to t) among (2t) syndromes $S_{2t-1}$ are selected and inputted to said multiplying circuits, and each of said (n) arithmetic operating circuit of (n) unknowns is constructed in a manner such that each said multiplying circuit has a corresponding multiplying circuit with a common input;

a coefficient selection arithmetic operating section for recognizing the number (t) of errors from an output of said coefficient arithmetic operating section and for calculating said coefficients $\beta_0$ to $\beta_{t-1}$ from a regularity of said simultaneous equations of (n) unknowns by said coefficient arithmetic operating section corresponding to said number (t) of errors.

23. An on-the-fly multibyte error correcting system in which check bytes and syndromes are formed by a generator polynomial such that symbols of a codeword for error correction are constructed by elements of a Galois field GF ($2^m$), which is defined by an arbitrary natural number (m) and roots $\alpha^a, \alpha^{a+1}, \alpha^{a+2}, \ldots, \alpha^{a+2n-1}$ [$\alpha$ denotes a primitive element of said Galois field; (a) is an arbitrary natural number which satisfies a+2n+1$\leq 2^m$−1; (n) is a constant indicative of the maximum number of correctable error bytes] are possessed as solutions and (n) byte errors in said codeword are corrected by processing (2n) syndrome bytes, comprising:

an error correction code encoder for forming check bytes for error correction from write data of one subblock of a fixed length or a variable length by using said generator polynomial when data is written to a memory medium, for arranging said error correction check bytes after said write data, and for constructing a fixed length or variable length codeword; and an error correction code decoder for deciding coefficients $\gamma_0$ to $\gamma_n$ (t$\leq$n; (t) denotes a variable indicative of the number of error bytes generated) of an error location polynomial from said syndrome bytes each time said codeword read out from said memory medium is received, and thereafter for deciding an error byte location and an error byte correction value synchronously with a data transfer, thereby correcting errors while continuously transferring a byte stream of said codeword, wherein said error correction code decoder further comprises an error location arithmetic operating circuit section for presuming a start location of the fixed length subblock with respect to said variable length subblock in the case where the variable length subblock is received subsequent to the fixed length subblock, for starting an arithmetic operation of the error location in parallel with the arithmetic operation of the fixed length block under the execution in a state in which the result of the arithmetic operation is not outputted, and for switching said state to a state in which the result of the arithmetic operation is outputted at the start location of said variable length subblock.

24. A system according to claim 23, wherein said error location arithmetic operating circuit section comprises:

a first error location arithmetic operating circuit for calculating the error location of the received fixed length subblock;

a second error location arithmetic operating circuit for calculating the error location of the received variable length subblock; and a control circuit section for allowing said first error location arithmetic operating circuit to start the arithmetic operation to thereby outputting an error location signal when syndromes of the preceding fixed length subblock are formed, for allowing said second error location arithmetic operating circuit to start a dummy arithmetic operation so as not to output the error location signal at a time point when the syndromes of the next variable length subblock are formed during the execution of said arithmetic operation, and further for allowing the result of the arithmetic operation of said second error location arithmetic operating circuit to be outputted at the start location of the variable length subblock.

25. A system according to claim 24, wherein assuming that the corrected error location polynomial is $$ELP = \gamma_n X^n \oplus \gamma_{n-1} X^{n-1} \oplus \ldots \oplus \gamma_3 X^3 \oplus \gamma_2 X^2 \oplus \gamma_1 X^1 \oplus \gamma_0$$

each of said first and second error location arithmetic operating circuit sections comprises:

a first multiplier, provided every term of said error location polynomial, for previously multiplying each of values $\alpha^{n(N-1)}$ to $\alpha^0$ indicative of head byte locations (N−1) (N denotes a length of codeword) to said coefficients $\gamma_0$ to $\gamma_n$ at a time point when the coefficients $\gamma_0$ to $\gamma_n$ of said error location polynomial on the basis of said syndromes $S_0$ to $S_{2n-1}$ and for storing the result into each register;

a second multiplier, provided every term of said error location polynomial, for repetitively multiplying values $\alpha^{-n}$ to $\alpha$ to sequentially perform a chain search from high order data to the value in each of said registers and for again storing the result into each of said registers; and an adding circuit for adding the values stored in said registers corresponding to the terms of said error location polynomial and for outputting the result of the addition as an error location signal.

26. A system according to claim 25, wherein said control circuit section controls said first and second error location arithmetic operating circuit sections on the basis of a mode signal indicating whether the continuous subblocks are the fixed length subblocks or the last variable length subblock.

27. An on-the-fly multibyte error correcting system in which check bytes and syndromes are formed by a generator polynomial such that symbols of a codeword for error correction are constructed by elements of a Galois field GF ($2^m$) which is defined by an arbitrary natural number (m) and roots $\alpha^a$, $\alpha^{a+1}$, $\alpha^{a+2}$, ..., $\alpha^{a+2n-1}$ ($\alpha$ denotes a primitive element of said Galois field; (a) is an arbitrary natural number which satisfies $a+2n+1 \leq 2^m-1$; (n) is a constant indicative of the maximum number of correctable error bytes) are possessed as solutions and (n) byte errors in said codeword are corrected by processing (2n) syndrome bytes, comprising:

an error correction code encoder for forming check bytes for error correction from write data of one subblock of a fixed length or a variable length by using said generator polynomial when data is written to a memory medium and for arranging said error correction check bytes after said write data, thereby constructing a codeword of a fixed length or a variable length; and an error correction code decoder for deciding coefficients $\gamma_0$ to $\gamma_n$ ($t \leq n$; (t) denotes a variable indicative of the number of error bytes generated) of an error location polynomial from said syndrome bytes each time said codeword read out from said memory medium is received, and thereafter for deciding an error byte location and an error byte correction value synchronously with a data transfer, thereby correcting errors while continuously transferring a byte stream of said codeword, wherein said error correction code decoder further comprises a delay circuit for switching delay amount to a delay amount according to a byte length of each reception subblock, thereby allowing the error correction to be executed, when a head subblock for control of a short byte length or a subblock for data of a byte length longer than that of said control subblock is received from said memory medium.

28. A system according to claim 26, wherein said delay circuit comprises:

a first FIFO buffer memory having a fixed byte length of said control subblock;

a second FIFO buffer memory which is cascade connected to said first FIFO buffer memory and has a byte length obtained by subtracting the fixed byte length of said control subblock from the fixed byte length of said data subblock; and a switching circuit for selecting an output of said first FIFO buffer memory when said control subblock is received and for selecting an output of said second FIFO buffer memory when said data subblock is received.

29. A system according to claim 26, wherein said delay circuit comprises:

a readable and writable memory;

an address counter for generating a write address of the byte data inputted in the former half of a byte clock period and for writing into said memory synchronously with a byte clock and for generating and reading out a read address of the byte data written in said memory one subblock before in the latter half of said byte clock period;

a first decoder for discriminating that an address designation has been performed by only the data length of said control subblock from the address generated from said address counter;

a second decoder for discriminating that an address designation has been performed by the data length of said data subblock from the address generated from said address counter; and a selecting circuit for selecting an output of said first decoder by the reception of said control subblock and for selecting an output of said second decoder by the reception of said data subblock, thereby resetting said address counter.

* * * * *

UNITED STATES PATENT AND TRADEMARK OFFICE
CERTIFICATE OF CORRECTION

PATENT NO. : 5,610,929
DATED : March 11, 1997
INVENTOR(S) : Yamamoto

Page 1 of 2

It is certified that error appears in the above-indentified patent and that said Letters Patent is hereby corrected as shown below:

On the Title Page:

Under "[57] Abstract", line 2, delete "art upper controller" and insert --an upper controller--.

Column 5, line 37, delete "$\ominus$" and insert --$\oplus$--.

Column 15, line 55, delete "($\oplus \alpha^{i3}$") and insert --(X $\oplus \alpha^{i3}$)--.

Column 24, line 17, after "$\oplus a_{in}$" insert --$\Delta_{in}$--.

UNITED STATES PATENT AND TRADEMARK OFFICE
CERTIFICATE OF CORRECTION

PATENT NO. : 5,610,929
DATED : March 11, 1997
INVENTOR(S) : Yamamoto

It is certified that error appears in the above-indentified patent and that said Letters Patent is hereby corrected as shown below:

Column 41, line 31, delete "(n=1)" and insert --(n-1)--.

Column 42, line 16, delete "(n=1)" and insert --(n-1)--.

Column 44, line 45, delete "26" and insert --27--.

Column 44, line 61, delete "26" and insert --27--.

Signed and Sealed this

Eleventh Day of November, 1997

Attest:

BRUCE LEHMAN

Attesting Officer

Commissioner of Patents and Trademarks